United States Patent
Shibata et al.

(10) Patent No.: US 10,818,815 B2
(45) Date of Patent: Oct. 27, 2020

(54) SEMICONDUCTOR RELAY

(71) Applicant: PANASONIC CORPORATION, Kadoma-shi, Osaka (JP)

(72) Inventors: Daisuke Shibata, Kyoto (JP); Satoshi Tamura, Osaka (JP); Shinji Ujita, Osaka (JP); Nanako Hirashita, Kyoto (JP); Masahiro Ogawa, Osaka (JP); Ryo Kajitani, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/460,224

(22) Filed: Jul. 2, 2019

(65) Prior Publication Data
US 2019/0326465 A1 Oct. 24, 2019

Related U.S. Application Data

(63) Continuation of application No. PCT/JP2017/046290, filed on Dec. 25, 2017.

(30) Foreign Application Priority Data

Jan. 5, 2017 (JP) .................. 2017-000741
Jan. 5, 2017 (JP) .................. 2017-000756
(Continued)

(51) Int. Cl.
*H01L 33/00* (2010.01)
*H01L 21/00* (2006.01)
(Continued)

(52) U.S. Cl.
CPC ...... *H01L 31/162* (2013.01); *H01L 21/02579* (2013.01); *H01L 24/48* (2013.01);
(Continued)

(58) Field of Classification Search
CPC ... H01L 29/2003; H01L 31/162; H01L 24/48; H01L 33/382; H01L 21/02579;
(Continued)

(56) References Cited

U.S. PATENT DOCUMENTS 5,757,020 A    5/1998  Torazawa et al.
9,082,685 B2 * 7/2015  Nakasuji ............ H01L 25/167
(Continued)

FOREIGN PATENT DOCUMENTS

JP  58-084474 A  5/1983
JP  59-152677 A  8/1984
(Continued)

OTHER PUBLICATIONS

International Search Report dated Feb. 27, 2018, issued in counterpart International Application No. PCT/JP2017/046290, with English Translation. (4 pages).
(Continued)

*Primary Examiner* — Alonzo Chambliss
(74) *Attorney, Agent, or Firm* — Westerman, Hattori, Daniels & Adrian, LLP

(57) ABSTRACT

A semiconductor relay includes: a light-emitting element; and a light-receiving element facing the light-emitting element. The light-receiving element includes: a substrate; a semiconductor layer having a direct transition type, the semiconductor layer being disposed on the substrate and having a semi-insulating property; a first electrode having at least a part in contact with the semiconductor layer; and a second electrode having at least a part in contact with either one of the semiconductor layer and the substrate, in a position separated from the first electrode. The semiconductor layer is reduced in resistance by absorbing light from the light-emitting element.

15 Claims, 30 Drawing Sheets

(30) Foreign Application Priority Data

Jan. 5, 2017 (JP) ................................ 2017-000757
Mar. 17, 2017 (JP) ................................ 2017-052758

(51) Int. Cl.
| | |
|---|---|
| H01L 31/16 | (2006.01) |
| H01L 23/00 | (2006.01) |
| H01L 33/38 | (2010.01) |
| H03K 17/0814 | (2006.01) |
| H03K 17/785 | (2006.01) |
| H01L 21/02 | (2006.01) |
| H01L 29/24 | (2006.01) |
| H01L 27/32 | (2006.01) |
| H01L 31/18 | (2006.01) |

(52) U.S. Cl.
CPC .......... *H01L 27/3227* (2013.01); *H01L 29/24* (2013.01); *H01L 31/1856* (2013.01); *H01L 33/382* (2013.01); *H03K 17/08142* (2013.01); *H03K 17/785* (2013.01); *H01L 2224/48145* (2013.01); *H01L 2224/48247* (2013.01); *H01L 2227/32* (2013.01); *H01L 2924/10344* (2013.01); *H01L 2924/13091* (2013.01)

(58) Field of Classification Search
CPC ....... H01L 2227/32; H01L 2924/10344; H01L 31/1856; H01L 27/3227; H01L 29/24; H03K 17/08142; H03K 17/785
See application file for complete search history.

(56) References Cited

U.S. PATENT DOCUMENTS

| | | | |
|---|---|---|---|
| 2003/0042404 A1* | 3/2003 | Rice | ................... H01L 31/0304 250/214.1 |
| 2007/0158663 A1 | 7/2007 | Holcombe et al. | |
| 2014/0374776 A1* | 12/2014 | Nakasuji | ............... H01L 25/167 257/82 |
| 2015/0137070 A1* | 5/2015 | Kang | ..................... H01L 33/14 257/13 |
| 2015/0325660 A1* | 11/2015 | Hitora | ................ H01L 21/0262 257/43 |

FOREIGN PATENT DOCUMENTS

| | | |
|---|---|---|
| JP | 8-79041 A | 3/1996 |
| JP | 9-18320 A | 1/1997 |
| JP | 2000-183373 A | 6/2000 |
| JP | 2001-345457 A | 12/2001 |
| JP | 2008-047767 A | 2/2008 |
| JP | 2013-191705 A | 9/2013 |
| JP | 2015-176904 A | 10/2015 |
| JP | 2017-152543 A | 8/2017 |

OTHER PUBLICATIONS

Extended European Search Report dated Jan. 9, 2020, issued in counterpart EP Application No. 17890370.4. (7 pages).
Office Action dated Apr. 28, 2020, issued in counterpart JP Application No. 2018-560365, with English translation (8 pages).

* cited by examiner

# SEMICONDUCTOR RELAY

CROSS REFERENCE TO RELATED APPLICATIONS

This application is a U.S. continuation application of PCT International Patent Application Number PCT/JP2017/046290 filed on Dec. 25, 2017, claiming the benefit of priorities of Japanese Patent Application Number 2017-000741 filed on Jan. 5, 2017, Japanese Patent Application Number 2017-000756 filed on Jan. 5, 2017, Japanese Patent Application Number 2017-000757 filed on Jan. 5, 2017, and Japanese Patent Application Number 2017-052758 filed on Mar. 17, 2017, the entire contents of which are hereby incorporated by reference.

BACKGROUND

1. Technical Field

The present disclosure relates to a semiconductor relay in which an input terminal and an output terminal are insulated by optical coupling.

2. Description of the Related Art

Conventionally, there has been known a semiconductor relay in which an input terminal and an output terminal are insulated by optical coupling. For example, Japanese Unexamined Patent Application Publication No. 2013-191705 discloses a semiconductor relay including a structure that can be produced by a simple process. Japanese Unexamined Patent Application Publication No. 8-79041 discloses a circuit configuration of a semiconductor relay.

SUMMARY

A semiconductor relay is made up of many components such as a light-emitting diode, a photodiode array, a control circuit, and a MOSFET, for example. Accordingly, for example, when a semiconductor relay is packaged, there arises a problem that the size of the packaged device becomes large, and cost is increased.

The present disclosure provides a semiconductor relay that is easy to miniaturize.

In accordance with an aspect of the present disclosure, there is provided a semiconductor relay, including: a light-emitting element; and a light-receiving element facing the light-emitting element, wherein the light-receiving element includes a substrate, a semiconductor layer having a direct transition type, the semiconductor layer being disposed on the substrate and having a semi-insulating property, a first electrode electrically connected to the semiconductor layer, the first electrode having at least a part in contact with the semiconductor layer, and a second electrode electrically connected to the semiconductor layer, the second electrode having at least a part in contact with either one of the semiconductor layer and the substrate, in a position separated from the first electrode, and the semiconductor layer is reduced in resistance by absorbing light from the light-emitting element.

The semiconductor relay of the present disclosure is easy to miniaturize.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS (Knowledge Forming Basis of Present Disclosure)

A relay is a component that switches an on state and an off state of an electric circuit in accordance with a signal that is received from an outside. Relays are broadly classified into a mechanical relay that mechanically opens and closes a contact of an electric circuit, and a semiconductor relay including a semiconductor. Relays are widely used in consumer equipment such as household electrical appliances, industrial equipment, medical equipment, and the like.

Figure 1:
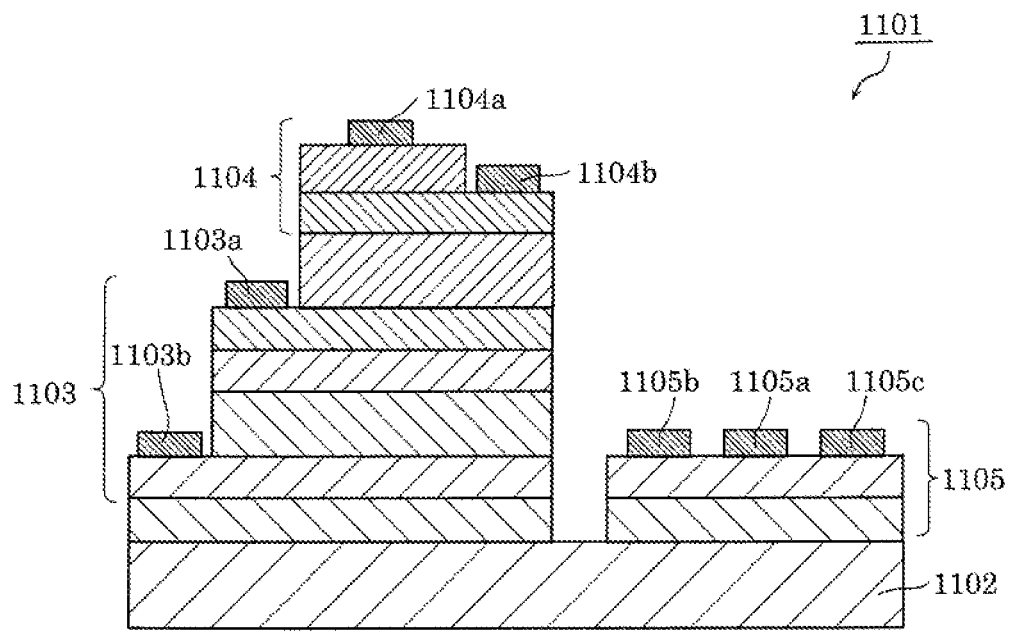
FIG. 1 is a schematic sectional view illustrating a structure of a common semiconductor relay.

In particular, semiconductor relays have excellent characteristics such as high reliability, a long service life, small sizes, a high operation speed, and less operation sound, and therefore are used in precision equipment, small devices, and the like. FIG. 1 is a schematic sectional view illustrating a structure of a common semiconductor relay.

As illustrated in FIG. 1, semiconductor relay 1101 includes light-emitting element 1103 and switching element 1105 that are formed on substrate 1102, and photoelectric conversion element 1104 that is formed on light-emitting element 1103. Light-emitting element 1103 is specifically a LED (light emitting diode), photoelectric conversion element 1104 is specifically a photodiode, and switching element 1105 is specifically a MOSFET (metal-oxide-semiconductor field-effect transistor).

Light-emitting element 1103 emits light, when electric power is supplied between anode electrode 1103$a$ and cathode electrode 1103$b$. Photoelectric conversion element 1104 that is disposed on light-emitting element 1103 is irradiated with light from light-emitting element 1103. Photoelectric conversion element 1104 which receives light converts the light into a voltage, and outputs the voltage to gate electrode 1105$a$ of switching element 1105 via anode electrode 1104$a$ and cathode electrode 1104$b$. In electrical connection of anode electrode 1104$a$ and cathode electrode 1104$b$, and gate electrode 1105$a$, for example, a bonding wire (not illustrated) is used. When a gate voltage of gate electrode 1105$a$ reaches a set voltage, source electrode 1105$b$ and drain electrode 1105$c$ of switching element 1105 continue to each other.

Figure 2:
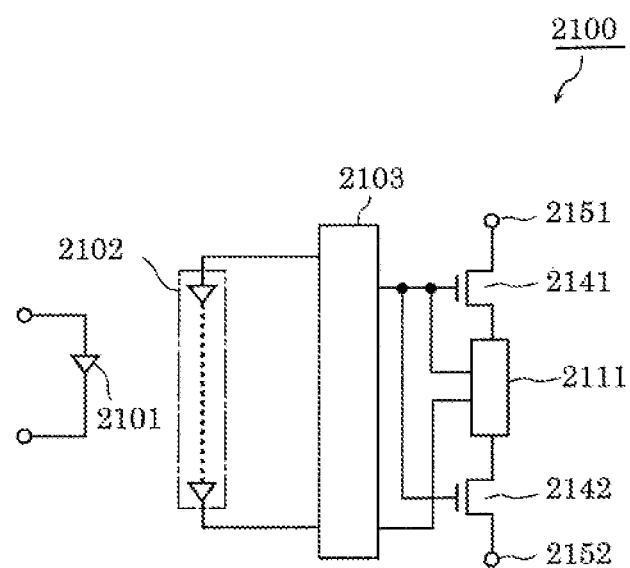
FIG. 2 is a diagram illustrating a circuit configuration of a common semiconductor relay.

FIG. 2 is a diagram illustrating a circuit configuration of a common semiconductor relay. As illustrated in FIG. 2, semiconductor relay 2100 includes light-emitting diode 2101, photodiode array 2102, control circuit 2103, MOSFET (metal-oxide-semiconductor field-effect transistor) 2141, MOSFET 2142, output terminal 2151, output terminal 2152, and current limiting circuit 2111. Light-emitting diode 2101 and photodiode array 2102 are electrically insulated from each other. Photodiode array 2102 is connected to respective gates of MOSFET 2141 and MOSFET 2142 via control circuit 2103.

In semiconductor relay 2100, both ends of light-emitting diode 2101 are input terminals. A voltage is applied to both the ends of light-emitting diode 2101, and thereby light-emitting diode 2101 emits light.

Photodiode array 2102 receives the light emitted by light-emitting diode 2101 and generates a current and a voltage. When electric charges are charged to a gate of MOSFET 2141 and a gate of MOSFET 2142 by the current and the voltage (electric power) generated by photodiode array 2102, MOSFET 2141 and MOSFET 2142 are brought into an on state. Then, output terminal 2151 and output terminal 2152 continue to each other, whereby an output current flows.

When the voltage which is applied to both the ends of light-emitting diode 2101 is turned off, light-emitting diode 2101 lights out, and electric charges are not supplied to the gate of MOSFET 2141 and the gate of MOSFET 2142 from photodiode array 2102. Accordingly, MOSFET 2141 and MOSFET 2142 are brought into an off state and the output current does not flow.

In this way, semiconductor relay 2100 is capable of switching control while the input terminals and the output terminals are kept insulated by optical coupling.

Incidentally, a common semiconductor relay as described above is difficult to miniaturize, since the common semiconductor relay includes at least three elements that are a light-emitting element, a light-receiving element, and a switching element, and the number of elements is large.

Hereinafter, certain exemplary embodiments are described in greater detail with reference to the accompanying Drawings. It should be noted that all the embodiments described below are generic and specific examples of the present disclosure. Numerical values, shapes, materials, constituent elements, arrangement positions and the connection configuration of the constituent elements, and the like described in the following embodiments are merely examples, and are not intended to limit the present disclosure. The present disclosure is characterized by the appended claims. Therefore, among the constituent elements in the following embodiments, constituent elements that are not described in independent claims that show the most generic concept of the present disclosure are described as elements constituting more desirable configurations.

It should also be noted that each figure in the Drawings is a schematic diagram and is not necessarily an exact diagram. In each figure, substantially identical constituent elements are assigned with a same reference sign, and explanation of such substantially identical constituent elements is sometimes not repeated or simplified.

Furthermore, in the drawings for use in explanation of embodiments as follows, coordinate axes may be shown. A Z-axis direction may be expressed as a vertical direction or a stacking direction, a positive side of Z axis may be expressed as an upper side (upward), and a negative side of Z-axis may be expressed as a lower side (downward). An X-axis direction and a Y-axis direction are directions orthogonal to each other in a plane perpendicular to the Z-axis. The X-axis direction may be expressed as a lateral direction. In the following embodiments, a shape in plan view means a shape seen from the Z-axis direction.

Embodiment 1

[Configuration]

Figure 3:
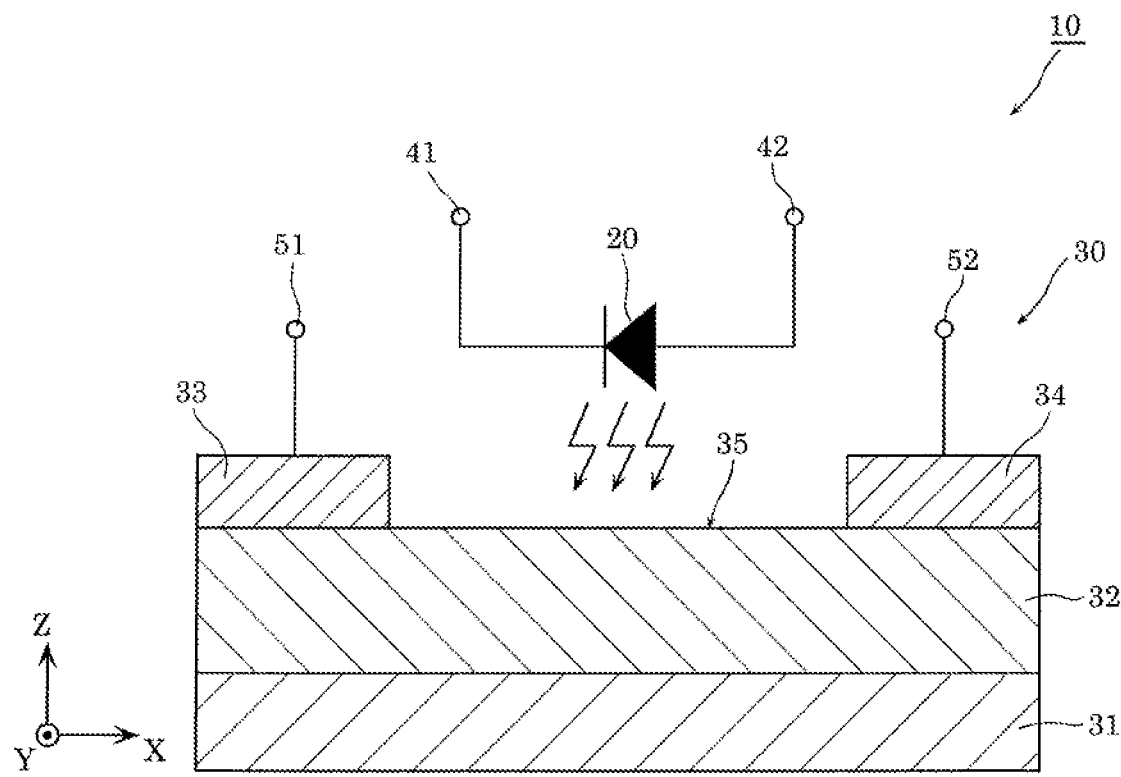
FIG. 3 is a schematic sectional view of a semiconductor relay according to Embodiment 1.

First of all, a configuration of a semiconductor relay according to Embodiment 1 will be described. FIG. 3 is a schematic sectional view of the semiconductor relay according to Embodiment 1.

As illustrated in FIG. 3, semiconductor relay 10 according to Embodiment 1 includes light-emitting element 20, and light-receiving element 30 that is disposed facing light-emitting element 20. Furthermore, semiconductor relay 10 includes four terminals that are input terminal 41, input terminal 42, output terminal 51, and output terminal 52. In other words, semiconductor relay 10 is an element with four terminals. Semiconductor relay 10 operates as a switch.

Light-emitting element 20 is formed by a nitride semiconductor, for example. More specifically, light-emitting element 20 is a light-emitting diode formed by pn junction of a p-type InAlGaN and an n-type InAlGaN, for example. Input terminal 41 is electrically connected to an n-type layer, and input terminal 42 is electrically connected to a p-type layer.

As the p-type InAlGaN, for example, a p-type InAlGaN that is doped with impurities such as Mg and has a carrier concentration of $1E18$ $cm^{-3}$ to $1E20$ $cm^{-3}$ inclusive is used. Furthermore, as the n-type InAlGaN, an n-type InAlGaN that is doped with impurities such as Si or O and has an impurity concentration of $1E16$ $cm^{-3}$ to $1E18$ $cm^{-3}$ inclusive is used.

Note that light-emitting element 20 may be formed of a direct transition type semiconductor material other than InAlGaN. For example, light-emitting element 20 may be formed of a material such as GaAs or ZnSe.

When a voltage which is equal to or more than a built-in voltage of pn junction is applied between input terminal 41 and input terminal 42 so that input terminal 42 is at a higher potential than input terminal 41, a current flows to light-emitting element 20, and light-emitting element 20 emits light.

Light-receiving element 30 includes substrate 31, semiconductor layer 32, first electrode 33, and second electrode 34.

Substrate 31 is a plate material on which semiconductor layer 32 is formed. A shape in plan view of substrate 31 is, for example, a rectangle, but may be a circle or the like, and is not specially limited. Substrate 31 is, for example, a GaN substrate formed of GaN. Note that substrate 31 may be formed of a material such as Si, sapphire, Sic, or GaAs.

Semiconductor layer 32 is a direct transition type semiconductor layer that is formed on substrate 31 and has a semi-insulating property. Semiconductor layer 32 comprises a nitride semiconductor, for example. More specifically, semiconductor layer 32 comprises, for example, InAlGaN. A thickness of semiconductor layer 32 is, for example, 2 μm to 20 μm inclusive (for example, 5 μm). The thickness of semiconductor layer 32 may be 2 μm to 10 μm inclusive, for example. Note that semiconductor layer 32 may be formed by using other direct transition type semiconductors than InAlGaN, for example, AlN, AlGaN, or the like. Alternatively, semiconductor layer 32 may be of a configuration in which InAlGaN and the above described other semiconductors are stacked on each other. Note that a semi-insulating property has a property of changing from a state having an insulating property to a state having conductivity, and semiconductor layer 32 changes to the state having conductivity by absorbing light.

First electrode 33 is an electrode that is electrically connected to semiconductor layer 32. Specifically, at least a part of first electrode 33 is formed in contact with semiconductor layer 32. First electrode 33 is formed to cover a part of a top surface of semiconductor layer 32. First electrode 33 is electrically connected to output terminal 51. First electrode 33 is specifically formed of a Ti/Al-based material, but may be a transparent electrode formed of ITO (indium tin oxide).

Second electrode 34 is an electrode that is electrically connected to semiconductor layer 32. Second electrode 34 is formed to be at least partially in contact with semiconductor layer 32, in a position separated from first electrode 33. Second electrode 34 is formed to cover a part of the top surface of semiconductor layer 32. Second electrode 34 is formed to be separated by, for example, approximately 5 μm to 15 μm inclusive (for example, approximately 10 μm) in a lateral direction (X-axis direction). Second electrode 34 is specifically formed of a Ti/Al-based material, but may be a transparent electrode formed of ITO.

A maximum usable voltage (hereinafter, described as withstand voltage) of light-receiving element 30 is determined by a distance between electrodes of first electrode 33 and second electrode 34. As the distance between electrodes is longer, the withstand voltage of light-receiving element 30 increases.

In semiconductor layer 32, a region that is located between first electrode 33 and second electrode 34 in plan view is light-receiving region 35. Light-receiving region 35 faces light-emitting element 20, and receives light from light-emitting element 20. Semiconductor layer 32 is reduced in resistance by absorbing the light from light-emitting element 20 through light-receiving region 35. In more detail, semiconductor layer 32 is reduced in resistance more while light-receiving region 35 is irradiated with the light from light-emitting element 20 than when light-receiving region 35 is not irradiated with the light from light-emitting element 20.

Thereby, semiconductor layer 32 causes first electrode 33 (output terminal 51) and second electrode 34 (output terminal 52) to continue to each other. At this time, since first electrode 33 and second electrode 34 are side by side in the lateral direction, a current flows in the lateral direction. In other words, semiconductor relay 10 is a lateral device.

[Detailed Configuration of Semiconductor Layer]

Subsequently, a detailed configuration of semiconductor layer 32 will be described. Semiconductor layer 32 (a semi-insulating InAlGaN layer) is doped with an acceptor-type first impurity that forms a deep acceptor level, and a donor-type second impurity. The acceptor-type first impurity is, for example, Fe (iron) or C (carbon), and the donor-type second impurity is, for example, Si (silicon), O (oxygen), or the like.

Here, it is known that an element like C (the acceptor-type first impurity) that forms a deep acceptor level compensates Si that is the donor-type second impurity. In other words, the element like C is used as an impurity, and thereby a Si concentration corresponding to a C concentration is compensated for.

In order to realize the semi-insulating property of semiconductor layer 32, it is necessary to make concentration Na of the acceptor-type first impurity that forms a deep acceptor level higher than concentration Nd of the donor-type second impurity, and trap carriers at a deep level. In other words, semiconductor layer 32 is obtained by adding the acceptor-type first impurity having ionization energy Ea and having concentration Na, and the donor-type second impurity having ionization energy Ed which is smaller than ionization energy Ea, and having concentration Nd which is smaller than concentration Na to a nitride semiconductor. Note that the nitride semiconductor is, for example, InAlGaN, ionization energy Ea is, for example, 0.8 eV, and ionization energy Ed is, for example, 0.03 eV.

By the first impurity and the second impurity, a trap level having activation energy (for example, 2.3 eV) larger than a sum (for example, 0.83 eV) of ionization energy Ea and ionization energy Ed is formed. By the deep trap level, a specific resistance of semiconductor layer 32 becomes $1 \times 10^5$ Ωcm or more, for example, in a state where light-receiving region 35 does not receive light. When light-receiving region 35 receives light from light-emitting element 20, the specific resistance of semiconductor layer 32 becomes lower than a specific resistance at a time of light-receiving region 35 does not receive light. When an incident light intensity is sufficiently large, the specific resistance of semiconductor layer 32 reduces to approximately 0.01 Ωcm to 1 Ωcm inclusive. In other words, semiconductor layer 32 switches from being insulating to conductive by absorbing light from light-emitting element 20. Note that the nitride semiconductor forming semiconductor layer 32 can be doped with impurities so that a concentration obtained by subtracting concentration Nd of the donor-type second impurity from concentration Na of the acceptor-type first impurity (concentration Na—concentration Nd) is within a range of 0.5E16 cm$^{-3}$ to 1E19 cm$^{-3}$ inclusive, for example. Furthermore, the nitride semiconductor forming semiconductor layer 32 is doped with impurities so that the concentration is within a range of 1E16 cm$^{-3}$ to 1E18 cm$^{-3}$, and thereby characteristics are more improved.

Note that the above described InAlGaN expresses quaternary mixed crystal In$_x$Al$_y$Ga$_{1-x-y}$N (x and y are arbitrary values that satisfy 0≤x≤1, 0≤y≤1). Hereinafter, multiple mixed crystal will be abbreviated by arrangement of respective constitutive element signs. In other words, description of subscripts will be omitted.

[Operation]

Next, an operation of semiconductor relay 10 will be described. When a voltage between input terminal 41 and input terminal 42 is 0 V, that is, no voltage is applied between input terminal 41 and input terminal 42, light-emitting element 20 is in a state of emitting no light (lighting-out state). In this state, semiconductor layer 32 has extremely high resistance, and a current hardly flows between output terminal 51 and output terminal 52.

When a voltage of a forward bias to pn junction is applied between input terminal 41 and input terminal 42, light-emitting element 20 emits light (lights up). In this state, semiconductor layer 32 absorbs light via light-receiving region 35, and thereby an electron-hole pair is generated in semiconductor layer 32. In other words, an electron-hole pair is excited in semiconductor layer 32. The electron-hole pairs that are generated work as carriers, so that semiconductor layer 32 is reduced in resistance. Accordingly, the current increases between output terminal 51 and output terminal 52. Note that semiconductor relay 10 has bidirectionality, and is capable of passing a current in either direction of a direction from output terminal 51 to output terminal 52, and a direction from output terminal 52 to output terminal 51.

Note that a wavelength of the light which is emitted by light-emitting element 20 has to be equal to or less than an absorption light wavelength of semiconductor layer 32 (light-receiving region 35). This is because if the wavelength of the light emitted by light-emitting element 20 is longer than the absorption light wavelength of semiconductor layer 32, absorption of the light does not occur.

[Effect, Etc.]

As described above, the conductivity of semiconductor layer 32 changes by light-receiving element 30 included in semiconductor relay 10 being irradiated with light having energy equivalent to or more than a band gap of semiconductor layer 32.

In a common semiconductor relay, the MOSFET cannot be driven directly by the light which is emitted by light-emitting element 20, so that an element that converts light into a voltage such as a photodiode array is needed.

In relation to this, in light-receiving element 30, semiconductor layer 32 can singly play a role of a photodiode array and a role of a MOSFET in a common semiconductor relay. Consequently, the number of components is reduced in semiconductor relay 10, so that semiconductor relay 10 is easily miniaturized and reduced in cost.

Furthermore, in a common semiconductor relay, a switching operation is realized by a step of applying a voltage to a light-emitting diode to cause the light-emitting diode to emit light, a step of a photodiode array converting the light from the light-emitting diode into a voltage, and a step of charging electric charges to a gate of a MOSFET by the voltage output from the photodiode array. In this way, the switching operation in the common semiconductor relay always needs the above described three steps, so that a high speed operation is difficult. In particular, it takes time to charge the gate of the MOSFET with electric charges by the voltage which is output from the photodiode array, so that a high-speed switching operation in ns to μs order is difficult.

In relation to the above, semiconductor relay 10 does not need the step of the photodiode array converting the light from the light-emitting diode into a voltage (a relay operation via the photodiode array), so that it is possible to speed up the switching operation.

Furthermore, as described above, the semiconductor material of a direct transition type that forms semiconductor layer 32, includes InAlGaN, and has a wide bandgap has higher dielectric breakdown field strength as compared with Si that is used in a common semiconductor relay. Semiconductor layer 32 comprises the semiconductor material of a direct transition type that has a wide bandgap, and thereby a high voltage operation of semiconductor relay 10 can be realized.

Modification 1 of Embodiment 1

Figure 4:
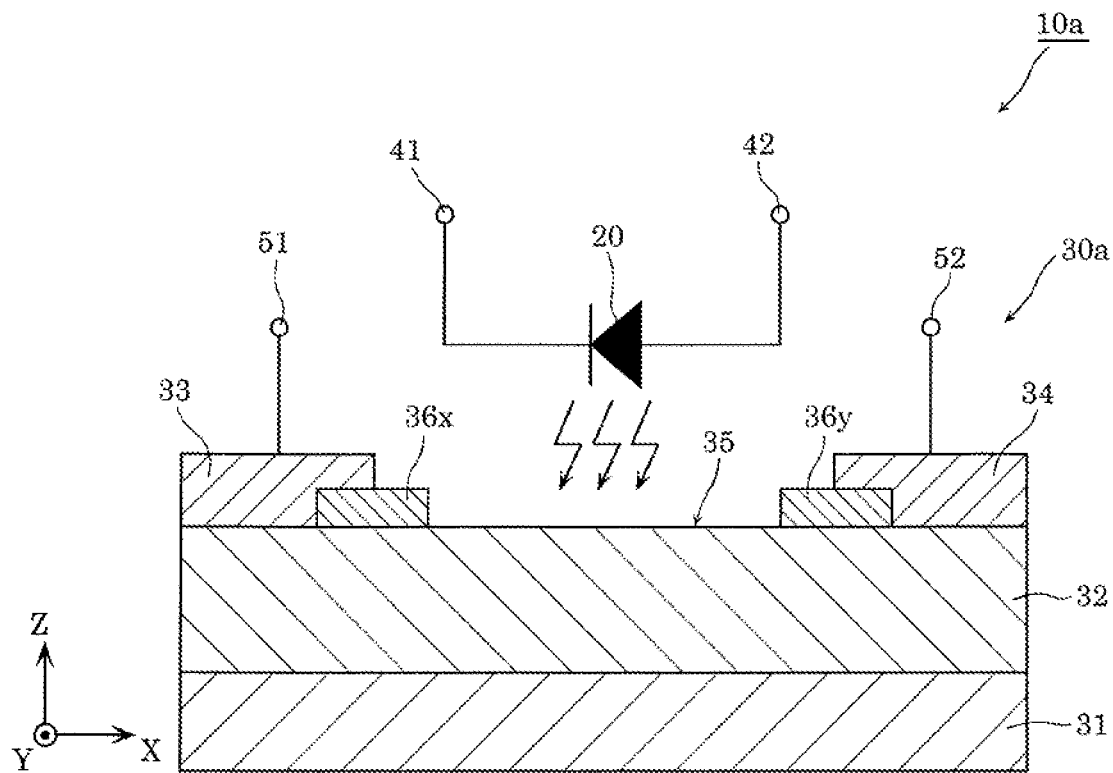
FIG. 4 is a schematic sectional view of a semiconductor relay according to Modification 1 of Embodiment 1.

Next, a configuration of a semiconductor relay according to Modification 1 of Embodiment 1 will be described. FIG. 4 is a schematic sectional view of the semiconductor relay according to Modification 1 of Embodiment 1. Note that a difference from semiconductor relay 10 will be mainly explained hereinafter.

In light-receiving element 30a included in semiconductor relay 10a illustrated in FIG. 4, first electrode 33 is not in contact with semiconductor layer 32 at light-receiving region 35 side (second electrode 34 side). Between first electrode 33 and semiconductor layer 32 in a stacking direction (Z-axis direction), p-type semiconductor layer 36x is formed. In other words, on semiconductor layer 32, p-type semiconductor layer 36x is further formed partially, and first electrode 33 is formed to be laid on semiconductor layer 32 and p-type semiconductor layer 36x. P-type semiconductor layer 36x is specifically formed of p-type InAlGaN, for example.

Likewise, in light-receiving element 30a, second electrode 34 is not in contact with semiconductor layer 32 at light-receiving region 35 side (first electrode 33 side). Between second electrode 34 and semiconductor layer 32 in the stacking direction, p-type semiconductor layer 36y is formed. In other words, on semiconductor layer 32, p-type semiconductor layer 36y is further formed partially, and second electrode 34 is formed to be laid on semiconductor layer 32 and p-type semiconductor layer 36y. P-type semiconductor layer 36y is specifically formed of p-type InAlGaN, for example.

According to p-type semiconductor layer 36x and p-type semiconductor layer 36y as above, depletion layers extend from p-type semiconductor layer 36x and p-type semiconductor layer 36y, whereby especially in a state where semiconductor layer 32 has high resistance (off state), an electric field exerted on an end portion of first electrode 33, and an electric field exerted on an end portion of second electrode 34 can be distributed. Consequently, a withstand voltage of light-receiving element 30a can be increased. Furthermore, by the above described depletion layers, a leak current can be reduced.

Furthermore, it is desirable to provide spots where first electrode 33 and second electrode 34 are in direct contact with semiconductor layer 32, and form ohmic contact in the spots. By adopting the configuration like this, especially in a state where semiconductor layer 32 is reduced in resistance (on state), a current loss can be reduced.

Modification 2 of Embodiment 1

Figure 5:
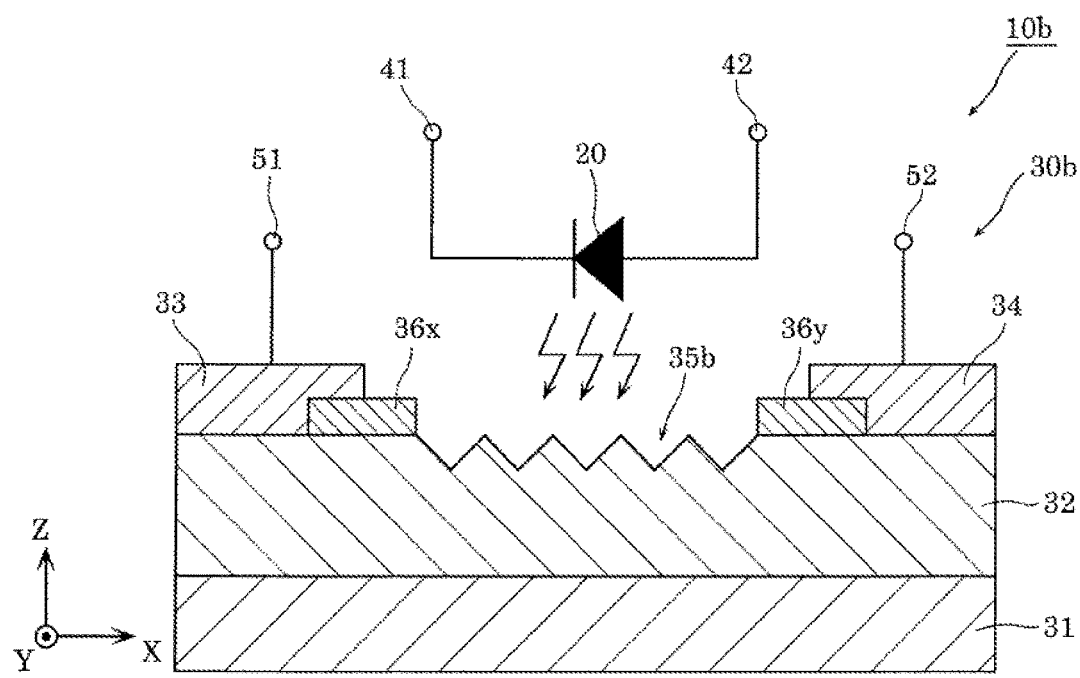
FIG. 5 is a schematic sectional view of a semiconductor relay according to Modification 2 of Embodiment 1.

Next, a configuration of a semiconductor relay according to Modification 2 of Embodiment 1 will be described. FIG. 5 is a schematic sectional view of a semiconductor relay according to Modification 2 of Embodiment 1. Note that hereinafter, a difference from semiconductor relay 10a will be mainly described.

In light-receiving element 30b included in semiconductor relay 10b illustrated in FIG. 5, light-receiving region 35b has a rugged structure. In other words, a rugged structure is provided on a surface facing light-emitting element 20, of semiconductor layer 32. Thereby, light-receiving element 30b is capable of efficiently taking light emitted by light-emitting element 20 into semiconductor layer 32. In other words, the rugged structure can enhance light absorption efficiency of light-receiving element 30b.

Note that in FIG. 5, the rugged structure is schematically illustrated, a specific shape, size, and the like of the rugged structure can be set empirically or experimentally, and are not specially limited.

Embodiment 2

Figure 6:
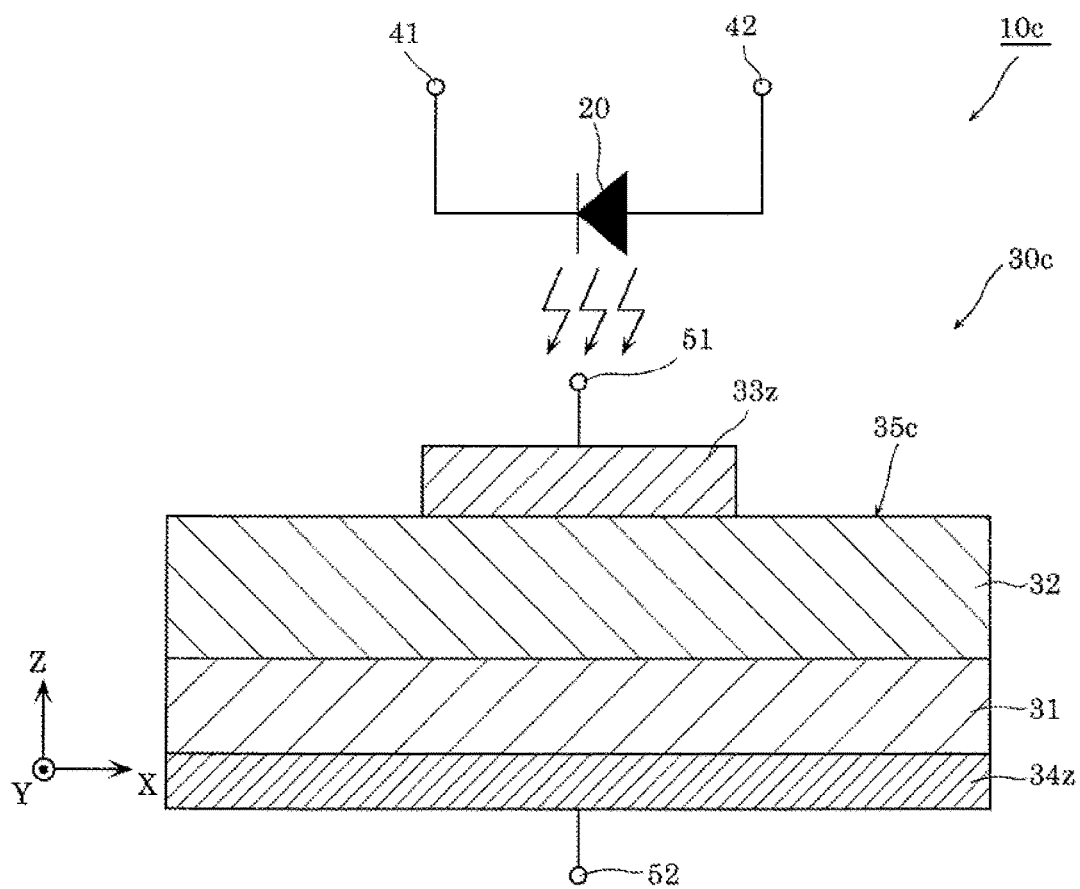
FIG. 6 is a schematic sectional view of a semiconductor relay according to Embodiment 2.

Next, a configuration of a semiconductor relay according to Embodiment 2 will be described. FIG. 6 is a schematic sectional view of the semiconductor relay according to Embodiment 2. Note that a difference from semiconductor relay 10 will be mainly described hereinafter.

As illustrated in FIG. 6, semiconductor relay 10c according to Embodiment 2 includes light-emitting element 20, and light-receiving element 30c that is disposed facing light-emitting element 20. Furthermore, semiconductor relay 10c includes four terminals that are input terminal 41, input terminal 42, output terminal 51, and output terminal 52. In other words, semiconductor relay 10c is an element with the four terminals.

Semiconductor relay 10c differs from semiconductor relay 10 in dispositions of first electrode 33z and second electrode 34z in light-receiving element 30c.

First electrode 33z is formed in contact with semiconductor layer 32 on semiconductor layer 32 (semi-insulating InAlGaN layer). First electrode 33z is partially formed on a top surface of semiconductor layer 32. Second electrode 34z is formed in contact with substrate 31, on undersurface (back surface) of substrate 31. Second electrode 34z is formed over an entire surface of an undersurface of semiconductor layer 32.

In this way, semiconductor layer 32 is sandwiched by first electrode 33z and second electrode 34z in a vertical direction. Note that in semiconductor relay 10c, substrate 31 comprises a material having conductivity.

In Embodiment 2, when light-receiving region 35c of semiconductor layer 32 absorbs light and is reduced in resistance, first electrode 33z and second electrode 34z electrically continue to each other. At this time, first electrode 33z and second electrode 34z are arranged in a vertical direction, so that a current flows in the vertical direction. In other words, semiconductor relay 10c is a vertical device.

In a vertical device, a withstand voltage between first electrode 33z and second electrode 34z corresponds to a thickness of semiconductor layer 32. The semiconductor relay configured as a lateral device has a large chip area when a high withstand voltage is required, whereas semiconductor relay 10c configured as a vertical device can increase a withstand voltage without increasing a chip area.

First electrode 33z and second electrode 34z each comprise of, for example, a Ti/Al-based material, but may be transparent electrodes formed of ITO. In semiconductor relay 10c, a part of light-receiving region 35c is shield by first electrode 33z, so that if first electrode 33z is a transparent electrode, an effect of increasing an effective area of light-receiving region 35c can be obtained.

Modification 1 of Embodiment 2

Figure 7:
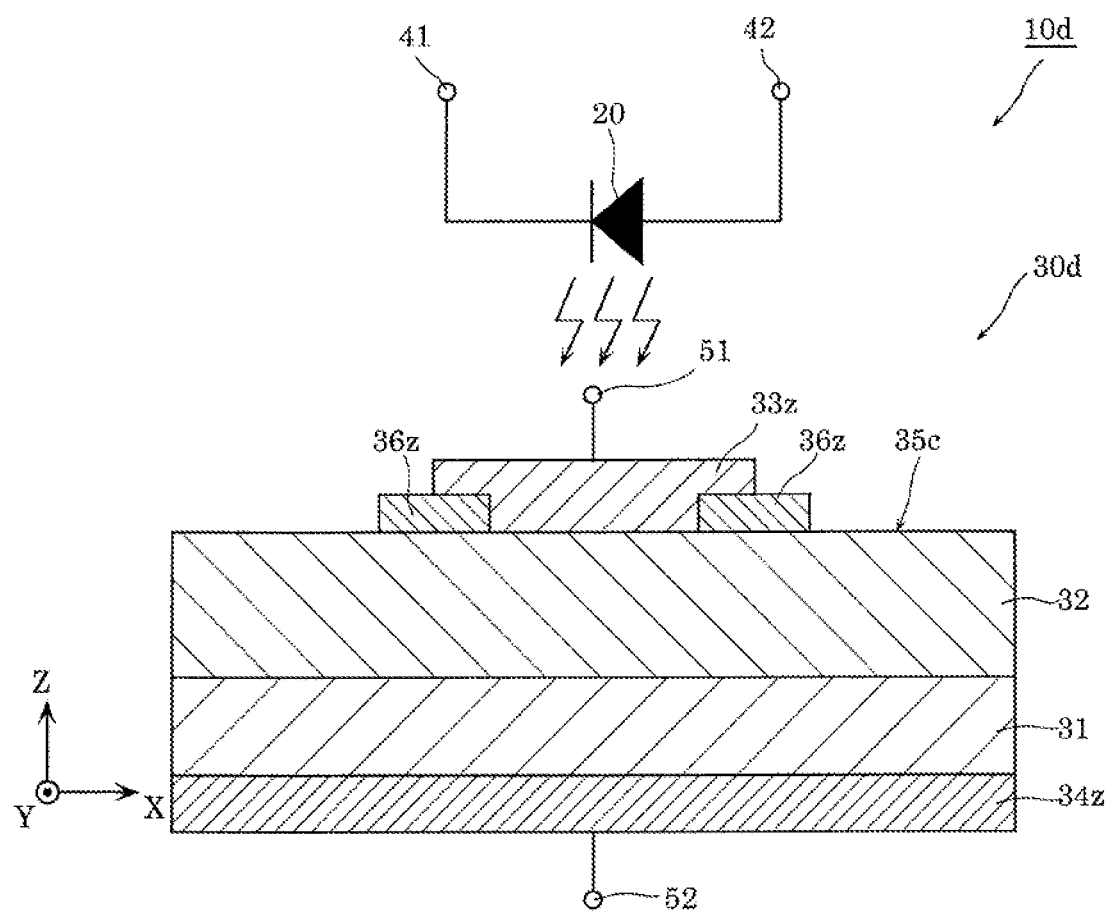
FIG. 7 is a schematic sectional view of a semiconductor relay according to Modification 1 of Embodiment 2.

Next, a configuration of a semiconductor relay according to Modification 1 of Embodiment 2 will be described. FIG. 7 is a schematic sectional view of the semiconductor relay according to Modification 1 of Embodiment 2. Note that a difference from semiconductor relay 10c will be mainly described hereinafter.

In light-receiving element 30d included in semiconductor relay 10d illustrated in FIG. 7, first electrode 33z is not in contact with semiconductor layer 32 in a peripheral portion. Between the peripheral portion of first electrode 33z and semiconductor layer 32 in the stacking direction (Z-axis direction), p-type semiconductor layer 36z is formed. In other words, on semiconductor layer 32, p-type semiconductor layer 36z is further formed partially, and first electrode 33z is formed to be laid on semiconductor layer 32 and p-type semiconductor layer 36z. P-type semiconductor layer 36z is specifically formed of p-type InAlGaN, for example.

According to p-type semiconductor layer 36z like this, an electric field exerted on a peripheral portion (end portion) of first electrode 33z can be distributed, so that a withstand voltage of light-receiving element 30d can be increased. Furthermore, a leak current can be reduced.

Furthermore, it is desirable to provide a spot where first electrode 33z and semiconductor layer 32 are in direct contact with each other, and form an ohmic contact in that spot. By adopting the configuration like this, especially in a state where semiconductor layer 32 is reduced in resistance (on state), a current loss can be reduced.

Modification 2 of Embodiment 2

Figure 8:
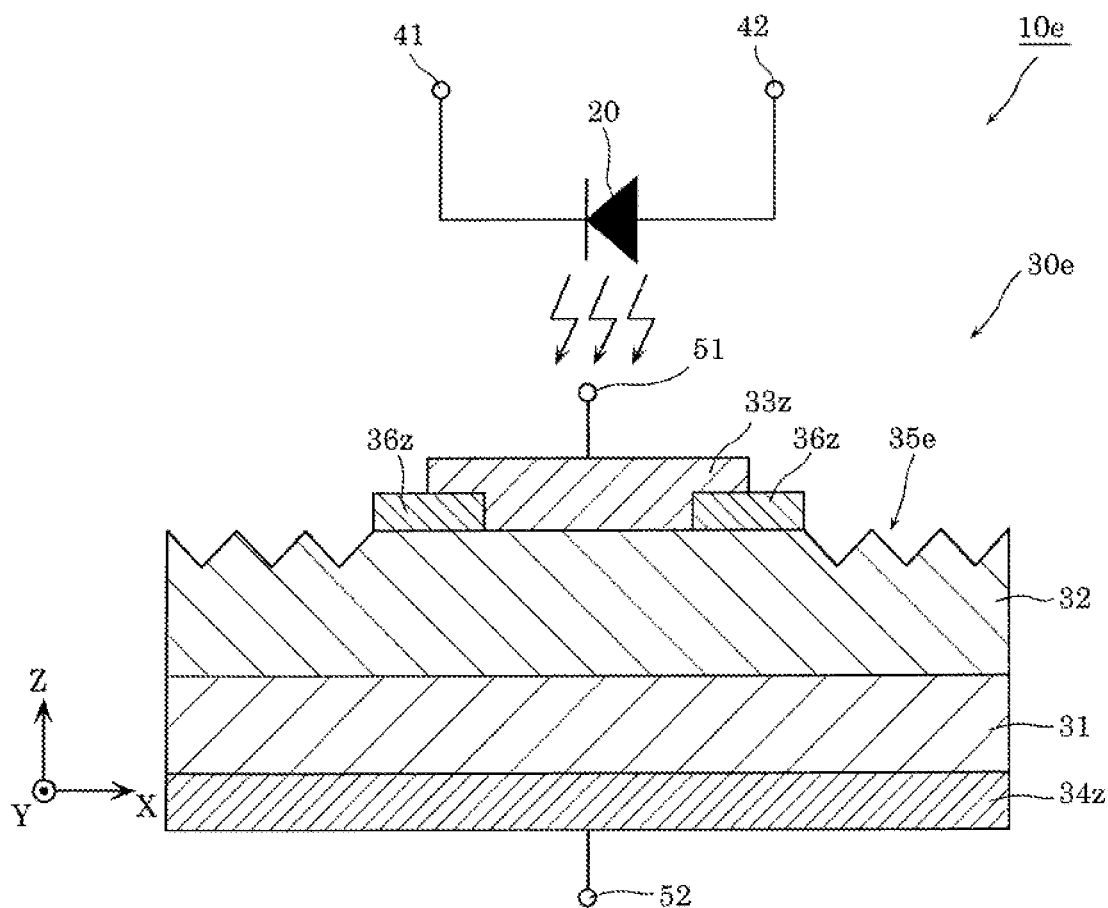
FIG. 8 is a schematic sectional view of a semiconductor relay according to Modification 2 of Embodiment 2.

Next, a configuration of a semiconductor relay according to Modification 2 of Embodiment 2 will be described. FIG. 8 is a schematic sectional view of the semiconductor relay according to Modification 2 of Embodiment 2. Note that a difference from semiconductor relay 10d will be mainly described hereinafter.

In light-receiving element 30e included in semiconductor relay 10e illustrated in FIG. 8, light-receiving region 35e has a rugged structure. In other words, the rugged structure is provided on a surface of semiconductor layer 32. Thereby, light-receiving element 30e is capable of efficiently taking the light which is emitted by light-emitting element 20 into semiconductor layer 32. In other words, the rugged structure can enhance light absorption efficiency of light-receiving element 30e.

Note that in FIG. 8, the rugged structure is schematically illustrated. A specific shape, size, and the like of the rugged structure can be empirically or experimentally set, and are not specially limited.

Summary of Embodiments 1 and 2

In accordance with an aspect of the present disclosure, there is provided a semiconductor relay, including: a light-emitting element; and a light-receiving element facing the light-emitting element, wherein the light-receiving element includes a substrate, a semiconductor layer having a direct transition type, the semiconductor layer being disposed on the substrate and having a semi-insulating property, a first electrode electrically connected to the semiconductor layer, the first electrode having at least a part in contact with the semiconductor layer, and a second electrode electrically connected to the semiconductor layer, the second electrode having at least a part in contact with either one of the semiconductor layer and the substrate, in a position separated from the first electrode, and the semiconductor layer is reduced in resistance by absorbing light from the light-emitting element.

Accordingly, the semiconductor layer can singly play the role of a photodiode array in a common semiconductor relay and a role of a MOSFET, so that miniaturization of a semiconductor relay becomes easy.

For example, the light-emitting element and the semiconductor layer each include a nitride semiconductor.

The semiconductor relay like this is capable of a high voltage operation, since a nitride semiconductor having a larger bandgap as compared with Si which is used in a common semiconductor relay is used for the semiconductor layer.

For example, the light-emitting element and the semiconductor layer each comprises InAlGaN that is the nitride semiconductor.

The semiconductor relay like this is capable of a high voltage operation, since InAlGaN having a larger bandgap as compared with Si which is used in a common semiconductor relay is used for the semiconductor layer.

For example, the semiconductor layer includes a first impurity having an acceptor type, and a second impurity having a donor type, the second impurity having ionization energy smaller than ionization energy of the first impurity, and having a concentration lower than a concentration of the first impurity, and the semiconductor layer has a trap level having activation energy that is larger than a sum of ionization energy of the first impurity and the ionization energy of the second impurity.

In this way, a trap level is formed in the semiconductor layer, and thereby the semiconductor layer can be reduced in resistance when receiving the light from the light-emitting element.

For example, a concentration obtained by subtracting the concentration of the second impurity from the concentration of the first impurity is $1E16$ $cm^{-3}$ to $1E18$ $cm^{-3}$ inclusive.

According to the impurity concentration in the range like this, the semiconductor relay can perform an effective and efficient relay operation.

For example, on the semiconductor layer, the p-type semiconductor layer is further formed partially, and the first electrode is formed to be laid on the semiconductor layer and the p-type semiconductor layer.

According to the p-type semiconductor layer like this, the electric field which is exerted on the first electrode can be distributed, so that the withstand voltage of the light-receiving element can be increased.

For example, the semiconductor layer has a light-receiving region that receives light from the light-emitting element, and the light-receiving region has a rugged structure.

According to the rugged structure like this, the light-receiving element can efficiently take the light which is emitted by the light-emitting element into the semiconductor layer.

For example, the first electrode is located over the semiconductor layer with at least a part of the first electrode being in contact with the semiconductor layer, and the second electrode is located in a position separated from the first electrode, over the semiconductor layer, with at least a part of the second electrode being in contact with the semiconductor layer.

Thereby, the semiconductor relay is formed as a lateral device.

For example, the first electrode is located over the semiconductor layer with at least a part of the first electrode being in contact with the semiconductor layer, and the second electrode is located under an undersurface of the substrate with at least a part of the second electrode being in contact with the substrate.

Thereby, the semiconductor relay is formed as a vertical device.

Embodiment 3

[Configuration]

Figure 9:
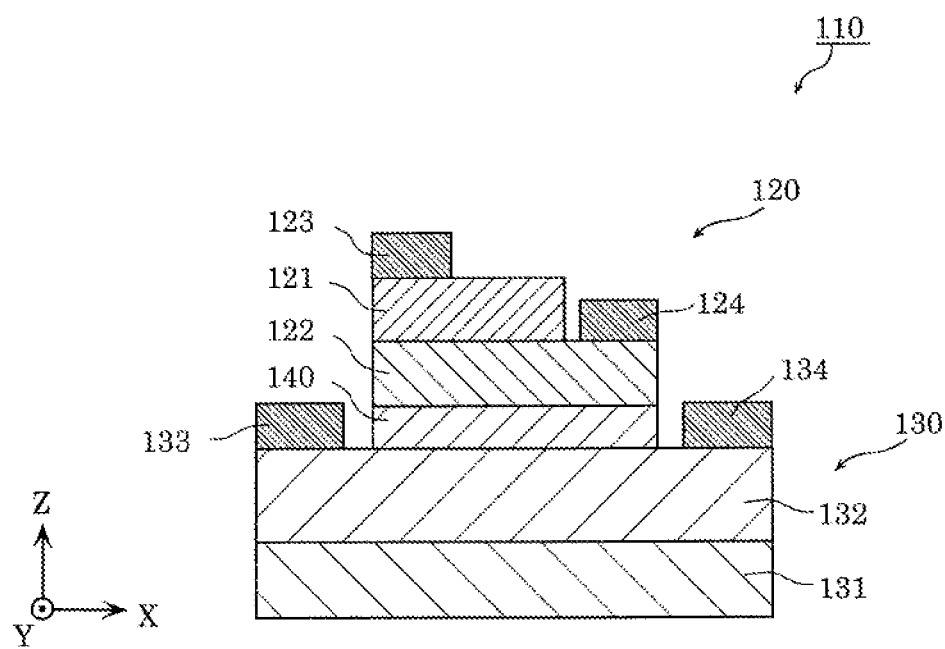
FIG. 9 is a schematic sectional view of a semiconductor relay according to Embodiment 3.

First, a configuration of a semiconductor relay according to Embodiment 3 will be described. FIG. 9 is a schematic sectional view of the semiconductor relay according to Embodiment 3.

As illustrated in FIG. 9, semiconductor relay 110 according to Embodiment 3 includes light-emitting element 120, light-receiving element 130 over which light-emitting element 120 is stacked, and insulating layer 140 which is formed between light-emitting element 120 and light-receiving element 130. Semiconductor relay 110 functions as a switch.

At first, light-emitting element 120 will be described. Light-emitting element 120 includes p-GaN layer 121, n-GaN layer 122, third electrode 123, and fourth electrode 124.

n-GaN layer 122 is an example of an n-type nitride semiconductor, and is formed on insulating layer 140. n-GaN layer 122 comprises n-type AlGaN, for example. p-GaN layer 121 is an example of a p-type nitride semiconductor, and is partially formed on n-GaN layer 122. p-GaN layer 121 comprises p-type AlGaN, for example. In this way, light-emitting element 120 is formed by junction of p-GaN layer 121 and n-GaN layer 122.

Third electrode 123 is partially formed on p-GaN layer 121. Third electrode 123 is electrically connected to p-GaN layer 121. In other words, third electrode 123 is an anode electrode. Third electrode 123 is formed from a Ti/Al-based material, for example.

Fourth electrode 124 is partially formed on n-GaN layer 122. Fourth electrode 124 is formed in a region where p-GaN layer 121 is removed, of a top surface of n-GaN layer 122. Fourth electrode 124 is electrically connected to n-GaN layer 122. In other words, fourth electrode 124 is a cathode electrode. Fourth electrode 124 comprises a Ti/Al-based material, for example.

In this way, light-emitting element 120 comprises a nitride semiconductor (GaN), for example. Note that light-emitting element 120 may be formed of other materials than a nitride semiconductor, such as GaAs or ZnSe. Light-emitting element 120 may be formed by a combination of other materials or may have other structures as long as light-emitting element 120 is capable of inducing a light-emitting phenomenon by an interaction of carriers among different kinds of semiconductors.

Next, light-receiving element 130 will be described. Light-receiving element 130 includes substrate 131, semiconductor layer 132, first electrode 133, and second electrode 134.

Substrate 131 is a plate material where semiconductor layer 132 is formed on a top surface. A shape in plan view of substrate 131 is a rectangle, for example, but may be a circle or the like, and is not specially limited. Substrate 131 is a GaN substrate formed of GaN. In other words, substrate 131 comprises a nitride semiconductor, for example. Note that substrate 131 may be a Si substrate, a SiC substrate, a GaAs substrate, a GaP substrate, a sapphire substrate, or the like.

Semiconductor layer 132 is a semiconductor layer that is formed on substrate 131 and has a semi-insulating property. Semiconductor layer 132 comprises a nitride semiconductor, for example. More specifically, semiconductor layer 132 comprises GaN, for example. Far more specifically, semiconductor layer 132 comprises InAlGaN, for example. Note that semiconductor layer 132 may be formed of a material such as GaAs or ZnSe. Semiconductor layer 132 may be formed of other direct transition type semiconductors than InAlGaN, for example, AlN, AlGaN, and the like. The semiconductor layer may be of a configuration in which InAlGaN and another semiconductor are stacked on each other. A detailed configuration of semiconductor layer 132 is similar to that of semiconductor layer 32.

First electrode 133 and second electrode 134 are two electrodes which are electrically connected to semiconductor layer 132. First electrode 133 and second electrode 134 are formed on semiconductor layer 132 to be separated from each other. Specifically, first electrode 133 and second electrode 134 each comprise a Ti/Al-based material, but may be transparent electrodes formed of a material such as ITO (indium tin oxide). Insulating layer 140 is formed between first electrode 133 and second electrode 134 in plan view, on a top surface of semiconductor layer 132. In other words, insulating layer 140 is formed in a region where first electrode 133 and second electrode 134 are not formed, on semiconductor layer 132 (light-receiving element 130).

Next, insulating layer 140 will be described. Insulating layer 140 is an insulating layer that is formed between light-emitting element 120 and light-receiving element 130 in a stacking direction, and has light transmissivity and high resistance. Insulating layer 140 can transmit the light from light-emitting element 120 and irradiate the light-receiving element with the light. Insulating layer 140 comprises a nitride semiconductor, for example. More specifically, insulating layer 140 comprises GaN, for example. Insulating layer 140 can be a semiconductor that does not absorb the light emitted from light-emitting element 120 and has a bandgap, and may be a multiple mixed crystal of nitride semiconductors such as AlGaN, for example.

Insulating layer 140 is doped with a carbon with a high impurity concentration of $1E17$ cm$^{-3}$ or more. Thereby, insulation between light-emitting element 120 and light-receiving element 130 is kept. Insulating layer 140 may be of a structure in which a p-type semiconductor and an n-type semiconductor are alternately stacked in at least three layers. According to the structure like this, an insulating property of insulating layer 140 is improved.

[Operation]

Next, an operation of semiconductor relay 110 will be described. When a voltage to be a forward bias to pn unction is applied between third electrode 123 and fourth electrode 124, light-emitting element 120 emits light (lights up).

Here, in the stacking direction, between light-emitting element 120 and light-receiving element 130, insulating layer 140 is formed, but since insulating layer 140 has a light transmissivity, light-receiving element 130 can receive the light from light-emitting element 120.

A wavelength of the light that is emitted by light-emitting element 120 is a shorter wavelength than a wavelength of light corresponding to the bandgap of semiconductor layer 132 included in light-receiving element 130. Consequently, when light-receiving element 130 is irradiated with the light emitted from light-emitting element 120, a large number of carriers are excited in semiconductor layer 132, and semiconductor layer 132 changes from insulating to conductive. Then, first electrode 133 and second electrode 134 which are formed on semiconductor layer 132 are brought into an electrically continuing state. In other words, light-receiving element 130 is brought into an on state.

When a voltage between third electrode 123 and fourth electrode 124 reaches 0 V, that is, a voltage is not applied between third electrode 123 and fourth electrode 124, light-emitting element 120 is brought into a state where light-emitting element 120 does not emit light (lighting-out state). In this state, carriers are not excited in semiconductor layer 132, so that semiconductor layer 132 returns to insulating from conductive. Thereby, light-receiving element 130 is brought into an off state where no current flows between first electrode 133 and second electrode 134.

[Production Method]

Figure 10:
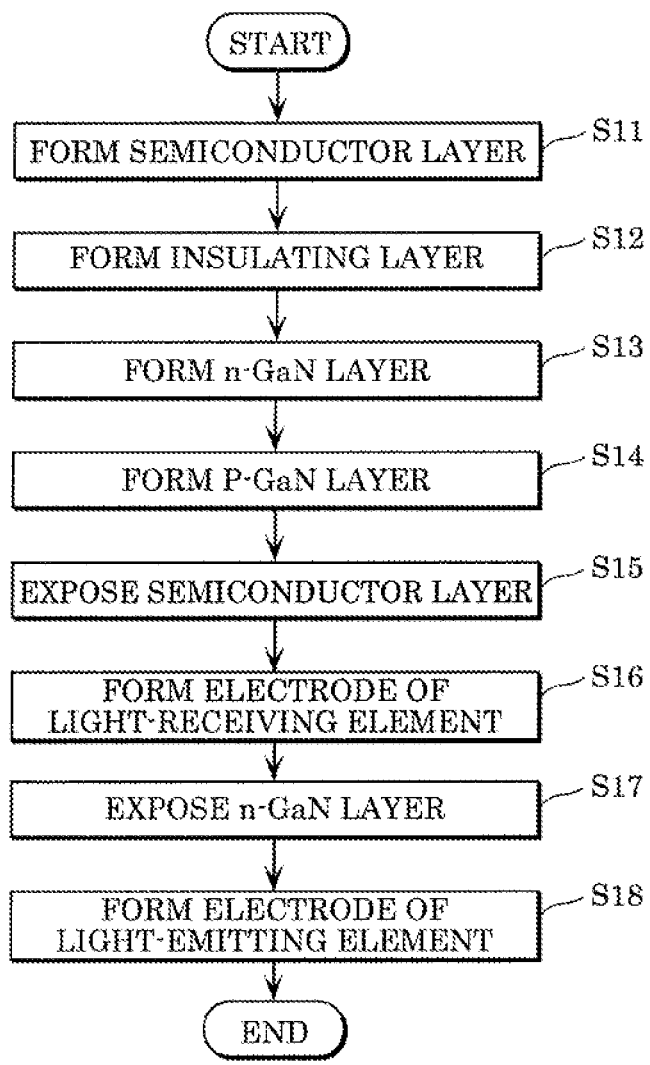
FIG. 10 is a flowchart of a production method of a semiconductor relay according to Embodiment 3.
Figure 11A:
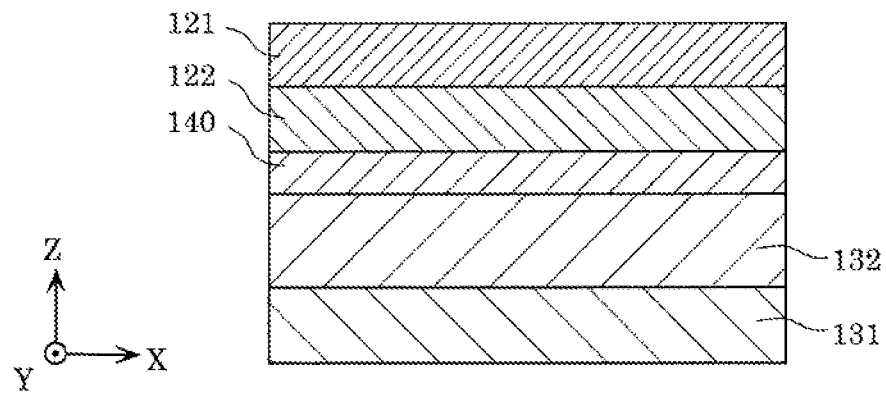
FIG. 11A is a first schematic sectional view for explaining the production method of the semiconductor relay according to Embodiment 3.
Figure 11B:
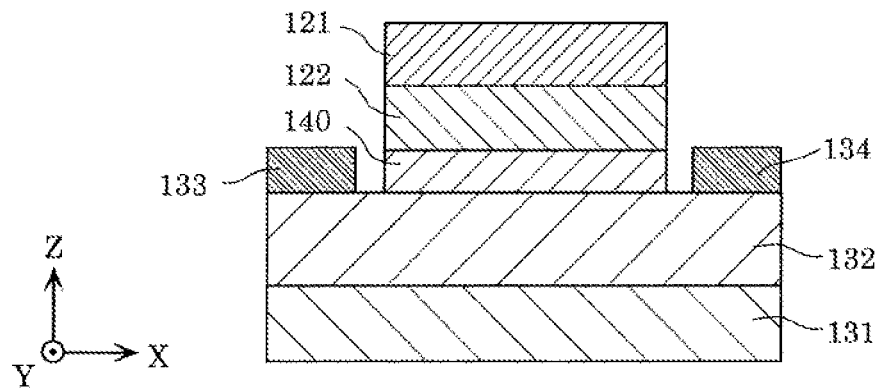
FIG. 11B is a second schematic sectional view for explaining the production method of the semiconductor relay according to Embodiment 3.

Next, a production method of semiconductor relay 110 will be described. FIG. 10 is a flowchart of the production method of semiconductor relay 110. FIGS. 11A and 11B are schematic sectional views for explaining the production method of semiconductor relay 110.

In production of semiconductor relay 110, semiconductor layer 132 is formed on substrate 131 (S11), insulating layer 140 is formed on semiconductor layer 132 (S12), n-GaN layer 122 is formed on insulating layer 140 (S13), and p-GaN layer 121 is formed on n-GaN layer 122 (S14). As a result, a stacking structure as illustrated in FIG. 11A is obtained.

Next, of the stacking structure illustrated in FIG. 11A, p-GaN layer 121, n-GaN layer 122, and insulating layer 140 are removed by etching or the like so that semiconductor layer 132 is exposed on at least two spots (S15). Subsequently, first electrode 133 and second electrode 134 are formed on exposed semiconductor layer 132 (S16). As a result, the stacking structure as illustrated in FIG. 11B is obtained.

Next, a part of p-GaN layer 121 is removed by etching or the like so that n-GaN layer 122 is exposed (S17). Subsequently, third electrode 123 is formed on p-GaN layer 121, and fourth electrode 124 is formed on exposed n-GaN layer 122 (S18). As a result, semiconductor relay 110 illustrated in FIG. 9 is obtained.

Note that a sequence of steps in the production method of semiconductor relay 110 described above is only an example. The sequence of a plurality of steps may be changed, or the plurality of steps may be executed in parallel.

[Effect, Etc.]

A common semiconductor relay includes at least three elements that are a light-emitting element, a photoelectric conversion element and a switching element, has many elements, and therefore is difficult to miniaturize. Furthermore, in a common semiconductor relay, the insulation has to be kept among the respective elements, so that it is necessary to dispose the elements apart, and insert insulators among the elements.

In relation to this, in semiconductor relay 110, functions of the photoelectric conversion element and the switching element of a common semiconductor relay are realized by single light-receiving element 130. In other words, semiconductor relay 110 has a smaller number of components, and therefore is easy to miniaturize. Furthermore, in semiconductor relay 110, light-emitting element 120 and light-receiving element 130 are stacked on each other. In other words, semiconductor relay 110 is easy to miniaturize because light-emitting element 120 and light-receiving element 130 are readily integrated in one chip.

Furthermore, in a common semiconductor relay, it is necessary to electrically connect the photoelectric conversion element and the switching element by wire bonding. Furthermore, in a common semiconductor relay, in order to reliably irradiate the photoelectric conversion element with the light from the light-emitting element, highly precise specifications of positions and crystal plane orientations are demanded.

In relation to this, semiconductor relay 110 is capable of being produced by mainly etching the stacking structure. In other words, semiconductor relay 110 is capable of being produced mainly by control of depth of etching. Furthermore, in production of semiconductor relay 110, a wire bonding step among the elements can be also simplified. In other words, semiconductor relay 110 is capable of being produced by a simple process, and can realize increase in productivity and reduction in production cost.

Furthermore, in a common semiconductor relay, a delay time occurs as a result that light is converted into a voltage by the photoelectric conversion element.

In relation to this, in semiconductor relay 110, it is not necessary to convert light into a voltage, so that the delay time can be significantly improved. Furthermore, insulating layer 140 is formed between light-emitting element 120 and light-receiving element 130, and thereby a withstand voltage of semiconductor relay 110 is increased.

Modification 1 of Embodiment 3

[Configuration]

Figure 12:
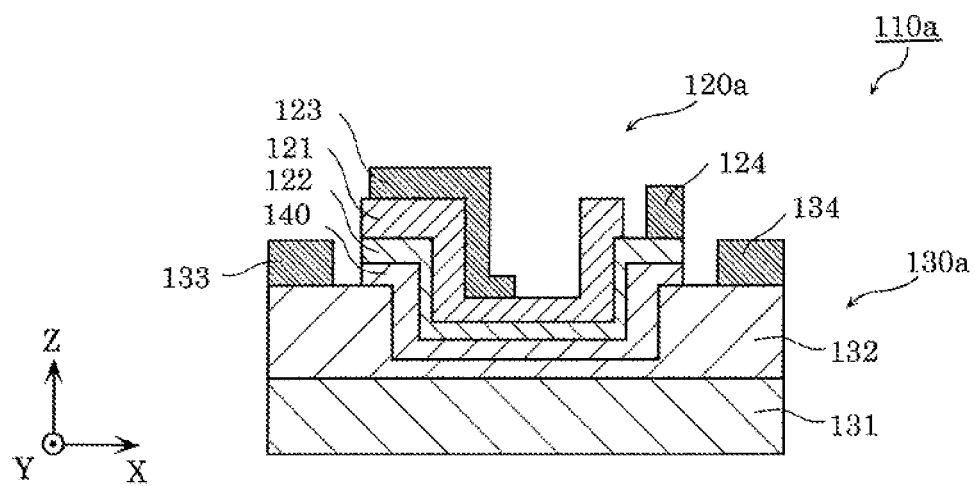
FIG. 12 is a schematic sectional view illustrating a configuration of a semiconductor relay according to Modification 1 of Embodiment 3.

Hereinafter, a semiconductor relay according to Modification 1 of Embodiment 3 will be described. FIG. 12 is a schematic sectional view illustrating a configuration of the semiconductor relay according to Modification 1 of Embodiment 3. Note that in Modification 1, a difference from semiconductor relay 110 is mainly described, and components having substantially same functions as the components of semiconductor relay 110 may be assigned with the same reference signs even when shapes or the like are different.

As illustrated in FIG. 12, semiconductor relay 110a according to Modification 1 of Embodiment 3 includes light-emitting element 120a, light-receiving element 130a, and insulating layer 140.

In a region between first electrode 133 and second electrode 134 in plan view, of semiconductor layer 132 of light-receiving element 130a, a recessed portion that is recessed downward is formed. In other words, light-receiving element 130a has a recess structure in which the recessed portion is formed on the top surface of semiconductor layer 132. Insulating layer 140 and light-emitting element 120a are formed in the above described recessed portion, and have shapes along the above described recessed portion.

[Production Method]

Next, a production method of semiconductor relay 110a will be described. In production of semiconductor relay 110a, semiconductor layer 132 is formed on substrate 131, and thereafter, a part of the top surface (surface) of semiconductor layer 132 is etched, whereby the recessed portion is formed.

Next, insulating layer 140, n-GaN layer 122, and p-GaN layer 121 are formed in this order by regrowth to cover the above described recessed portion.

Next, p-GaN layer 121, n-GaN layer 122, and insulating layer 140 are removed by etching or the like, and thereby the top surface of semiconductor layer 132 is exposed on at least two spots. Exposed portions in the two spots are disposed to sandwich the recessed portion in plan view, and on the exposed portions in the two spots, first electrode 133 and second electrode 134 are formed.

Next, a part of p-GaN layer 121 is removed by etching or the like, and thereby a part of n-GaN layer 122 is exposed. Subsequently, third electrode 123 is formed on p-GaN layer 121, and fourth electrode 124 is formed on exposed n-GaN layer 122. As a result, semiconductor relay 110a illustrated in FIG. 12 is obtained. An operation of semiconductor relay 110a is similar to the operation of semiconductor relay 110.

[Effect, Etc.]

The recessed portion is formed in semiconductor layer 132 included in light-receiving element 130a as in semiconductor relay 110a, and thereby an area of a light-receiving region that receives the light from light-emitting element 120a is enlarged, so that efficiency is enhanced. Furthermore, a substantial distance between first electrode 133 and second electrode 134 increases, so that the withstand voltage of semiconductor relay 110a is increased. At the time of producing a semiconductor relay having a high withstand voltage, it becomes possible to reduce the size of the semiconductor relay by adopting a structure like the structure of semiconductor relay 110a.

Modification 2 of Embodiment 3

[Configuration]

Figure 13:
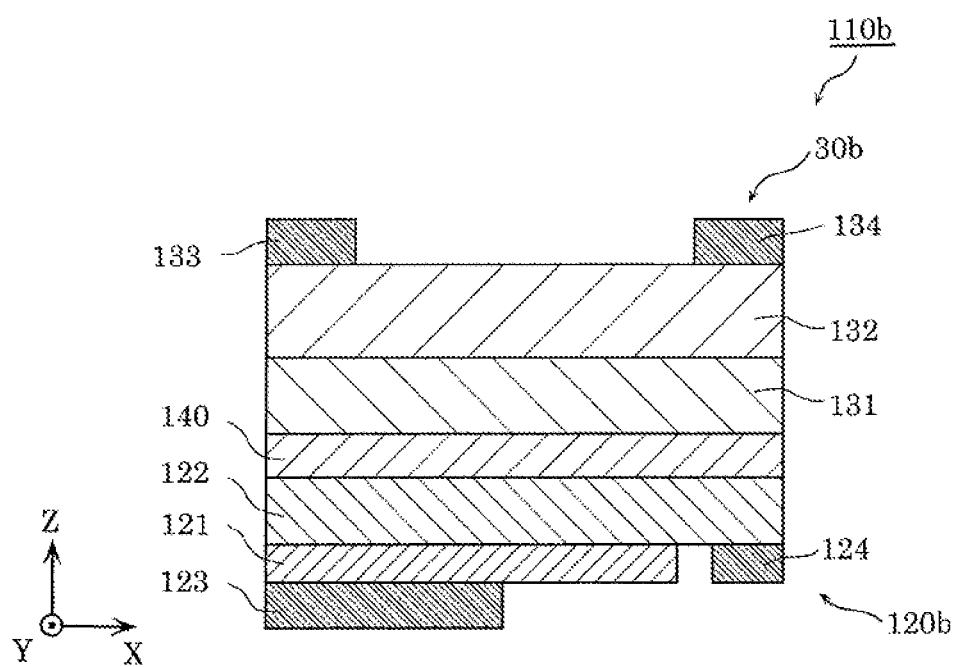
FIG. 13 is a schematic sectional view illustrating a configuration of a semiconductor relay according to Modification 2 of Embodiment 3.

Hereinafter, a semiconductor relay according to Modification 2 of Embodiment 3 will be described. FIG. 13 is a schematic sectional view illustrating a configuration of the semiconductor relay according to Modification 2 of Embodiment 3. Note that in Modification 2, a difference from semiconductor relay 110 will be mainly described, and components having substantially same functions as the components of semiconductor relay 110 may be assigned with the same reference signs even when shapes or the like are different.

As illustrated in FIG. 13, semiconductor relay 110b according to Modification 2 of Embodiment 3 includes light-emitting element 120b, light-receiving element 130b, and insulating layer 140. In semiconductor relay 110b, light-emitting element 120b is formed below semiconductor layer 132 (light-receiving element 130b), and insulating layer 140 is formed between an undersurface of substrate 131, and light-emitting element 120b.

In semiconductor relay 110b, substrate 131 has a light transmissivity and an insulating property. Substrate 131 is, for example, a sapphire substrate, but may be a nitride semiconductor substrate having a light transmissivity and an insulating property, such as AlN, or may be a semiconductor substrate formed of another wide bandgap semiconductor.

Note that light-emitting element 120b is formed throughout an entire surface of an undersurface of insulating layer 140, but light-emitting element 120b can be formed on at least a region between first electrode 133 and second electrode 134 in plan view, of semiconductor layer 132, and can irradiate the region with light from below.

[Production Method]

Next, a production method of semiconductor relay 110b will be described. In production of semiconductor relay 110b, semiconductor layer 132 is formed on substrate 131, insulating layer 140 is formed on the undersurface of substrate 131, n-GaN layer 122 is formed on the undersurface of insulating layer 140, and p-GaN layer 121 is formed on an undersurface of n-GaN layer 122.

Next, first electrode 133 and second electrode 134 are formed on semiconductor layer 132. Furthermore, a part of p-GaN layer 121 is removed by etching or the like so that n-GaN layer 122 is exposed. Subsequently, third electrode 123 is formed on an undersurface of p-GaN layer 121, and fourth electrode 124 is formed on the undersurface of exposed n-GaN layer 122. As a result, semiconductor relay 110b illustrated in FIG. 13 is obtained. An operation of semiconductor relay 110b is similar to the operation of semiconductor relay 110.

[Effect, Etc.]

When light-emitting element 120 is formed on the same surface (top surface of semiconductor layer 132) as first electrode 133 and second electrode 134 as in semiconductor relay 110, limitation of some degree may occur to design such as a size of light-emitting element 120, and an interval between the light-emitting element and the electrodes.

In relation to this, in semiconductor relay 110b, a surface where first electrode 133 and second electrode 134 are formed, and a surface where light-emitting element 120b is formed are different, so that it becomes possible to form light-emitting element 120b to be large. In other words, limitation on design is distributed, and a degree of freedom of the size of light-emitting element 120b and a degree of freedom of disposition are increased.

Furthermore, in semiconductor relay 110b, light-emitting element 120b can irradiate a portion directly below first electrode 133 of semiconductor layer 132, and a portion directly below second electrode 134, with light. In doing so, reduction in resistance of the portion directly below first electrode 133 of semiconductor layer 132, and the portion directly below second electrode 134 is promoted, so that an effect of reducing contact resistance of the portion directly below first electrode 133 and the portion directly below second electrode 134 is obtained.

Modification 3 of Embodiment 3

[Configuration]

Figure 14:
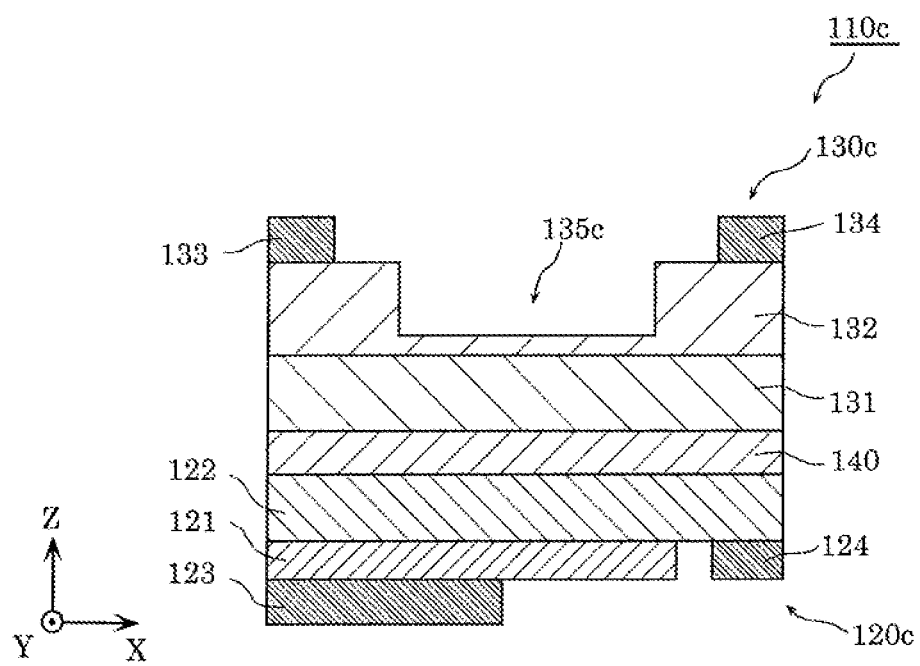
FIG. 14 is a schematic sectional view illustrating a configuration of a semiconductor relay according to Modification 3 of Embodiment 3.

Hereinafter, a semiconductor relay according to Modification 3 of Embodiment 3 will be described. FIG. 14 is a schematic sectional view illustrating a configuration of the semiconductor relay according to Modification 3 of Embodiment 3. Note that in Modification 3, a difference from semiconductor relay 110b will be mainly described, and components having substantially same functions as the components of semiconductor relay 110b may be assigned with the same reference signs even when shapes or the like are different.

As illustrated in FIG. 14, semiconductor relay 110c according to Modification 3 of Embodiment 3 includes light-emitting element 120c, light-receiving element 130c, and insulating layer 140. In semiconductor relay 110c, recessed portion 135c that is recessed downward is formed on semiconductor layer 132 of light-receiving element 130c. In other words, light-receiving element 130c has a recess structure in which the recessed portion is formed on the top surface of semiconductor layer 132. Semiconductor relay 110c further includes a step of forming recessed portion 135c, in the production method of semiconductor relay 110b. An operation of semiconductor relay 110c is similar to the operation of semiconductor relay 110.

[Effect, Etc.]

Recessed portion 135c is formed in semiconductor layer 132 included in light-receiving element 130c as in semiconductor relay 110c, and thereby a substantial distance between first electrode 133 and second electrode 134 is long.

Thereby, semiconductor relay 110c is enhanced in withstand voltage more than semiconductor relay 110b. At the time of producing a semiconductor relay having a high withstand voltage, it becomes possible to reduce a size of the semiconductor relay by adopting a structure as in semiconductor relay 110c.

Embodiment 4

[Configuration]

Figure 15:
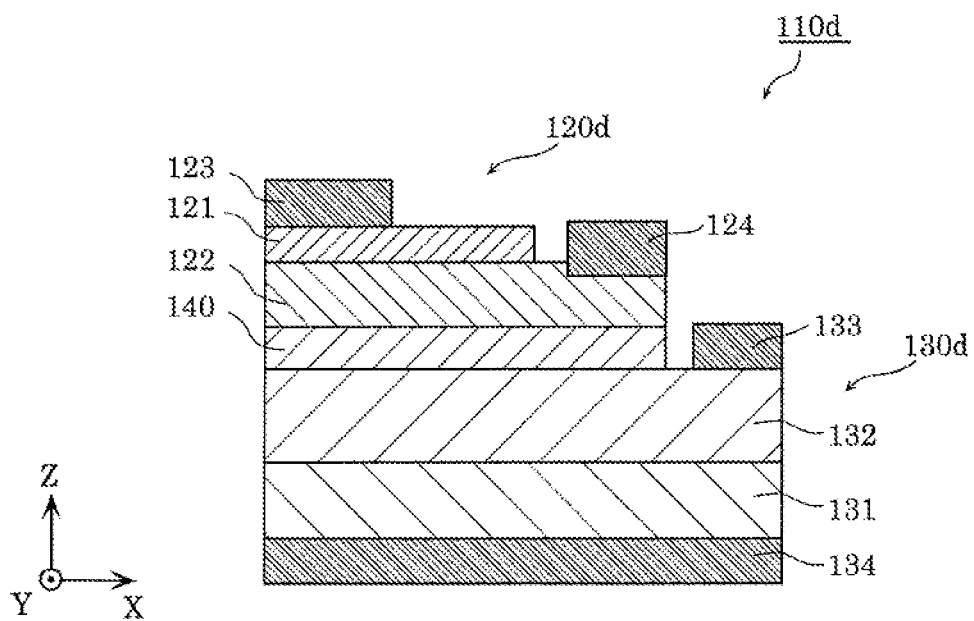
FIG. 15 is a schematic sectional view illustrating a configuration of a semiconductor relay according to Embodiment 4.

Hereinafter, a semiconductor relay according to Embodiment 4 will be described. FIG. 15 is a schematic sectional view illustrating a configuration of the semiconductor relay according to Embodiment 4. Note that in Embodiment 4, a difference from semiconductor relay 110 will be mainly described, and components having substantially same functions as the components of semiconductor relay 110 may be assigned with the same reference signs even when shapes or the like are difference.

As illustrated in FIG. 15, semiconductor relay 110d according to Embodiment 4 includes light-emitting element 120d, light-receiving element 130d, and insulating layer 140. In semiconductor relay 110d, first electrode 133 that is one electrode of two electrodes included in light-receiving element 130d, and insulating layer 140 are formed on semiconductor layer 132. Second electrode 134 that is the other electrode of the two electrodes included in light-receiving element 130d is formed on the undersurface of substrate 131. Light-emitting element 120d is formed on insulating layer 140.

In semiconductor relay 110d, specifically, first electrode 133 is formed in a region of an end portion of the top surface of semiconductor layer 132, and light-emitting element 120d is disposed on semiconductor layer 132, side by side in a lateral direction with first electrode 133. Light-emitting element 120d emits light mainly downward.

In semiconductor relay 110d, first electrode 133 and second electrode 134 are disposed side by side in a thickness direction of substrate 131. Consequently, in light-receiving element 130d, a current flows in the thickness direction of substrate 131. Note that in semiconductor relay 110d, substrate 131 comprises a material having conductivity.

Note that light-emitting element 120d may be formed on semiconductor layer 132 to surround a periphery of first electrode 133 in plan view. Furthermore, light-emitting element 120d may be formed on semiconductor layer 132 to sandwich first electrode 133 in plan view. For example, light-emitting element 120d may be formed on semiconductor layer 132 to be divided into two spots to sandwich first electrode 133 formed into a stripe shape in plan view from a short-side direction.

Thereby, the region which is irradiated with the light from light-emitting element 120d in semiconductor layer 132 increases, and therefore efficiency is enhanced.

[Production Method]

Next, a production method of semiconductor relay 110d will be described. In production of semiconductor relay 110d, semiconductor layer 132 is formed on substrate 131, insulating layer 140 is formed on semiconductor layer 132, n-GaN layer 122 is formed on insulating layer 140, and p-GaN layer 121 is formed on n-GaN layer 122.

Next, p-GaN layer 121, n-GaN layer 122, and insulating layer 140 are removed by etching or the like so that semiconductor layer 132 is exposed on at least one spot. Subsequently, first electrode 133 is formed on exposed semiconductor layer 132.

Next, a part of p-GaN layer 121 is removed by etching or the like so that n-GaN layer 122 is exposed. Subsequently, third electrode 123 is formed on p-GaN layer 121, and fourth electrode 124 is formed on exposed n-GaN layer 122.

Subsequently, second electrode 134 is formed on the undersurface of substrate 131. As a result, semiconductor relay 110d illustrated in FIG. 15 is obtained. An operation of semiconductor relay 110d is similar to the operation of semiconductor relay 110.

[Effect, Etc.]

In semiconductor relay 110d, a current flows in a thickness direction of substrate 131 in light-receiving element 130d. Consequently, it becomes easy to increase the withstand voltage, and increase a current in semiconductor relay 110d. In a so-called vertical device like light-receiving element 130d, the withstand voltage is determined by a thickness of semiconductor layer 132. Consequently, semiconductor relay 110d can be made smaller in size as compared with semiconductor relay 110 of a lateral device structure having the same withstand voltage.

Modification of Embodiment 4

[Configuration]

Figure 16:
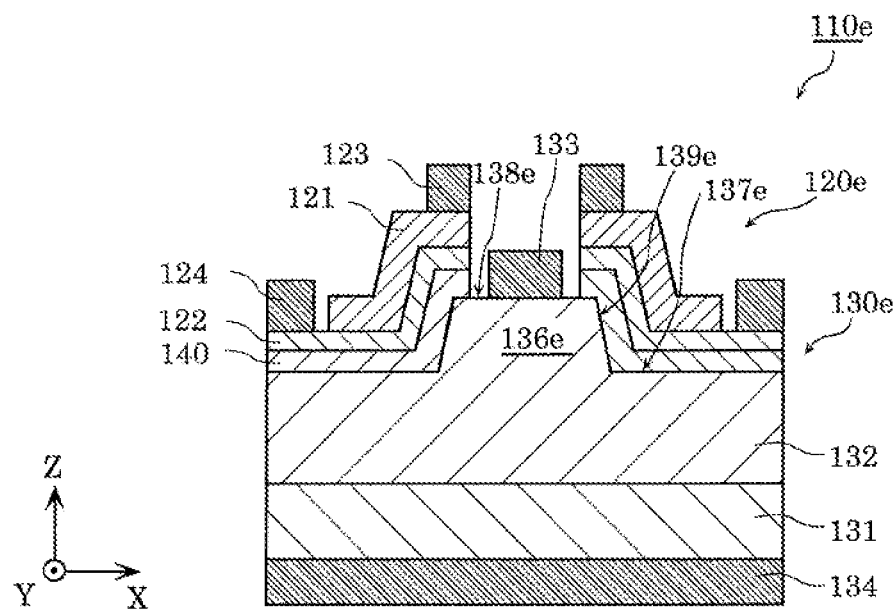
FIG. 16 is a schematic sectional view illustrating a configuration of a semiconductor relay according to a Modification of Embodiment 4.

Hereinafter, a semiconductor relay according to a Modification of Embodiment 4 will be described. FIG. 16 is a schematic sectional view illustrating a configuration of the semiconductor relay according to Modification of Embodiment 4. Note that in the modification, a difference from semiconductor relay 110d will be mainly described, and components having substantially same functions as the components of semiconductor relay 110d may be assigned with the same reference signs even when shapes or the like are different.

As illustrated in FIG. 16, semiconductor relay 110e according to the modification of Embodiment 4 includes light-emitting element 120e, light-receiving element 130e, and insulating layer 140. In semiconductor relay 110e, protruded portion 136 protruded upward is formed on semiconductor layer 132 included in light-receiving element 130e. As a result that protruded portion 136e is formed, the top surface of semiconductor layer 132 includes first surface 137e, second surface 138e located upward from first surface 137e, and inclined surface 139e between first surface 137e and second surface 138e. A three-dimensional shape of protruded portion 136e is, for example, a ridge shape with the Y-axis direction as a longitudinal direction, and first surface 137e, second surface 138e, and inclined surface 139e are respectively planes, for example.

Third electrode 123 included in light-receiving element 130e is formed on second surface 138e. Second electrode 134 included in light-receiving element 130e is formed on the undersurface of substrate 131.

Insulating layer 140 is formed to be laid on first surface 137e, inclined surface 139e, and an end portion at inclined surface 139e side, of second surface 138e. Insulating layer 140 is formed along inclined surface 139e, and has a shape along inclined surface 139e.

Light-emitting element 120e is formed on insulating layer 140, is formed along inclined surface 139e similarly to insulating layer 140, and has a shape along inclined surface 139e. Light-emitting element 120e is formed on first surface 137e of semiconductor layer 132 to sandwich first electrode 133 in plan view.

In this way, when light-emitting element 120e is formed along inclined surface 139e, light-emitting element 120e can irradiate, with light, a region (protruded portion 136e) directly below first electrode 133 which is usually difficult to irradiate with light.

Note that light-emitting element 120e can irradiate the region (protruded portion 136e) directly below first electrode 133 with light, and disposition of light-emitting element 120e is not specially limited. For example, protruded portion 136e may be disposed at one end portion in the lateral direction (X-axis direction) on substrate 131, and light-emitting element 120e may be disposed to be able to irradiate protruded portion 136e with light from the other end portion side of substrate 131.

[Production Method]

Next, a production method of semiconductor relay 110e will be described. In production of semiconductor relay 110e, semiconductor layer 132 is formed on substrate 131, and formed semiconductor layer 132 is processed into a shape having protruded portion 136e. Insulating layer 140 is formed on processed semiconductor layer 132, n-GaN layer 122 is formed on insulating layer 140, and p-GaN layer 121 is formed on n-GaN layer 122.

Next, p-GaN layer 121, n-GaN layer 122, and insulating layer 140 are removed by etching or the like so that at least a part of second surface 138e of protruded portion 136e is exposed. Subsequently, first electrode 133 is formed on exposed second surface 138e.

Next, a part of p-GaN layer 121 is removed by etching or the like so that n-GaN layer 122 is exposed. Subsequently, third electrode 123 is formed on p-GaN layer 121, and fourth electrode 124 is formed on exposed n-GaN layer 122.

Subsequently, second electrode 134 is formed on the undersurface of substrate 131. As a result, semiconductor relay 110e illustrated in FIG. 16 is obtained. An operation of semiconductor relay 110e is similar to the operation of semiconductor relay 110.

[Effect, Etc.]

In semiconductor relay 110e, light-emitting element 120e can efficiently irradiate the region (protruded portion 136e) directly below first electrode 133 with light.

Embodiment 5

[Configuration]

Figure 17:
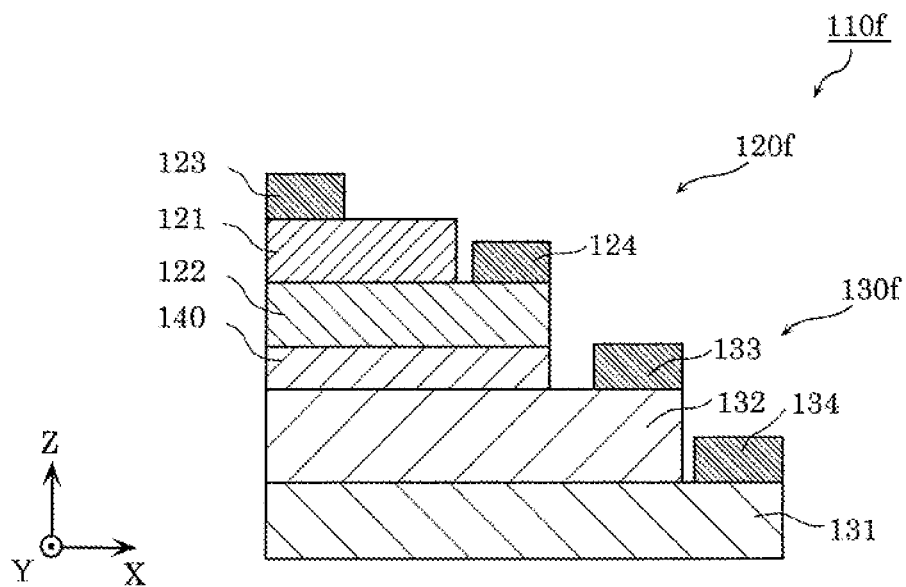
FIG. 17 is a schematic sectional view illustrating a configuration of a semiconductor relay according to Embodiment 5.

Hereinafter, a semiconductor relay according to Embodiment 5 will be described. FIG. 17 is a schematic sectional view illustrating a configuration of the semiconductor relay according to Embodiment 5. Note that in Embodiment 5, a difference from semiconductor relay 110 is mainly described, and components having substantially same functions as the components of semiconductor relay 110 may be assigned with same reference signs even when shapes or the like are different.

As illustrated in FIG. 17, semiconductor relay 110f according to Embodiment 5 includes light-emitting element 120f, light-receiving element 130f, and insulating layer 140. In light-receiving element 130f included in semiconductor relay 110f, semiconductor layer 132 is partially formed on substrate 131. In other words, on the top surface of substrate 131, a region where semiconductor layer 132 is not formed is included.

Furthermore, first electrode 133 of two electrodes included in light-receiving element 130f is formed on semiconductor layer 132, and second electrode 134 is formed in the region where semiconductor layer 132 is not formed, on the top surface of substrate 131.

In this way, in light-receiving element 130f included in semiconductor relay 110f, semiconductor layer 132, and second electrode 134 are formed on substrate 131, and first electrode 133 is formed on semiconductor layer 132. In semiconductor relay 110f, first electrode 133 and second electrode 134 differ in position in the thickness direction of substrate 131. Consequently, in light-receiving element 130f, a current flows in the thickness direction of substrate 131. Note that in semiconductor relay 110f, substrate 131 comprises a material having conductivity.

[Production Method]

Next, a production method of semiconductor relay 110f will be described. In production of semiconductor relay 110f, semiconductor layer 132 is formed on substrate 131, insulating layer 140 is formed on semiconductor layer 132, n-GaN layer 122 is formed on insulating layer 140, and p-GaN layer 121 is formed on n-GaN layer 122.

Next, p-GaN layer 121 is partially removed by etching or the like, leaving a region for forming third electrode 123. Thereby, n-GaN layer 122 is exposed. Subsequently, exposed n-GaN layer 122 is partially removed by etching or the like, leaving a region for forming fourth electrode 124. At this time, insulating layer 140 is removed together. Thereby, semiconductor layer 132 is exposed.

Next, exposed semiconductor layer 132 is partially removed by etching or the like, leaving a region for forming first electrode 133. Thereby, substrate 131 is exposed.

Subsequently, third electrode 123 is formed on p-GaN layer 121, fourth electrode 124 is formed on exposed n-GaN layer 122, first electrode 133 is formed on exposed semiconductor layer 132, and second electrode 134 is formed on exposed substrate 131. As a result, semiconductor relay 110f illustrated in FIG. 17 is obtained. An operation of semiconductor relay 110f is similar to the operation of semiconductor relay 110.

[Effect, Etc.]

In semiconductor relay 110f, a current flows in the thickness direction of substrate 131 in light-receiving element 130f. Consequently, semiconductor relay 110f easily increases the withstand voltage and increases the current. Note that the withstand voltage is increased by increasing the thickness of semiconductor layer 132.

Furthermore, in semiconductor relay 110f, it is not necessary to form components on the undersurface of substrate 131. In other words, the components included in semiconductor relay 110f are all formed on the top surface side of substrate 131. Accordingly, semiconductor relay 110f has an advantage that the production process is easy.

Embodiment 6

Note that in the semiconductor relay in which at least one electrode of first electrode 133 and second electrode 134 is formed on semiconductor layer 132, out of the semiconductor relays described in embodiments 3 to 5 described above, the light from the light-emitting element is shielded by the electrode, so that a portion in contact with the electrode, of semiconductor layer 132, may be difficult to reduce in resistance. Namely, contact resistance may be large.

In the case like this, the electrode formed on semiconductor layer 132 can be a transparent electrode (electrode having light transmissivity), for example. In other words, at least one electrode of first electrode 133 and second electrode 134 may be a transparent electrode. Furthermore, in semiconductor layer 132, a region under the electrode formed on semiconductor layer 132, may be doped with carriers with a higher concentration than concentrations in other regions.

Thereby, reduction in resistance of a portion in contact with the electrode, of semiconductor layer 132 is promoted. In other words, contact resistance is reduced.

Summary of Embodiments 3 to 6

The semiconductor relay according to one aspect of the present disclosure includes the light-emitting element, and the light-receiving element stacked on the light-emitting element, the light-receiving element has the substrate, the semiconductor layer that is formed on the substrate and has a semi-insulating property, and the two electrodes that are electrically connected to the semiconductor layer, and the semiconductor layer switches from insulating to conductive by absorbing the light from the light-emitting element.

In the semiconductor relay like this, the functions of the photoelectric conversion element and the switching element of a common semiconductor relay are realized by the single light-receiving element, and the number of components is decreased, so that miniaturization is easy. Furthermore, in the semiconductor relay like this, the light-emitting element and the light-receiving element are stacked on each other, and the light-emitting element and the light-receiving element are easily integrated in one chip, so that miniaturization is easy.

For example, the semiconductor relay further includes: an insulating layer that is located between the light-emitting element and the light-receiving element and has a light transmissivity.

According to the insulating layer like this, the insulation withstand voltage of the semiconductor relay can be increased.

For example, the insulating layer comprises a nitride semiconductor having a C concentration of 1E17 cm$^{-3}$ or more.

According to the insulating layer like this, the insulation withstand voltage of the semiconductor relay can be increased.

For example, the insulating layer has a structure in which a p-type semiconductor layer and an n-type semiconductor layer are alternately stacked in at least three layers.

According to the insulating layer like this, the insulating withstand voltage of the semiconductor relay can be increased.

For example, the two electrodes are disposed on the semiconductor layer, and the light-emitting element is disposed above the semiconductor layer.

The semiconductor relay like this can cause a current to flow in the lateral direction in the light-receiving element. In other words, the semiconductor relay like this is a lateral device.

For example, the two electrodes are disposed on the semiconductor layer, the light-emitting element is located below the semiconductor layer, and the insulating layer is located between an undersurface of the substrate and the light-emitting element.

Thereby, no electrode is formed at the light-emitting element side of the semiconductor layer, so that the light receiving area in the semiconductor layer is increased.

For example, the substrate has a light transmissivity and an insulating property.

Thereby, the semiconductor layer can receive the light from the light-emitting element via the substrate.

For example, the two electrodes are disposed on the semiconductor layer, and in a region between the two electrodes in plan view, of the semiconductor layer, a recessed portion is located.

Thereby, the substantial distance between the two electrodes increases, so that increase in withstand voltage of the light-receiving element is realized.

For example, a recessed portion is located in a region between the two electrodes in plan view, of the semiconductor layer, and the light-emitting element is located in the recessed portion, and has a shape along the recessed portion.

Thereby, the substantial distance between the two electrodes increases, so that increase in withstand voltage of the light-receiving element is realized.

For example, one of the two electrodes is disposed on the semiconductor layer, the other one of the two electrodes is disposed on an undersurface of the substrate, and the light-emitting element is disposed on the insulating layer.

The semiconductor relay like this can cause the current to flow in the vertical direction (stacking direction) in the light-receiving element. In other words, the semiconductor relay like this is a vertical device. Accordingly, increase in withstand voltage, and increase in current of the light-receiving element are realized.

For example, a top surface of the semiconductor layer includes a first surface, a second surface that is located upward from the first surface, and an inclined surface between the first surface and the second surface, the first electrode is disposed on the second surface, and the light-emitting element and the insulating layer are arranged along the inclined surface.

The semiconductor relay like this can efficiently operate the light-receiving element, because the light-emitting element is formed along the inclined surface, and the light from the light-emitting element easily hits the portion directly under the electrode that is formed on the semiconductor layer.

For example, the semiconductor layer, and one of the two electrodes are disposed on the substrate, and the other one of the two electrodes is disposed on the semiconductor layer.

The semiconductor relay can cause the current to flow in the vertical direction (stacking direction) in the light-receiving element while both the two electrodes of the light-receiving element are formed on an upper side of the substrate. In other words, increase in withstand voltage of the light-receiving element can be achieved similarly to the vertical device while the two electrodes are disposed similarly to the two electrodes in the lateral device.

For example, the semiconductor layer comprises a nitride semiconductor.

In this way, the nitride semiconductor having a larger bandgap as compared with Si that is used in a common semiconductor relay is used in the semiconductor layer, and thereby the light-receiving element is increased in withstand voltage.

For example, the semiconductor layer comprises AlGaN that is the nitride semiconductor.

In this way, AlGaN that has a larger bandgap as compared with Si that is used in a common semiconductor relay is used in the semiconductor layer, and thereby the light-receiving element is increased in withstand voltage.

For example, the semiconductor layer includes a first impurity having an acceptor type, and a second impurity having a donor type, the second impurity having ionization energy smaller than ionization energy of the first impurity, and having a concentration lower than a concentration of the first impurity, and the semiconductor layer has a trap level having activation energy that is larger than a sum of ionization energy of the first impurity and the ionization energy of the second impurity.

In this way, the trap level is formed in the semiconductor layer, and thereby the semiconductor layer can switch to conductive when receiving the light from the light-emitting element.

For example, a concentration obtained by subtracting the concentration of the second impurity from the concentration of the first impurity is 1E16 cm$^{-3}$ to 1E18 cm$^{-3}$ inclusive.

According to the impurity concentration in the range like this, the semiconductor relay can perform an effective and efficient relay operation.

For example, at least one of the two electrodes is disposed on the semiconductor layer, and in the semiconductor layer, a region under the at least one electrode is doped with a carrier of a higher concentration than other regions.

Thereby, the portion in contact with the electrode, in the semiconductor layer is easily reduced in resistance. In other words, the contact resistance of the semiconductor layer and the electrode can be reduced.

For example, at least one of the two electrodes is a transparent electrode.

Thereby, light easily hits a portion in contact with the electrode, in the semiconductor layer, so that reduction in resistance of the portion is promoted. In other words, the contact resistance of the semiconductor layer and the electrode can be reduced.

For example, the light-emitting element includes junction of a p-type nitride semiconductor and an n-type nitride semiconductor, and the semiconductor relay further comprising: a first electrode that is electrically connected to the p-type nitride semiconductor; and a second electrode that is electrically connected to the n-type nitride semiconductor.

Thereby, when the light-receiving element (substrate) comprises a nitride semiconductor of the same kind as the light-emitting element, the light-receiving element and the light-emitting element can be formed by continuous crystal growth. Consequently, simplification of the process, enhancement in light irradiation efficiency, improvement in the operation delay time, and the like are realized.

For example, the substrate comprises a nitride semiconductor.

Thereby, when the semiconductor layer and the light-emitting element each comprise a nitride semiconductor, crystallinity of the light-receiving element and the light-emitting element can be increased. Consequently, in the semiconductor relay, the light-emitting function and the light-receiving function can be improved.

Embodiment 7

[Configuration]

Figure 18:
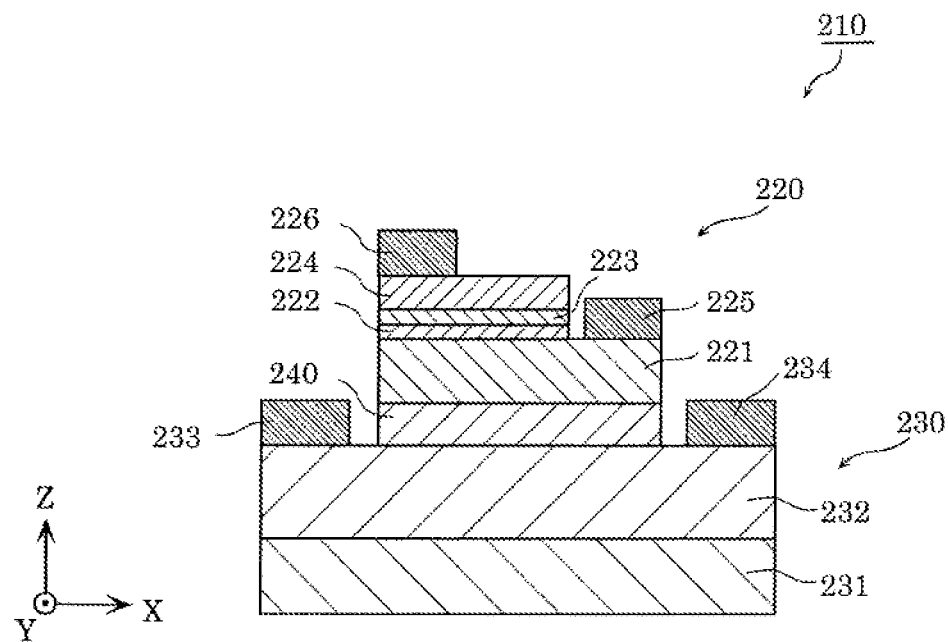
FIG. 18 is a schematic sectional view illustrating a configuration of a semiconductor relay according to Embodiment 7.

First, a configuration of a semiconductor relay according to Embodiment 7 will be described. FIG. 18 is a schematic sectional view illustrating the configuration of the semiconductor relay according to Embodiment 7.

As illustrated in FIG. 18, semiconductor relay 210 according to Embodiment 7 is configured by light-emitting element 220 that comprises a nitride semiconductor, light-receiving element 230 that comprises a nitride semiconductor, and insulating layer 240 that is formed between the light-emitting element and the light-receiving element.

First, light-emitting element 220 will be described. Light-emitting element 220 is a light-emitting diode in which n-AlGaN layer 221, active layer 222, p-AlGaN layer 223, and p-GaN layer 224 are sequentially formed. Note that the n-AlGaN layer, the p-AlGaN layer, and the p-GaN layer are respectively an n-type AlGaN layer, a p-type AlGaN layer, and a p-type GaN layer in other words. Third electrode 225 is formed on n-AlGaN layer 221, and fourth electrode 226 is formed on p-GaN layer 224. n-AlGaN layer 221 is an example of an n-type nitride semiconductor, and is formed on insulating layer 240. As an n-type impurity, Si is doped.

Active layer 222 is a nitride semiconductor, and is, for example, $In_xGa_{1-x}N$ (preferably, $0.01 \leq x \leq 0.20$). Active layer 222 is formed on n-AlGaN layer 221. Active layer 222 is not limited to a single quantum well structure, but may be of an InGaN/GaN multiple quantum well structure composed of an InGaN quantum well layer and a GaN barrier layer, or an InGaN/AlGaN multiple quantum well structure composed of an InGaN quantum well layer and an AlGaN barrier layer.

p-AlGaN layer 223 is an example of a p-type nitride semiconductor, and is formed on active layer 222. As a p-type impurity, Mg is doped.

p-GaN layer 224 is an example of a p-type nitride semiconductor, and is formed on p-AlGaN layer 223. As a p-type impurity, Mg is doped.

Third electrode 225 is a cathode electrode in other words. Third electrode 225 is partially formed on n-AlGaN layer 221. Third electrode 225 is formed in a region where active layer 222, p-AlGaN layer 223, and p-GaN layer 224 are removed, on a top surface of n-AlGaN layer 221. Third electrode 225 comprises a Ti/Al-based material, for example.

Fourth electrode 226 is an anode electrode in other words. Fourth electrode 226 is partially formed on p-GaN layer 224. Fourth electrode 226 comprises a Ti/Al-based material, for example.

By applying a voltage to third electrode 225 and fourth electrode 226, light-emitting element 220 emits light.

In this way, light-emitting element 220 comprises a nitride semiconductor, for example. Note that light-emitting element 220 may be formed by using a material other than a nitride semiconductor, such as GaAs or ZnSe. Light-emitting element 220 may be formed by a combination of other materials, or may have other structures as long as light-emitting element 220 is capable of inducing a light emitting phenomenon by an interaction of carriers among semiconductors of different kinds.

By using active layer 222 described above for light-emitting element 220, bandgap energy of the active layer of the light-emitting element can be smaller as compared with a case of forming the light-emitting element with large bandgap energy, for example, the light-emitting element by junction of a p-GaN layer and an n-GaN layer. In other words, a voltage that drives the light-emitting element can be reduced, and therefore, power consumption can be reduced.

Next, light-receiving element 230 will be described. Light-receiving element 230 includes substrate 231, semiconductor layer 232, first electrode 233, and second electrode 234.

Substrate 231 is a plate material where semiconductor layer 232 is formed on a top surface. A shape in plan view of substrate 231 is, for example, a rectangle, but may be a circle or the like, and is not specially limited. Substrate 231 is a GaN substrate formed of GaN, for example. In other words, substrate 231 comprises a nitride semiconductor, for example. Note that substrate 231 may be a Si substrate, a SiC substrate, a GaAs substrate, a GaP substrate, a GaO substrate, a sapphire substrate, or the like.

Semiconductor layer 232 is a semiconductor layer that is formed on substrate 231, and has a semi-insulating property. A detailed configuration of semiconductor layer 232 is similar to the configurations of semiconductor layer 32, semiconductor layer 132, and the like.

Semiconductor layer 232 comprises, for example, $In_yGa_{1-y}N$ (preferably, $0.20 \leq y \leq 0.40$). Note that semiconductor layer 232 is not limited to a single layer, but may be of a stacking structure of InGaN/GaN, InGaN/AlGaN, and the like.

However, semiconductor layer 232 needs to absorb light that is emitted by active layer 222 of light-emitting element 220. When InGaN is used for both semiconductor layer 232 and active layer 222 of light-emitting element 220, compositions can be adjusted so as to satisfy a relationship of y>x in $In_yGa_{1-y}N$ in semiconductor layer 232, and $In_xGa_{1-x}N$ in the active layer. By adjusting the composition in this way, bandgap energy of semiconductor layer 232 becomes smaller than bandgap energy of active layer 222 of light-emitting element 220. In other words, semiconductor layer 232 absorbs the light emitted by active layer 222 of light-emitting element 220, and can be reduced in resistance as will be described later.

First electrode 233 and second electrode 234 are two electrodes that are electrically connected to semiconductor layer 232. First electrode 233 and second electrode 234 are formed on semiconductor layer 232 to be separated from each other. Specifically, first electrode 233 and second electrode 234 each comprise a Ti/Al-based material, for example, but may be transparent electrodes formed of a material such as ITO (indium tin oxide). Insulating layer 240 is formed between first electrode 233 and second electrode 234 in plan view, on the top surface of semiconductor layer 232. In other words, insulating layer 240 is formed in a region where first electrode 233 and second electrode 234 are not formed, on semiconductor layer 232.

Next, insulating layer 240 will be described. Insulating layer 240 is an insulating layer with high resistance that is formed between light-emitting element 220, and light-receiving element 230 in the stacking direction, and has light transmissivity. Insulating layer 240 can transmit the light from light-emitting element 220 and irradiate the light-receiving element with the light. Insulating layer 240 comprises a nitride semiconductor, for example. More specifically, insulating layer 240 comprises GaN, for example. Insulating layer 240 can be a semiconductor that does not absorb the light emitted from light-emitting element 220 and has a bandgap, and may be a multiple mixed crystal of a nitride semiconductor such as AlGaN, for example.

Furthermore, insulating layer 240 may be doped with C (carbon) of an impurity concentration of $1E17\ cm^{-3}$ or more. Thereby, insulation between light-emitting element 220 and light-receiving element 230 is kept.

An operation of semiconductor relay 210 described above is similar to the operations of semiconductor relay 10, semiconductor relay 110, and the like. Furthermore, a production method of semiconductor relay 210 is similar to the production method of semiconductor relay 110.

[Effect, Etc.]

Furthermore, when GaN with large bandgap energy is used for semiconductor layer 232 of light-receiving element 230, for example, bandgap energy of active layer 222 of light-emitting element 220 needs to be made larger than GaN. In other words, a voltage that drives light-emitting element 220 needs to be made large, and power consumption increases.

In relation to this, by using InGaN, for example, that has smaller bandgap energy as compared with GaN, for semiconductor layer 232 of light-receiving element 230, bandgap energy of active layer 222 of light-emitting element 220 can be small. In other words, the voltage that drives light-emitting element 220 can be reduced, so that power consumption can be also reduced.

Embodiment 8

[Configuration]

Figure 19:
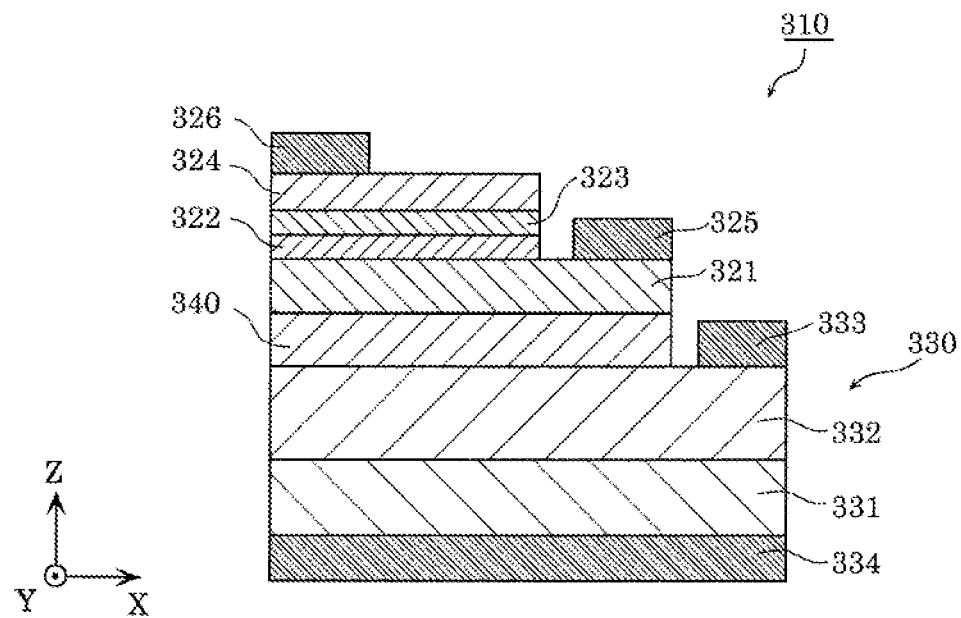
FIG. 19 is a schematic sectional view illustrating a configuration of a semiconductor relay according to Embodiment 8.

Hereinafter, a semiconductor relay according to Embodiment 8 will be described. FIG. 19 is a schematic sectional view illustrating a configuration of the semiconductor relay according to Embodiment 8. Note that in Embodiment 8, a difference from semiconductor relay 210 is mainly described, and components having substantially same functions as the components of semiconductor relay 210 may be assigned with same reference signs even when shapes or the like are different. First, the configuration of the semiconductor relay according to Embodiment 8 will be described. FIG. 19 is a schematic sectional view of the semiconductor relay according to Embodiment 8.

As illustrated in FIG. 19, semiconductor relay 310 according to Embodiment 8 is configured by light-emitting element 320 that comprises a nitride semiconductor, light-receiving element 330 that comprises a nitride semiconductor, and insulating layer 340 that is formed between light-receiving element 330 and light-emitting element 320. In other words, as illustrated in FIG. 19, semiconductor relay 310 according to Embodiment 8 includes light-emitting element 320, light-receiving element 330, and insulating layer 340.

Light-emitting element 320 includes n-AlGaN layer 321, active layer 322, p-AlGaN layer 323, p-GaN layer 324, third electrode 325, and fourth electrode 326. Light-receiving element 330 includes substrate 331, semiconductor layer 332, first electrode 333, and second electrode 334.

In semiconductor relay 310, first electrode 333 that is one of the two electrodes included in light-receiving element 330, and insulating layer 340 are formed on semiconductor layer 332. Second electrode 334 that is the other electrode of the two electrodes included in light-receiving element 330 is formed on an undersurface of substrate 331. Light-emitting element 320 is formed on insulating layer 340.

Specifically, in semiconductor relay 310, first electrode 333 is formed in a region at an end portion of a top surface of semiconductor layer 332, and light-emitting element 320 is disposed on semiconductor layer 332, side by side in a lateral direction with first electrode 333. Light-emitting element 320 mainly emits light downward.

In semiconductor relay 310, first electrode 333 and second electrode 334 are disposed side by side in a thickness direction of substrate 331. Consequently, in light-receiving element 330, a current flows in the thickness direction of substrate 331. In semiconductor relay 310, substrate 331 comprises a material having conductivity.

Note that light-emitting element 320 may be formed on semiconductor layer 332 to surround a periphery of first electrode 333 in plan view. Furthermore, light-emitting element 320 may be formed on semiconductor layer 332 to sandwich first electrode 333 in plan view. For example, light-emitting element 320 may be formed on semiconductor layer 332 to be divided into two spots to sandwich first electrode 333 formed into a stripe shape in plan view from a short-side direction.

Thereby, a region that is irradiated with light from light-emitting element 320, in semiconductor layer 332, is increased, and therefore, efficiency is enhanced.

An operation of semiconductor relay 310 is similar to the operation of semiconductor relay 310.

[Effect, Etc.]

In semiconductor relay 310, a current flows in a thickness direction of substrate 331 in light-receiving element 330. Consequently, semiconductor relay 310 easily achieves an increase in a withstand voltage, and an increase in current.

In a so-called vertical device like light-receiving element 330, the withstand voltage is determined by a thickness of semiconductor layer 332. Consequently, semiconductor relay 310 can decrease a size as compared with semiconductor relay 210 of a lateral device structure having the same withstand voltage.

Summary of Embodiments 7 and 8

The semiconductor relay according to one aspect of the present disclosure includes a light-emitting element that has an active layer, and a light-receiving element that is stacked on the light-emitting element, the light-receiving element has a substrate, a semiconductor layer that is formed on the substrate, and has a semi-insulating property, and two electrodes that are electrically connected to the semiconductor layer, and the semiconductor layer switches from insulating to conductive by absorbing light from the light-emitting element.

In the semiconductor relay like this, the functions of the photoelectric conversion element and the switching element of a common semiconductor relay are realized by the single light-receiving element, and the number of components is decreased, so that miniaturization is easy. Furthermore, in the semiconductor relay like this, the light-emitting element and the light-receiving element are stacked on each other, and the light-emitting element and the light-receiving element are easily integrated in one chip, so that miniaturization is easy.

For example, bandgap energy of the active layer is larger than bandgap energy of the semiconductor layer.

For example, the active layer comprises InGaN.

For example, the semiconductor layer comprises InGaN.

For example, the semiconductor layer includes a first impurity having an acceptor type, and a second impurity having a donor type, the second impurity having ionization energy smaller than ionization energy of the first impurity, and having a concentration lower than a concentration of the first impurity, and the semiconductor layer has a trap level having activation energy that is larger than a sum of ionization energy of the first impurity and the ionization energy of the second impurity.

For example, a concentration obtained by subtracting the concentration of the second impurity from the concentration of the first impurity is 1E16 $cm^{-3}$ to 1E18 $cm^{-3}$ inclusive.

For example, the semiconductor relay further includes: an insulating layer that is located between the light-emitting element and the light-receiving element, and has a light transmissivity.

For example, one of the two electrodes and the insulating layer are disposed on the semiconductor layer, the other one of the two electrodes is disposed on an undersurface of the substrate, and the light-emitting element is disposed on the insulating layer.

For example, the insulating layer comprises a nitride semiconductor including at least Al.

Embodiment 9

[Configuration]

Figure 20:
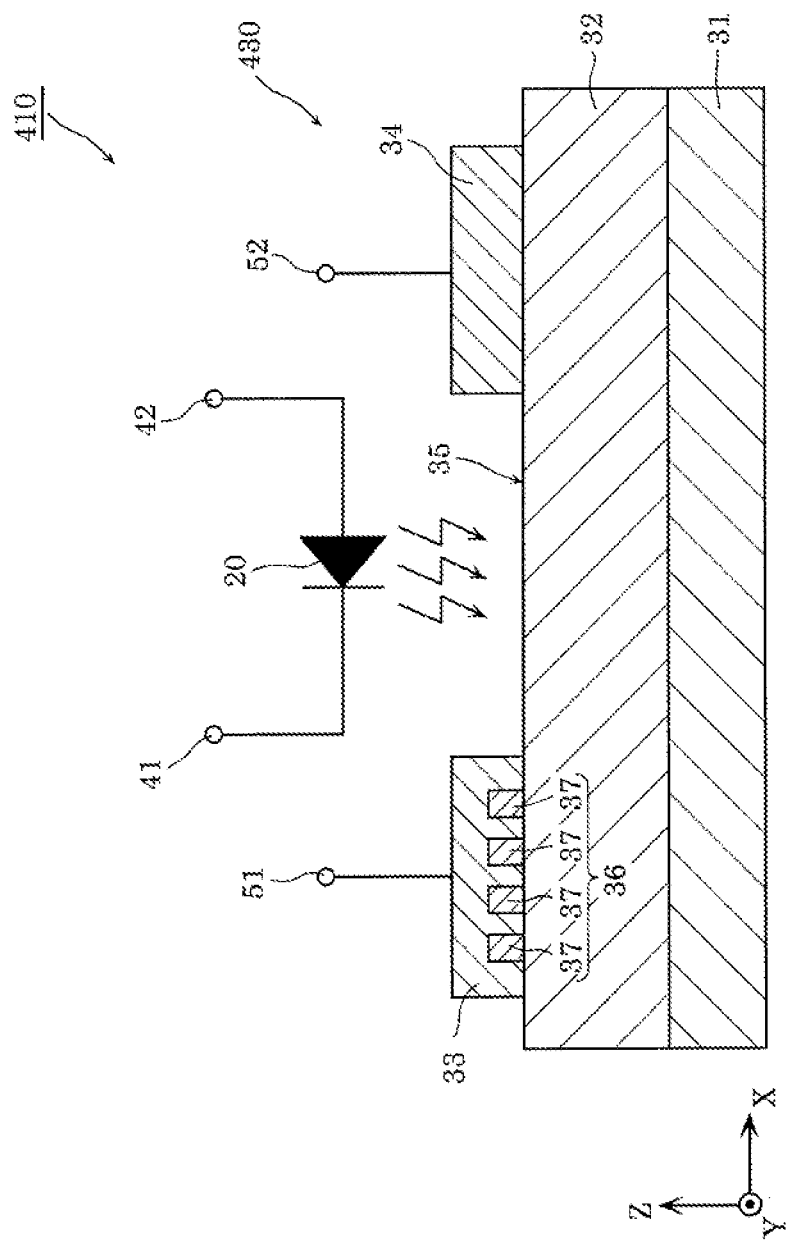
FIG. 20 is a schematic sectional view of a semiconductor relay according to Embodiment 9.
Figure 21:
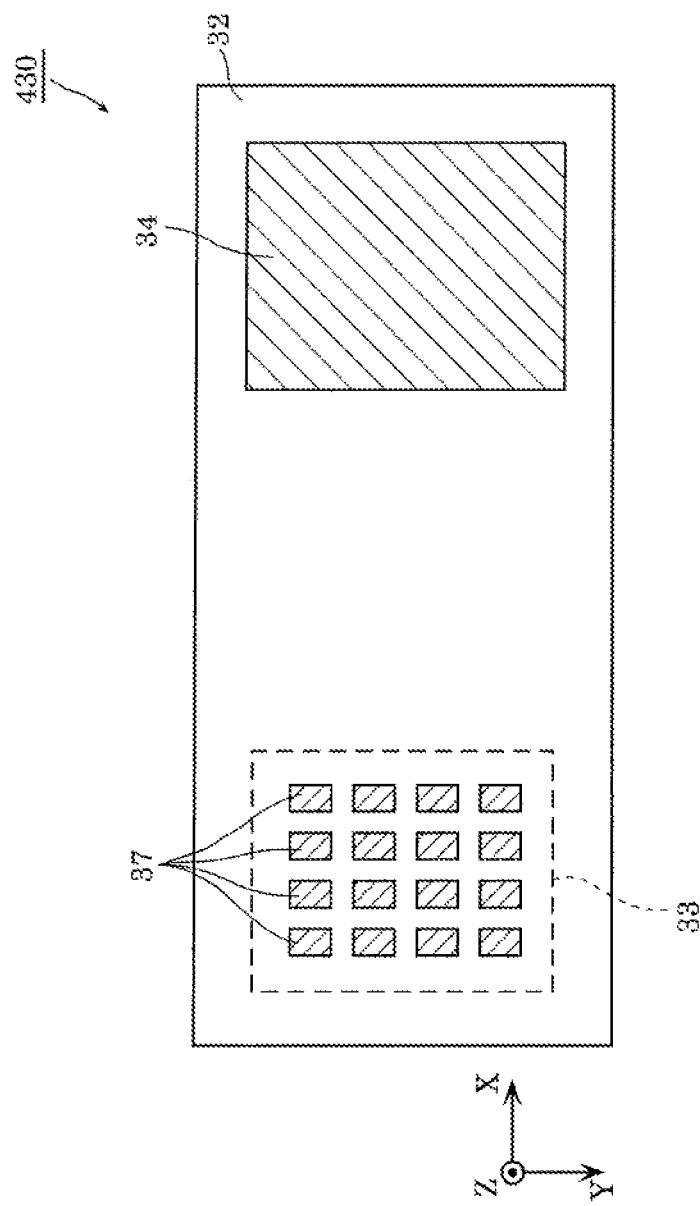
FIG. 21 is a top view of a light-receiving element included in the semiconductor relay according to Embodiment 9.

First, a configuration of a semiconductor relay according to Embodiment 9 will be described. FIG. 20 is a schematic sectional view of the semiconductor relay according to Embodiment 9. FIG. 21 is a top view of a light-receiving element included in the semiconductor relay according to Embodiment 9. Note that in FIG. 21, in order to illustrate shapes and disposition of plural p-type semiconductor sections 37 (first p-type semiconductor layer 36), first electrode 33 that covers plural p-type semiconductor sections 37 is illustrated by a broken line.

As illustrated in FIG. 20, semiconductor relay 410 according to Embodiment 9 includes light-emitting element 20, and light-receiving element 430 that is disposed facing light-emitting element 20. Furthermore, semiconductor relay 410 includes four terminals that are input terminal 41, input terminal 42, output terminal 51, and output terminal 52. In other words, semiconductor relay 410 is an element with four terminals. Semiconductor relay 410 operates as a switch.

Light-receiving element 430 includes substrate 31, semiconductor layer 32, first electrode 33, second electrode 34, and first p-type semiconductor layer 36. In this way, semiconductor relay 410 differs from semiconductor relay 10 in a configuration of light-receiving element 430. Specifically, light-receiving element 430 is of a configuration in which first p-type semiconductor layer 36 is added to light-receiving element 30. Hereinafter, a configuration of first p-type semiconductor layer 36 will be described in detail.

First p-type semiconductor layer 36 is a p-type semiconductor layer which is formed on semiconductor layer 32. First p-type semiconductor layer 36 comprises a p-type nitride semiconductor, for example. Specifically, first p-type semiconductor layer 36 comprises P-type InAlGaN, for example.

More specifically, first p-type semiconductor layer 36 is doped with an impurity such as Mg, for example, and p-type InAlGaN of a carrier concentration of 1E18 $cm^{-3}$ to 1E20 $cm^{-3}$ inclusive is used for first p-type semiconductor layer 36. More specifically, for first p-type semiconductor layer 36, a p-type semiconductor that includes similar impurities to the p-type semiconductor used for light-emitting element 20, and has a carrier concentration similar to the carrier concentration of the p-type semiconductor used for light-emitting element 20 is used. A thickness of first p-type semiconductor layer 36 is, for example, 400 nm.

Specifically, first p-type semiconductor layer 36 is formed into plural p-type semiconductor sections 37. In other words, first p-type semiconductor layer 36 is patterned into a predetermined shape. Specifically, first p-type semiconductor layer 36 is formed by being divided into plural p-type semiconductor sections 37. As illustrated in FIG. 21, in plan view, each of plural p-type semiconductor sections 37 is, for example, rectangle, and plural p-type semiconductor sections 37 are disposed in a matrix shape.

Discrete first p-type semiconductor layer 36 like this is formed as follows. First, continuous p-type InAlGaN layer is formed on semiconductor layer 32. Next, continuous p-type InAlGaN layer which is formed is partially removed by dry etching or the like, and thereby a p-type InAlGaN layer discretely remains. The remaining p-type InAlGaN layer corresponds to plural p-type semiconductor sections 37, and configures first p-type semiconductor layer 36.

In light-receiving element 430, first electrode 33 is formed in contact with semiconductor layer 32 and first p-type semiconductor layer 36. Specifically, first electrode 33 is formed on semiconductor layer 32 to cover all plural p-type semiconductor sections 37. Unlike first electrode 33, a p-type semiconductor layer is not formed between second electrode 34 and semiconductor layer 32. Second electrode 34 is formed by being separated by approximately 5 μm to 15 μm inclusive (for example, approximately 10 μm) in the lateral direction (X-axis direction). Second electrode 34 is specifically formed of a Ti/Al-based material, but may be a transparent electrode formed of ITO.

[Effect, Etc.]

Next, an effect obtained by first p-type semiconductor layer 36 will be described. In semiconductor relay 410, a reverse voltage is applied to pn junction of first p-type semiconductor layer 36 and semiconductor layer 32 when light-emitting element 20 lights out (off state of light-receiving element 430), and a depletion layer spreads from first p-type semiconductor layer 36. Thereby, an electric field that is exerted on first electrode 33, and an electric field that is exerted on second electrode 34 can be distributed. Consequently, a withstand voltage of light-receiving element 430 can be increased. Furthermore, the above described depletion layer can reduce a leak current.

However, when an entire undersurface of first electrode 33 contacts first p-type semiconductor layer 36, and first electrode 33 does not directly contact semiconductor layer 32, an on voltage of pn junction occurs between first electrode 33 and second electrode 34 when light-emitting element 20 emits light (on state of light-receiving element 430). The on voltage of pn junction is larger as compared with an on voltage of ohmic junction, or an on voltage of Schottky barrier junction. Consequently, there arises the problem that power consumption is large when light-emitting element 20 emits light.

In order to solve the problem, in light-receiving element 430, plural p-type semiconductor sections 37 (first p-type semiconductor layer 36) which are located under first electrode 33 are discretely disposed, and portions where first electrode 33 directly contacts semiconductor layer 32 are provided. Junction of first electrode 33 and semiconductor layer 32 is Schottky barrier junction, or ohmic junction. Consequently, the on voltage of pn junction can be decreased when light-emitting element 20 emits light, and power consumption is also reduced.

Furthermore, even when plural p-type semiconductor sections 37 (first p-type semiconductor layer 36) are discretely disposed, the depletion layer of pn junction extends, and a region where first electrode 33 and semiconductor layer 32 directly contact each other is covered with the depletion layer of pn junction, while light-receiving element 430 is in the off state. In other words, the depletion layer of pn junction can cover the entire undersurface of first electrode 33, whereby the leak current is suppressed when light-emitting element 20 lights out.

Embodiment 10

Shape of First p-Type Semiconductor Layer According to Embodiment 10

In Embodiment 9 described above, first p-type semiconductor layer 36 is formed by plural p-type semiconductor sections 37 being disposed in the matrix shape. However, a shape of first p-type semiconductor layer 36 (disposition of plural p-type semiconductor sections 37) is not specially limited.

Figure 22:
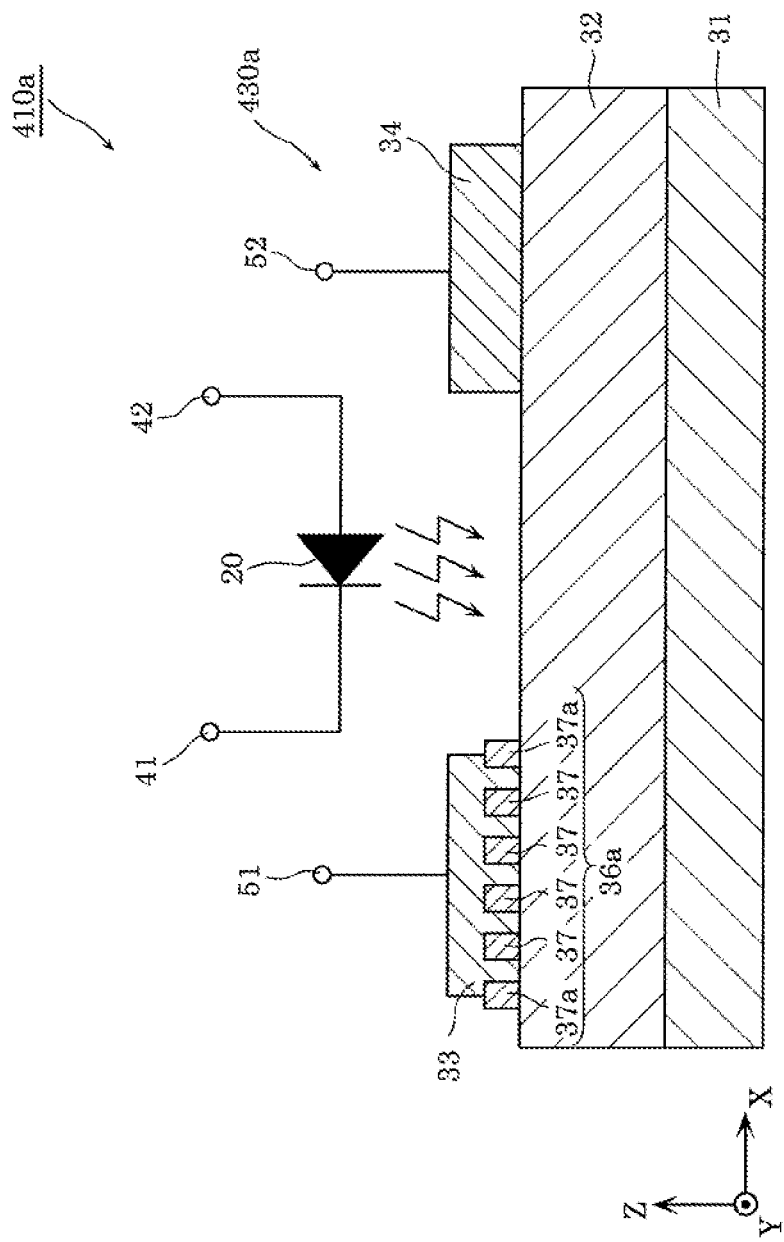
FIG. 22 is a schematic sectional view of a semiconductor relay according to Embodiment 10.
Figure 23:
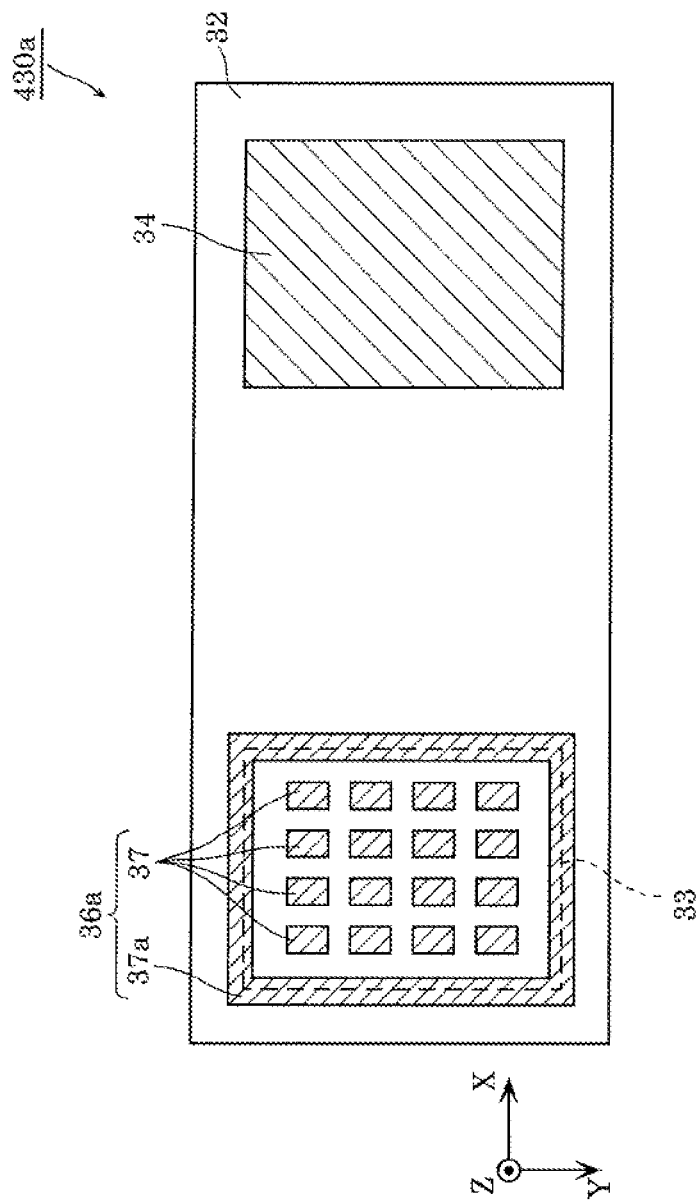
FIG. 23 is a top view of a light-receiving element included in the semiconductor relay according to Embodiment 10.

In Embodiment 10 as follows, a semiconductor relay (light-receiving element) that is different mainly in the configuration of first p-type semiconductor layer 36 will be described. FIG. 22 is a schematic sectional view of the semiconductor relay according to Embodiment 10. FIG. 23 is a top view of a light-receiving element included by the semiconductor relay according to Embodiment 10. Note that in FIG. 23, in order to illustrate a shape of first p-type semiconductor layer 36a, first electrode 33 that partially covers first p-type semiconductor layer 36a is illustrated by a broken line. Furthermore, in Embodiment 10 as follows, explanation of the matters that are already described in Embodiment 9 is arbitrarily omitted.

As illustrated in FIG. 22, semiconductor relay 410a includes light-receiving element 430a. Light-receiving element 430a differs from light-receiving element 430 in shape in plan view of first p-type semiconductor layer 36a.

As illustrated in FIG. 23, in plan view, first p-type semiconductor layer 36a includes guard ring 37a that is a p-type semiconductor section enclosing plural p-type semiconductor sections 37, in addition to plural p-type semiconductor sections 37 which are disposed in a matrix shape.

Each of plural p-type semiconductor sections 37 is, for example, a square of 1 μm×1 μm, and an interval between one p-type semiconductor section 37 and another p-type semiconductor section 37 is approximately 1 μm to 2 μm inclusive. A size of p-type semiconductor section 37 is not limited to the size like this. Note that when the size of p-type semiconductor section 37 is 5 μm×5 μm, the interval between one p-type semiconductor section 37 and another p-type semiconductor section 37 can be 5 μm or more. In other words, the interval between one p-type semiconductor section 37 and another p-type semiconductor section 37 can be a length of one side of p-type semiconductor section 37 or more. Furthermore, the number of plural p-type semiconductor sections 37 is changed in response to the size of one p-type semiconductor section 37, and a size of first electrode 33. In other words, the number of plural p-type semiconductor sections 37 is not specially limited.

A shape in plan view of guard ring 37a is, for example, a rectangular ring shape. Note that the shape in plan view of guard ring 37a is desirably adapted to the shape of first electrode 33. Specifically, for example, when first electrode 33 is circular, the shape of guard ring 37a is desirably also made circular (circular ring-shape), but is not limited to this. A width of guard ring 37a is, for example, approximately 3 μm. An interval between the guard ring and p-type semiconductor section 37 is, for example, matched with the interval between one p-type semiconductor section 37 and another p-type semiconductor section 37.

Plural p-type semiconductor sections 37 are covered with first electrode 33, but guard ring 37a is partially exposed from first electrode 33. In other words, plural p-type semiconductor sections that configure first p-type semiconductor layer 36a include p-type semiconductor sections 37 covered with first electrode 33, and guard ring 37a that is a p-type semiconductor section a part of which is exposed from an end portion of first electrode 33. Specifically, the end portion of first electrode 33 is not located on semiconductor layer 32, but is located on guard ring 37a. A width of a portion where first electrode 33 and guard ring 37a overlap each other in plan view is, for example, approximately 2 μm. In this way, guard ring 37a prevents the end portion of first electrode 33 from directly contacting semiconductor layer 32.

According to guard ring 37a like this, an electric field can be distributed by adopting pn junction for a lower side of the end portion of first electrode 33 where electric field concentration specially occurs easily, and a leak current in the end portion can be suppressed.

[Variation of First p-Type Semiconductor Layer]

Note that various variations are conceivable with respect to the shapes and disposition of plural p-type semiconductor sections 37 in the region enclosed by guard ring 37a. FIG. 24 to FIG. 27 are views illustrating other variations of the shapes and dispositions of plural p-type semiconductor sections. Note that FIG. 24 to FIG. 27 are top views of light-receiving elements.

Figure 24:
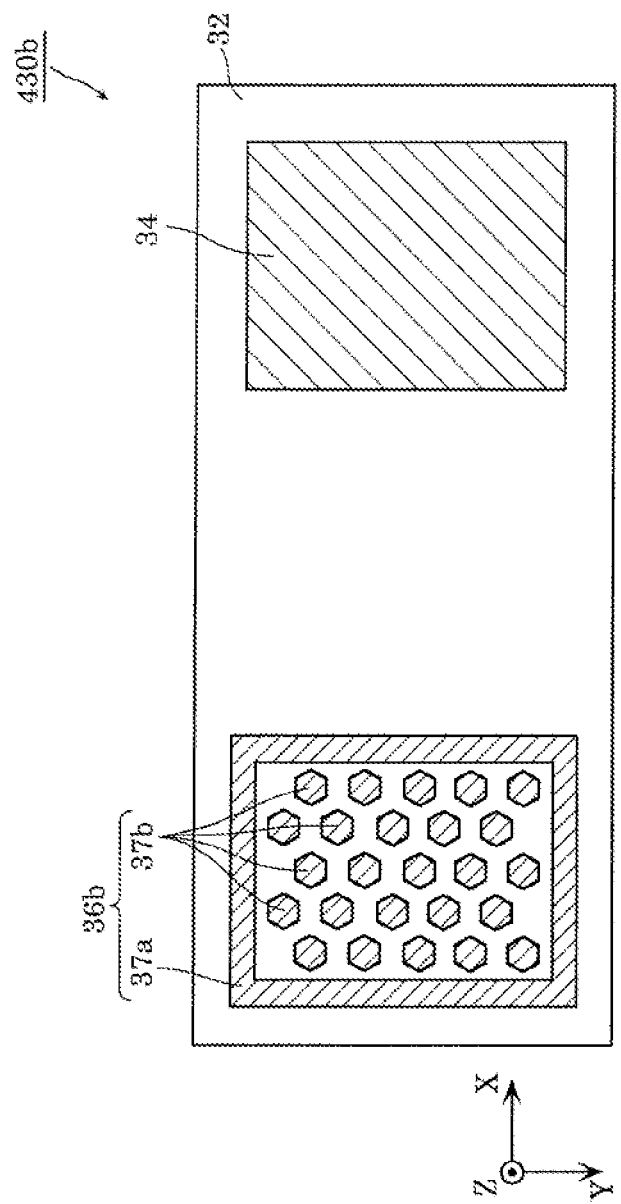
FIG. 24 is a diagram illustrating a first variation of shapes and disposition of plural p-type semiconductor sections.

For example, as in first p-type semiconductor layer 36b of light-receiving element 430b illustrated in FIG. 24, in plan view, each of plural p-type semiconductor sections 37b may be hexagonal, and plural p-type semiconductor sections 37b may be spaced from one another and disposed in a honeycomb shape. A shape in plan view of p-type semiconductor section 37b is a regular hexagon of 1 µm on one side, for example. An interval between one p-type semiconductor section 37b and another p-type semiconductor section 37b is, for example, approximately 1 µm to 2 µm inclusive. A size of p-type semiconductor section 37b, and the interval between one p-type semiconductor section 37b and another p-type semiconductor section 37b is not limited to above description.

Figure 25:
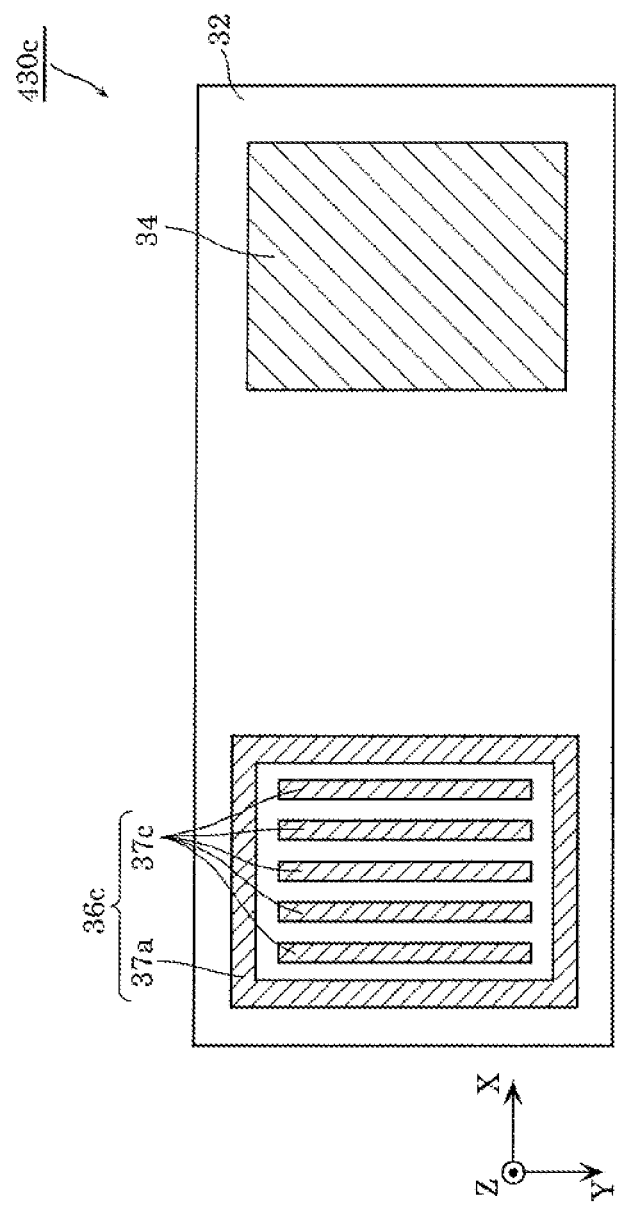
FIG. 25 is a diagram illustrating a second variation of shapes and disposition of the plural p-type semiconductor sections.

Furthermore, as in first p-type semiconductor layer 36c of light-receiving element 430c illustrated in FIG. 25, in plan view, each of plural p-type semiconductor sections 37c is in a line shape extending in the Y-axis direction, and plural p-type semiconductor sections 37c may be disposed side by side in the X-axis direction. A width in the X-axis direction of p-type semiconductor section 37c is, for example, 1 µm, and an interval between one p-type semiconductor section 37c and another p-type semiconductor section 37c is approximately 1 µm to 2 µm inclusive. Plural p-type semiconductor sections 37c are not arranged side by side in the Y-axis direction.

Note that an end portion in the Y-direction of p-type semiconductor section 37c may be directly connected to guard ring 37a. In this case, a shape in plan view of first p-type semiconductor layer 36c is a shape like a ladder.

Note that though not illustrated, each of plural p-type semiconductor sections 37c is in a line shape extending in the X-axis direction, and plural p-type semiconductor sections 37c may be disposed side by side in the Y-axis direction.

Figure 26:
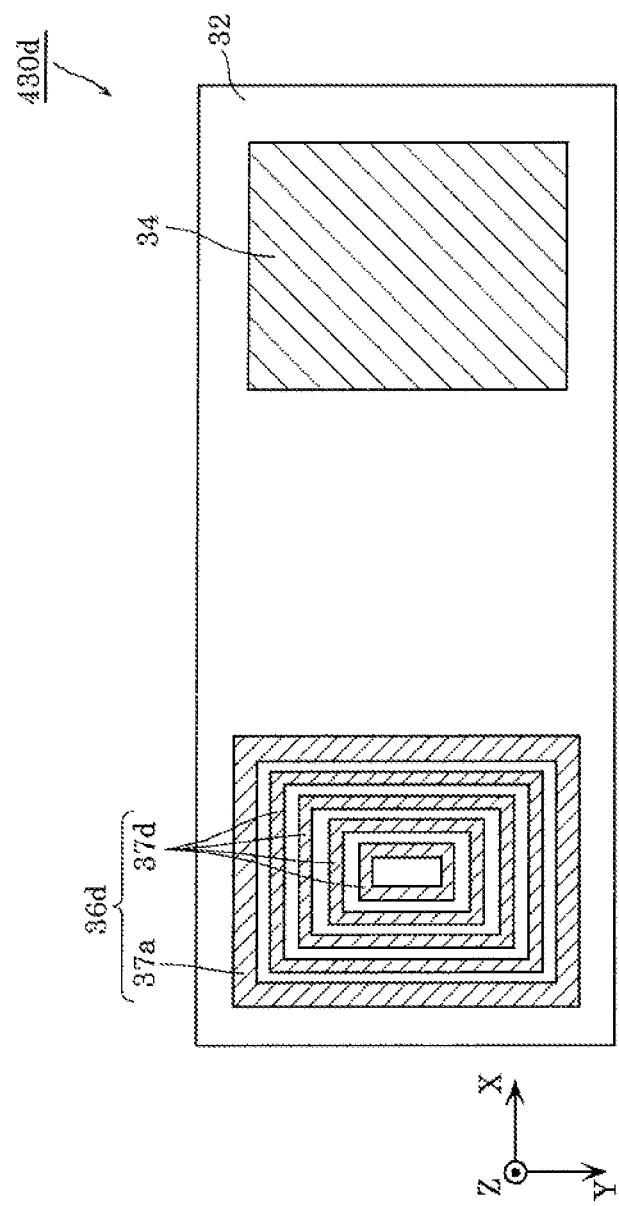
FIG. 26 is a diagram illustrating a third variation of shapes and disposition of the plural p-type semiconductor sections.

Furthermore, as in first p-type semiconductor layer 36d of light-receiving element 430d illustrated in FIG. 26, in plan view, each of plural p-type semiconductor sections 37d is in a rectangular ring shape similar to guard ring 37a, and inside of one p-type semiconductor section 37d, p-type semiconductor section 37d that is smaller than relevant one p-type semiconductor section 37d is disposed. In other words, plural p-type semiconductor sections 37d are disposed concentrically.

A width of one p-type semiconductor section 37d is approximately 1 µm, and an interval between one p-type semiconductor section 37d and another p-type semiconductor section 37d is approximately 1 µm to 2 µm inclusive. Of plural p-type semiconductor sections 37d, p-type semiconductor section 37d which is located most inward is a square with one side of approximately 1 µm to 2 µm inclusive, or a rectangular with a short side of 1 µm to 2 µm inclusive.

Furthermore, p-type semiconductor section 37d that is located most inward may has a rectangular ring shape, and in this case, a size of a portion enclosed by p-type semiconductor section 37d located most inward is a 4 µm square or less, when the interval between one p-type semiconductor section 37d and another p-type semiconductor section 37d is 1 µm. The size of a portion enclosed by p-type semiconductor section 37d located most inward is a 5 µm square or less when the interval between one p-type semiconductor section 37d and another p-type semiconductor section 37d is 2 µm.

Figure 27:
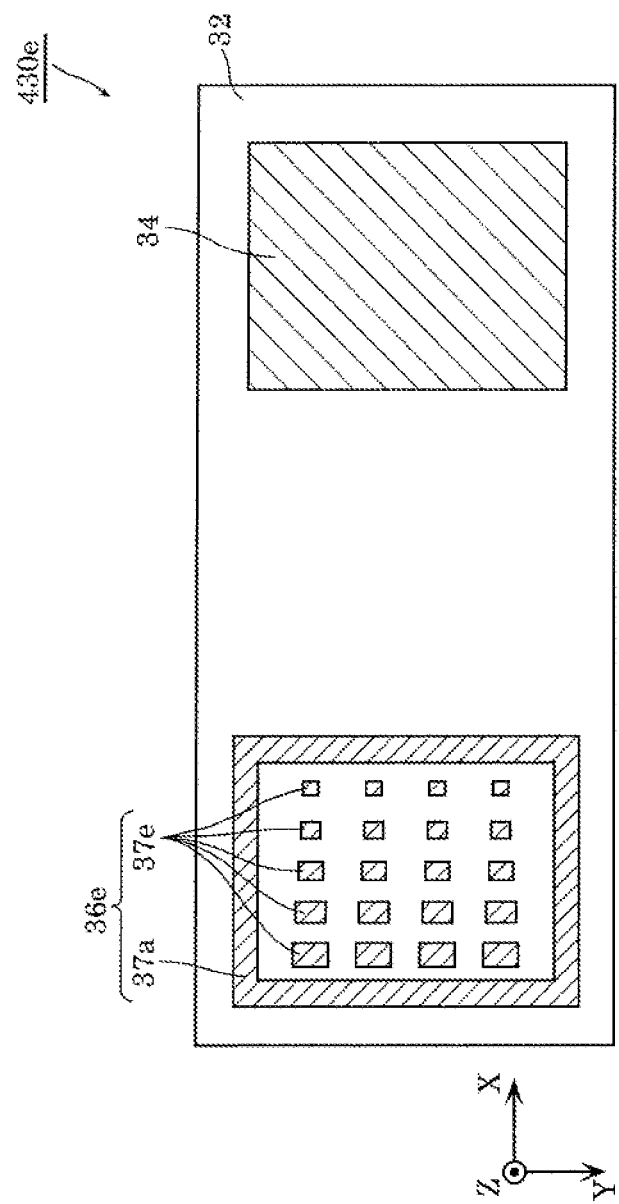
FIG. 27 is a diagram illustrating a fourth variation of shapes and disposition of the plural p-type semiconductor sections.

Furthermore, in first p-type semiconductor layer 36e of light-receiving element 430e illustrated in FIG. 27, each of plural p-type semiconductor sections 37e is a square (or rectangular), and plural p-type semiconductor sections 37e are disposed in a matrix shape. However, sizes of plural p-type semiconductor sections 37e are non-uniform, and as p-type semiconductor section 37e is at a longer distance from second electrode 34 (p-type semiconductor section 37e located closer to a minus side of the X-axis), p-type semiconductor section 37e has a larger shape in plan view. In other words, as p-type semiconductor section 37e is at a longer distance from second electrode 34, p-type semiconductor section 37e has a larger volume (size).

For example, shapes in plan view of p-type semiconductor sections 37e are a square of 1 µm×1 µm, a square of 1.5 µm×1.5 µm, a square of 2 µm×2 µm, etc., in sequence from p-type semiconductor section 37e closest to second electrode 34. At this time, when an interval (pitch) in the X-axis direction between one p-type semiconductor section 37e and another p-type semiconductor section 37e is the same, a density of first p-type semiconductor layer 36e (ratio of first p-type semiconductor layer 36e per unit volume of a first electrode section) in the first electrode section configured by first electrode 33 and first p-type semiconductor layer 36e (p-type semiconductor sections 37e) covered with first electrode 33 is lower in a portion closer to second electrode 34.

In this way, when the density of first p-type semiconductor layer 36e is low in the region close to second electrode 34, and when the density of first p-type semiconductor layer 36e is high in a region away from second electrode 34, an electric field easily concentrates on a portion close to second electrode 34 to which a high voltage is applied, in first electrode 33. Since a depletion layer easily extends in the portion on which an electric field concentrates, so that even when the interval in the X-axis direction between one p-type semiconductor section 37e and another p-type semiconductor section 37e is large, it is possible to cover a portion of first electrode 33, which is in contact with semiconductor layer 32 with a depletion layer that is generated by pn junction. Accordingly, a leak current is suppressed.

[Floating Guard Ring]

Figure 28:
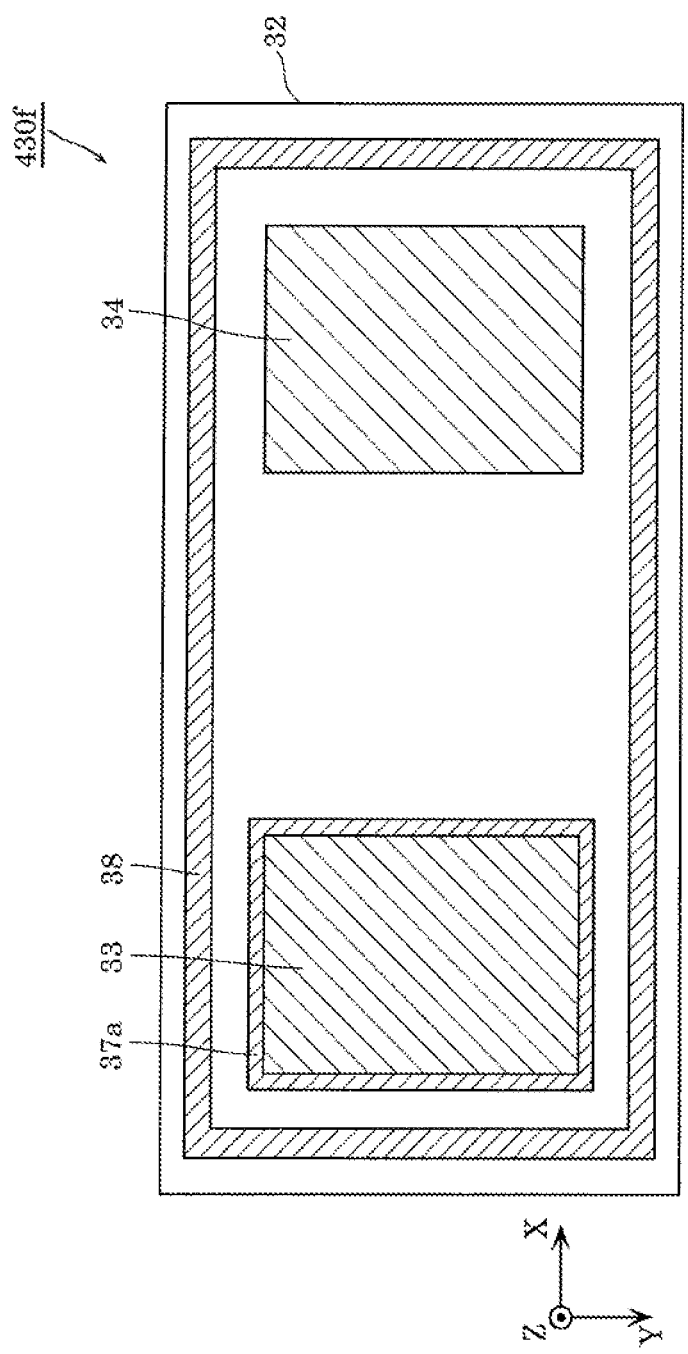
FIG. 28 is a top view of a light-receiving element having a floating guard ring.

Aforementioned light-receiving elements 430, and 430a to 430e each may further have a floating guard ring that encloses first electrode 33 in a state separated from first electrode 33, and comprises a p-type semiconductor, on semiconductor layer 32. FIG. 28 is a top view of a light-receiving element having a floating guard ring.

As illustrated in FIG. 28, floating guard ring 38 of light-receiving element 430f is formed on semiconductor layer 32 to enclose first electrode 33 and second electrode 34 in a state separated from first electrode 33 and second electrode 34. Floating guard ring 38 comprises a p-type semiconductor similarly to first p-type semiconductor layer 36 and the like. Floating guard ring 38 is not in contact with guard ring 37a, either. In other words, floating guard ring 38 is not electrically connected to first electrode 33, second electrode 34, and guard ring 37a (first p-type semiconductor layer 36).

A width of floating guard ring 38 is, for example, 1 µm, and an interval between floating guard ring 38 and guard ring 37a is approximately 1 µm to 2 µm inclusive. Furthermore, an interval between floating guard ring 38 and second electrode 34 is approximately 3 µm to 4 µm inclusive.

Note that light-receiving element 430f has only one floating guard ring 38, but light-receiving element 430f may have plural floating guard rings 38, and plural floating guard rings 38 may be disposed concentrically. In this case, a width of each of plural floating guard rings 38 is, for example, 1 µm, and an interval among plural floating guard rings 38 is, for example, approximately 1 µm to 2 µm inclusive. Note that floating guard ring 38 may have a shape that encloses only one electrode of first electrode 33 and second electrode 34.

According to floating guard ring 38 like this, electric field concentration at the time of high voltage application can be distributed, and as a result, a leak current can be suppressed.

[Another Structure for Suppressing Leak Current]

Figure 29:
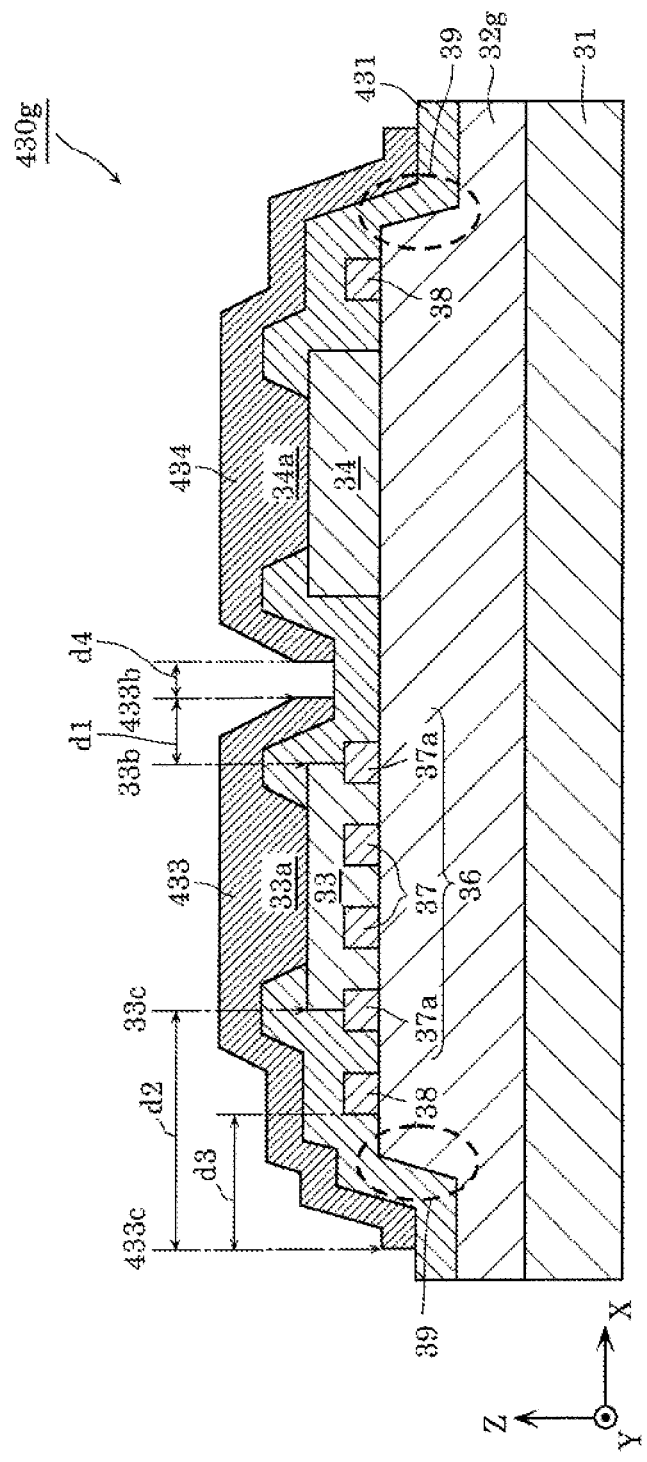
FIG. 29 is a schematic sectional view of a light-receiving element having another structure for suppressing a leak current.

Next, another structure for suppressing a leak current will be described. FIG. 29 is a schematic sectional view of a light-receiving element having another structure for suppressing a leak current.

Semiconductor layer 32g of light-receiving element 430g illustrated in FIG. 29 has mesa structure 39 to surround first electrode 33 and second electrode 34 in plan view. Specifically, in semiconductor layer 32g, a region separated outward from floating guard ring 38 by approximately 5 µm or more has mesa structure 39 lower than the region where floating guard ring 38 is formed. Mesa structure 39 like this is formed by digging down the region separated outward from floating guard ring 38 by approximately 5 µm or more by dry etching or the like. When floating guard ring 38 is not formed, mesa structure 39 may be formed in a region separated outward by approximately 5 µm or more from guard ring 37a at a side where the electrodes do not face each other.

According to mesa structure 39 where a surface portion of semiconductor layer 32g is removed, a path of the leak current that flows on a surface portion of a device outer portion can be removed. In other words, according to mesa structure 39, the surface of the portion on an outer side of semiconductor layer 32 is removed, and thereby the leak current is suppressed.

Furthermore, light-receiving element 430g has insulating layer 431 (insulating film) that is formed above first electrode 33 and second electrode 34, and first wiring layer 433 and second wiring layer 434 that are formed on insulating layer 431. Furthermore, light-receiving element 430g has first via hole 33a that penetrates through insulating layer 431, and electrically connects first electrode 33 and first wiring layer 433, and second via hole 34a that penetrates through insulating layer 431, and electrically connects second electrode 34 and second wiring layer 434.

Insulating layer 431 comprises a material such as $SiO_2$ or SiN, for example. First wiring layer 433 and second wiring layer 434 each comprise a metal material. First wiring layer 433 and second wiring layer 434 are formed to be thick, of a material such as Au with high conductivity, for example.

First wiring layer 433 is formed to cover first electrode 33, and second wiring layer 434 is formed to cover second electrode 34. In other words, in plan view, a region where first electrode 33 is formed is included in a region where first wiring layer 433 is formed, and a region where second electrode 34 is formed is included in a region where second wiring layer 434 is formed.

Accordingly, in plan view, an end portion of first wiring layer 433 is located outside from an end portion of first electrode 33. As illustrated in FIG. 29, first electrode 33 has one end portion 33b closer to second electrode 34, and other end portion 433c (for example, other end portion 33c at an opposite side from one end portion 33b) different from one end portion 33b. First wiring layer 433 has one end portion 433b close to second electrode 34, and other end portion 433c (for example, other end portion 433c at an opposite side from one end portion 433b) different from one end portion 433b. In this case, in plan view, distance d1 from one end portion 33b of first electrode 33 to one end portion of first wiring layer 433 is desirably shorter than distance d2 from other end portion 33c of first electrode 33 to other end portion 433c of first wiring layer 433.

Likewise, in plan view, a distance from one end portion of second electrode 34 to one end portion of second wiring layer 434 is desirably shorter than a distance from the other end portion of second electrode 34 to the other end portion of second wiring layer 434. Note that the one end portion of second electrode 34 is an end portion close to first electrode 33, and the other end portion of second electrode 34 is an end portion (for example, an end portion at an opposite side from the above described one end portion) different from the above described one end portion. The one end portion of second wiring layer 434 is an end portion close to first electrode 33, and the other end portion of second electrode 34 is an end portion (for example, an end portion at an opposite side from the above described one end portion) different from the above described one end portion.

Note that, of the wiring layer, a portion that is formed outside from the end portion of the electrode is referred to as a field plate. For example, in first wiring layer 433, portions within ranges that are defined by distance d1 and distance d2 are field plates.

Note that the field plate may be formed in only a part on insulating layer 431. For example, when a high voltage is assumed to be applied to only second electrode 34, the field plate may be formed in only a spot which is considered to need electric field distribution. Specifically, the field plate may be formed in only the range which is defined by distance d1 of an upper portion of first electrode 33.

Furthermore, as illustrated in FIG. 29, in a structure having a mesa structure, in plan view, other end portion 433c of the field plate of first wiring layer 433 is desirably located outside mesa structure 39.

Furthermore, as illustrated in FIG. 29, in light-receiving element 430g having floating guard ring 38, other end portion 433c of the field plate of first wiring layer 433 is desirably formed to be separated from floating guard ring 38 by distance d3. Specifically, distance d3 is approximately 20 µm. Note that the other end portion of the field plate of second wiring layer 434 is desirably formed similarly, but is not limited to this.

Interval d4 between one end portion 433b of the field plate of first wiring layer 433 and the one end portion of the field plate of the second wiring layer is set so that light-receiving element 430g can withstand an operation voltage of light-receiving element 430g. However, if interval d4 is too small, a light-receiving region that receives the light from light-emitting element 20 becomes small, and on-resistance is likely to increase. Consequently, interval d4 is set with the light-receiving region also taken into consideration. For example, when an interval between first electrode 33 and second electrode 34 is 10 µm, interval d4 is approximately 8 µm.

According to the field plate described above, a leak current is suppressed. When semiconductor layer 32g to which a high electric field is exerted is covered with a field plate to which a voltage is not applied, for example, which is at a ground potential, via insulating layer 431, the electric field also extends to a field plate side, and electric field concentration is dispersed and is distributed. Thereby, the leak current is suppressed.

Modification

Figure 30:
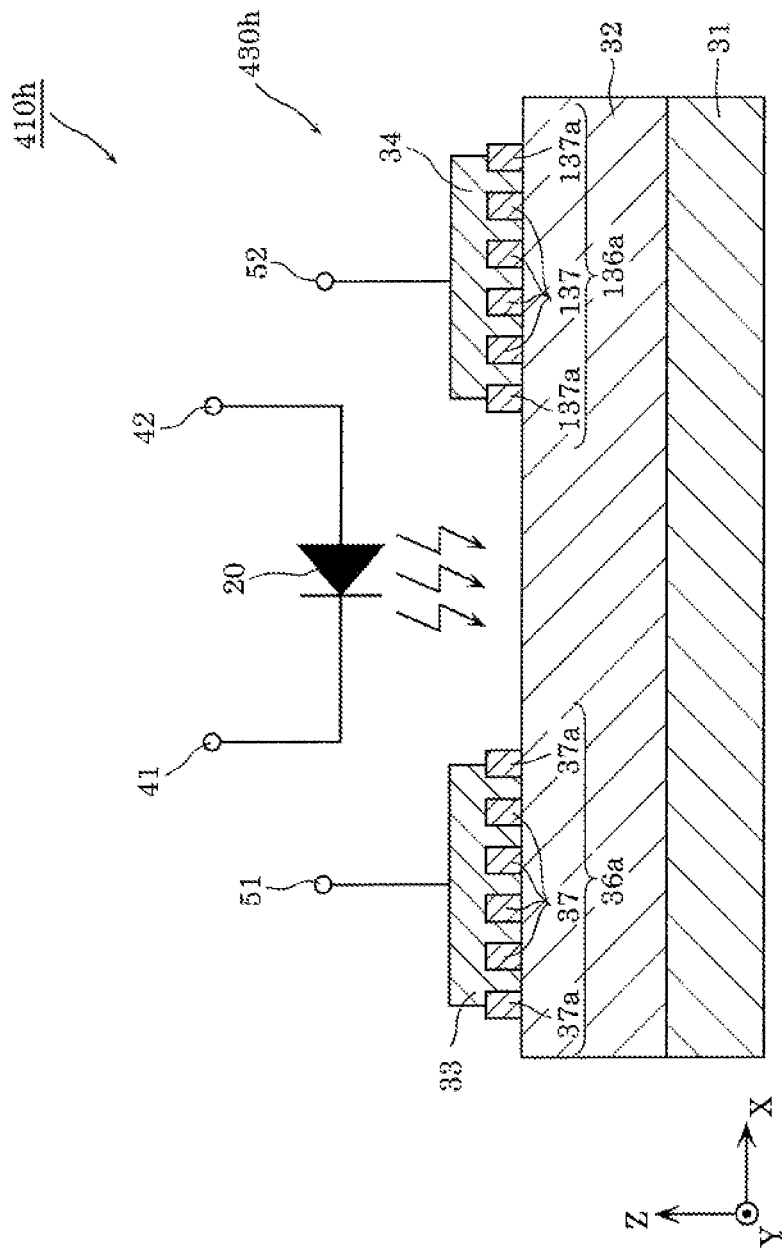
FIG. 30 is a schematic sectional view of a semiconductor relay according to a Modification of Embodiment 10.

In embodiments 9 and 10 described above, the p-type semiconductor layer is disposed on only the bottom portion of first electrode 33, but the p-type semiconductor layer may be also disposed on a bottom portion of second electrode 34.
FIG. 30 is a schematic sectional view of a semiconductor relay according to modification of Embodiment 10.

As illustrated in FIG. 30, semiconductor relay 410h includes light-receiving element 430h. Light-receiving element 430h has plural p-type semiconductor sections 37, and first p-type semiconductor layer 36a including guard ring 37a, similarly to light-receiving element 430a. First electrode 33 is formed in contact with semiconductor layer 32 and first p-type semiconductor layer 36a.

Light-receiving element 430h further includes second p-type semiconductor layer 136a that is formed on semiconductor layer 32. Second p-type semiconductor layer 136a includes plural p-type semiconductor sections 137 and guard ring 137a similarly to first p-type semiconductor layer 36a. Shapes and disposition of plural p-type semiconductor sections 137 are similar to, for example, the shapes and disposition of plural p-type semiconductor sections 37, but may be the other shapes and dispositions described in the above described embodiments, and are not specially limited. Second electrode 34 is formed in contact with semiconductor layer 32 and second p-type semiconductor layer.

As described above, semiconductor relay 410h is capable of a bidirectional operation. A light-receiving element that has first p-type semiconductor layer 36a, but does not have second p-type semiconductor layer 136a is capable of suppressing a leak current when a higher voltage is applied to second electrode 34 than to the first electrode, but cannot suppress a leak current when a higher voltage is applied to first electrode 33 than to second electrode 34. In relation to this, light-receiving element 430h can suppress leak currents by an effect of the depletion layer generated by pn junction, in both of the case where a higher voltage is applied to second electrode 34 than to the first electrode, and the case where a higher voltage is applied to first electrode 33 than to second electrode 34.

Specific Example of Component Layout

Figure 31:
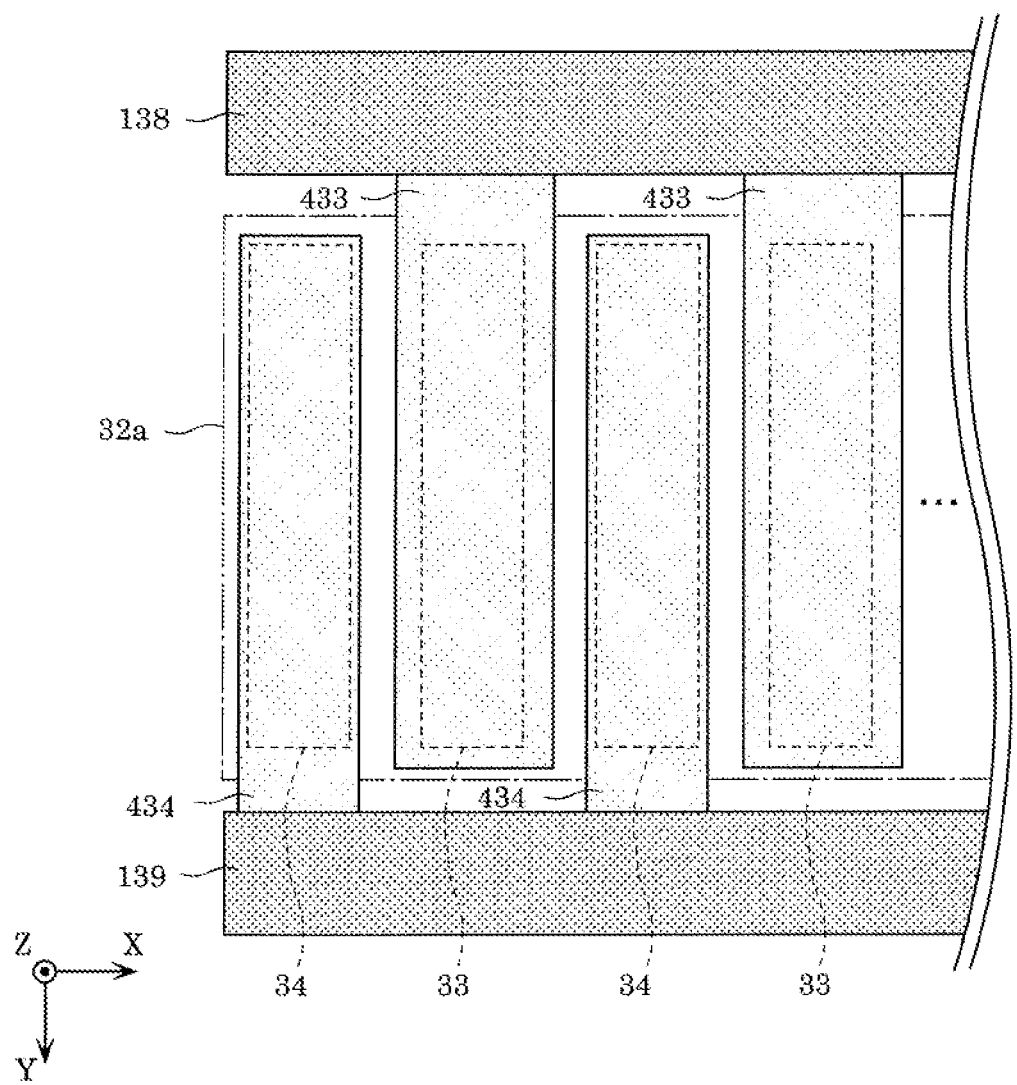
FIG. 31 is a top view illustrating a specific example of a component layout of the semiconductor relay according to Embodiment 9 or Embodiment 10.

An example of a specific component layout in a semiconductor relay described in Embodiment 9 or 10 described above will be described. FIG. 31 is a top view illustrating a specific example of the component layout of the semiconductor relay according to Embodiment 9 or 10. Note that in FIG. 31, first electrode 33, second electrode 34, first wiring layer 433, second wiring layer 434, output pad 138, and output pad 139 are illustrated, and illustrations of substrate 31, semiconductor layer 32, and first p-type semiconductor layer are omitted. Of semiconductor layer 32, device region 32a where first electrode 33, second electrode 34, and the like are formed is illustrated by an alternate long and short dash line.

As illustrated in FIG. 31, plural first electrodes 33 that are formed in device region 32a each has a shape that is long in the Y-axis direction, and are disposed side by side in the X-axis direction. Above each of plural first electrodes 33, first wiring layer 433 is formed via an insulating layer (not illustrated). Each of plural first wiring layer 433 has a shape long in the Y-axis direction. In plan view, one first wiring layer 433 covers one first electrode 33. One first electrode 33 is electrically connected to one first wiring layer 433 by a via hole (not illustrated) that penetrates through the above described insulating layer.

End portions at a minus side of the Y axis of plural first wiring layers 433 are integrated, and form output pad 138. Output pad 138 has a shape that is long in the X-axis direction.

Furthermore, plural second electrodes 34 that are formed in device region 32a each has a shape that is long in the Y-axis direction, and are disposed side by side in the X-axis direction. One second electrode 34 is disposed between one first electrode 33 and another first electrode 33. Above each of plural second electrodes 34, second wiring layer 434 is formed via an insulating layer (not illustrated). Each of plural second wiring layers 434 has a shape that is long in the Y-axis direction. In plan view, one second wiring layer 434 covers one second electrode 34. One second electrode 34 is electrically connected to one second wiring layer 434 by a via hole (not illustrated) that penetrates through the above described insulating layer.

End portions at a plus side of the Y axis of plural second wiring layers 434 are integrated, and form output pad 139. Output pad 139 has a shape that is long in the X-axis direction.

First wiring layer 433, second wiring layer 434, output pad 138, and output pad 139 as described above are formed to be of a thickness of approximately 5 μm by plating or the like, for example. Thereby, first wiring layer 433, second wiring layer 434, output pad 138, and output pad 139 are reduced in resistance.

Embodiment 11

Figure 32:
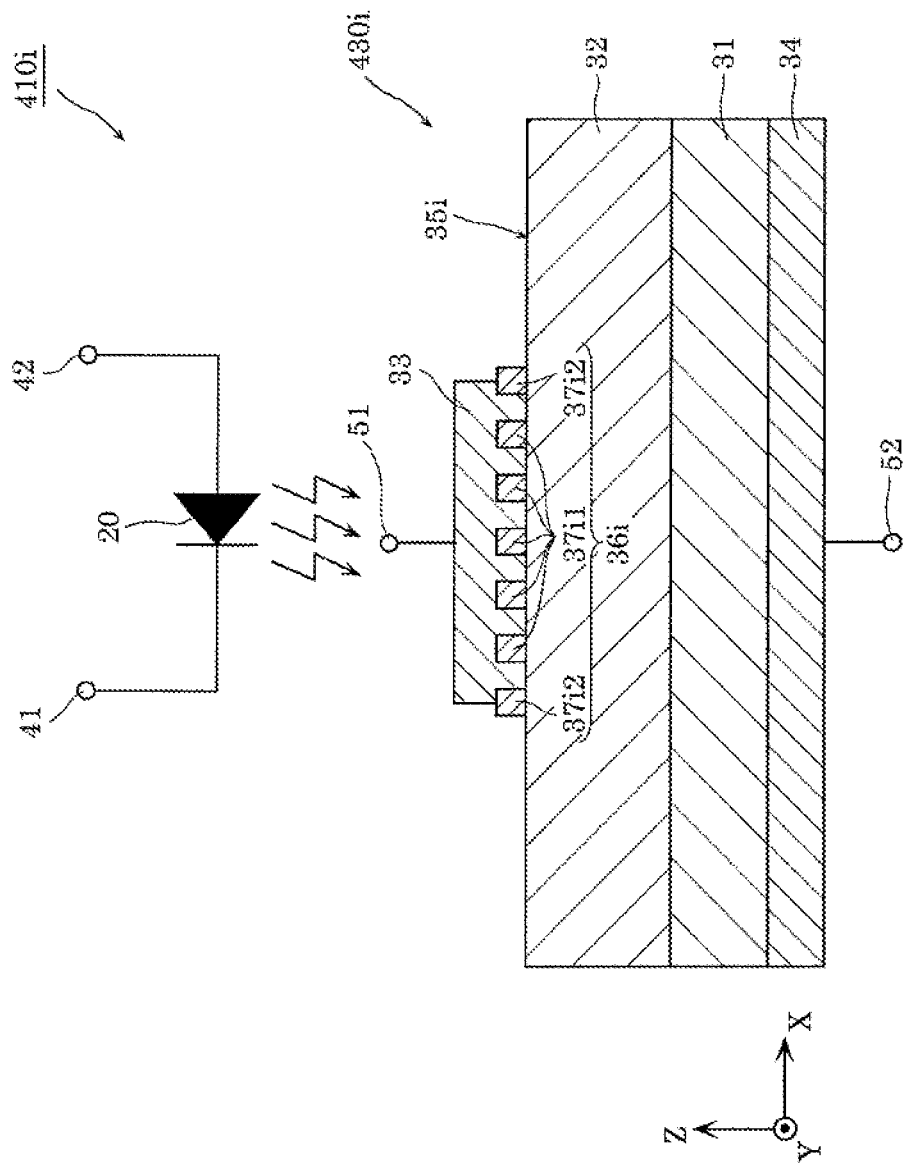
FIG. 32 is a schematic sectional view of a semiconductor relay according to Embodiment 11.
Figure 33:
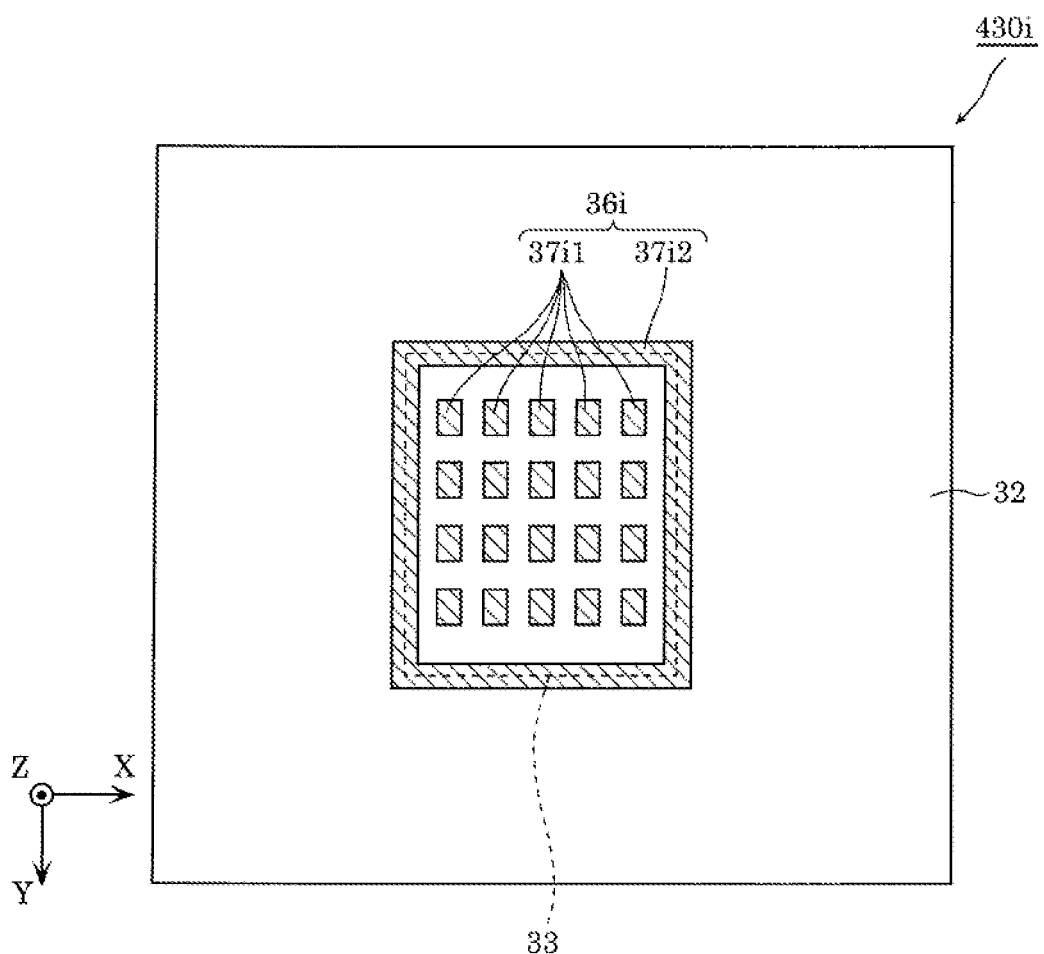
FIG. 33 is a top view of a light-receiving element included in the semiconductor relay according to Embodiment 11.

Next, a configuration of a semiconductor relay according to Embodiment 11 will be described. FIG. 32 is a schematic sectional view of the semiconductor relay according to Embodiment 11. FIG. 33 is a top view of a light-receiving element included by the semiconductor relay according to Embodiment 11. Note that hereinafter, a difference from semiconductor relay 410 is mainly described. Note that in FIG. 33, in order to illustrate a shape and disposition of first p-type semiconductor layer 36i, first electrode 33 that covers first p-type semiconductor layer 36i is illustrated in a broken like.

As illustrated in FIG. 32, semiconductor relay 410i according to Embodiment 11 includes light-emitting element 20, and light-receiving element 430i that is disposed facing light-emitting element 20. Furthermore, semiconductor relay 410i includes four terminals that are input terminal 41, input terminal 42, output terminal 51, and output terminal 52. In other words, semiconductor relay 410i is an element with the four terminals.

Semiconductor relay 410i differs from semiconductor relay 410 in dispositions of first electrode 33 and second electrode 34 in light-receiving element 430i.

First electrode 33 is formed in contact with semiconductor layer 32 and first p-type semiconductor layer 36i to cover first p-type semiconductor layer 36i that is formed on semiconductor layer 32 (semi-insulating InAlGaN layer). First electrode 33 is partially formed on a top surface of semiconductor layer 32. Second electrode 34 is formed in contact with substrate 31 on the undersurface (back surface) of substrate 31. Second electrode 34 is formed on an entire surface of an undersurface of semiconductor layer 32.

As illustrated in FIG. 33, in plan view, first p-type semiconductor layer 36i includes plural p-type semiconductor sections 37i1 that is disposed in a matrix shape, and guard ring 37i2 that is a p-type semiconductor section that encloses plural p-type semiconductor sections 37i1. First p-type semiconductor layer 36i of light-receiving element 430i is similar to first p-type semiconductor layer 36a of light-receiving element 430a.

In this way, semiconductor layer 32 is sandwiched by first electrode 33 and second electrode 34 in the vertical direction. Note that in semiconductor relay 410i, substrate 31 comprises a material having conductivity.

In Embodiment 11, when light-receiving region 35i of semiconductor layer 32 absorbs light and is reduced in resistance, first electrode 33 and second electrode 34 electrically continue to each other. At this time, first electrode 33 and second electrode 34 are side by side in the vertical direction, so that a current flows in the vertical direction. In other words, semiconductor relay 410i is a vertical device.

In the vertical device, a withstand voltage between first electrode 33 and second electrode 34 corresponds to a thickness of semiconductor layer 32. The thickness of semiconductor layer 32 is, for example, approximately 10 μm. In the semiconductor relay which is configured as a lateral device, a chip area is increased when a high withstand voltage is required, but in semiconductor relay 410i which is configured as the vertical device, a withstand voltage can be increased without increasing the chip area.

First electrode 33 and second electrode 34 each comprise a Ti/Al-based material, for example, but may be transparent electrodes formed of ITO. In semiconductor relay 410i, a part of light-receiving region 35i is shielded by first electrode 33, so that if first electrode 33 is a transparent electrode, an effect of increasing an effective area of light-receiving region 35i can be obtained.

Furthermore, when first electrode 33 does not have light transmissivity, first electrode 33 can be formed into a ring shape (donut shape) having an opening portion in plan view. Thereby, semiconductor layer 32 can take light from light-emitting element 20 through the opening portion.

[Variation of First p-Type Semiconductor Layer]

As in Embodiment 10, with respect to a shape and disposition of first p-type semiconductor layer 36i of light-receiving element 430i, various variations are conceivable. Furthermore, light-receiving element 430i may have a floating guard ring in addition to first p-type semiconductor layer 36i. FIGS. 34A to 34F are views illustrating other variations of the shape and disposition of the p-type semiconductor (first p-type semiconductor layer 36i and floating guard ring) that is formed on semiconductor layer 32 of light-receiving element 430i.

Figure 34A:
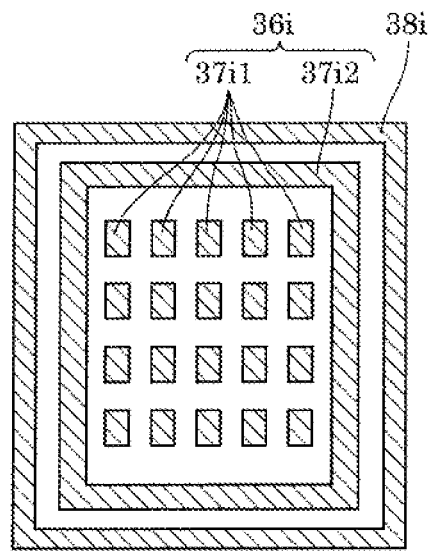
FIG. 34A is a first view illustrating another variation of a shape and disposition of a p-type semiconductor formed on a semiconductor layer of the light-receiving element according to Embodiment 11.

As illustrated in FIG. 34A, light-receiving element 430i may have floating guard ring 38i in addition to first p-type semiconductor layer 36i. Floating guard ring 38i of light-receiving element 430i encloses only first electrode 33 out of first electrode 33 and second electrode 34.

Figure 34B:
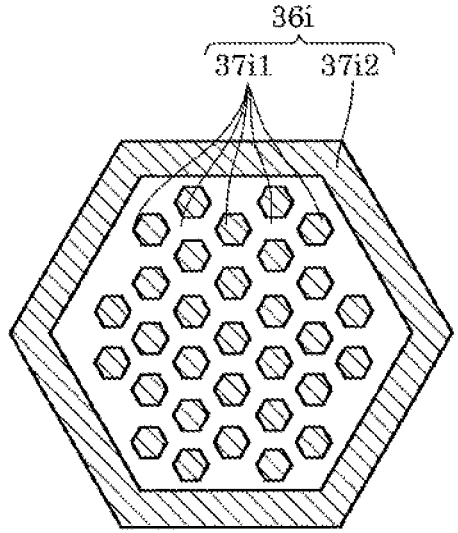
FIG. 34B is a second view illustrating another variation of the shape and disposition of the p-type semiconductor formed on the semiconductor layer of the light-receiving element according to Embodiment 11.

Furthermore, as illustrated in FIG. 34B, each of plural p-type semiconductor sections 37i1 is hexagonal, and plural p-type semiconductor sections 37i1 may be disposed in a honeycomb shape. Furthermore, guard ring 37i2 may be hexagonal. When the p-type semiconductor is formed in this way, first electrode 33 may be formed into a hexagon, or may be formed into a rectangle.

Figure 34C:
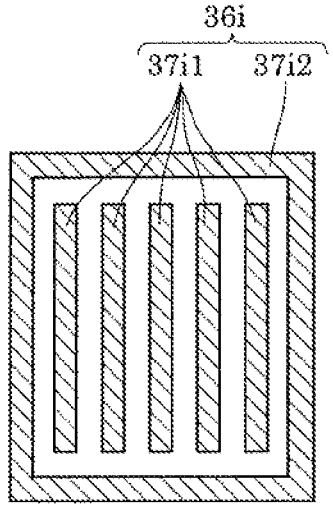
FIG. 34C is a third view illustrating another variation of the shape and disposition of the p-type semiconductor formed on the semiconductor layer of the light-receiving element according to Embodiment 11.

Furthermore, as illustrated in FIG. 34C, each of plural p-type semiconductor sections 37i1 is in a line shape that extends in the Y-axis direction, and plural p-type semiconductor sections 37i1 may be disposed side by side in the X-axis direction. In an example in FIG. 34C, first p-type semiconductor layer 36i includes a guard ring 37i2 in a rectangular ring shape that encloses plural p-type semiconductor sections 37i1. First p-type semiconductor layer 36i like this has a similar configuration to the configuration of first p-type semiconductor layer 36c.

Figure 34D:
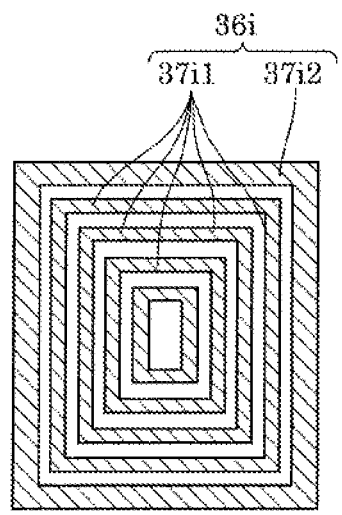
FIG. 34D is a fourth view illustrating another variation of the shape and disposition of the p-type semiconductor formed on the semiconductor layer of the light-receiving element according to Embodiment 11.

Furthermore, as illustrated in FIG. 34D, each of plural p-type semiconductor sections 37i1 is in a rectangular ring shape similar to guard ring 37i2, and inside one p-type semiconductor section 37i1, p-type semiconductor section 37i1 that is smaller than one p-type semiconductor section 37i1 may be disposed. In other words, plural p-type semiconductor sections 37i1 may be disposed concentrically. First p-type semiconductor layer 36i like this has a similar configuration to the configuration of first p-type semiconductor layer 36d (illustrated in FIG. 25).

Figure 34E:
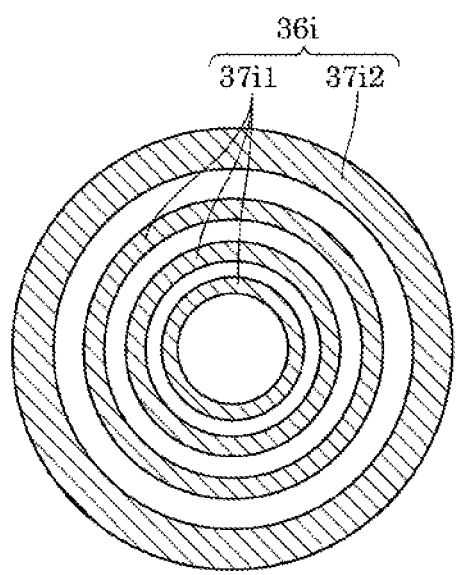
FIG. 34E is a fifth view illustrating another variation of the shape and disposition of the p-type semiconductor formed on the semiconductor layer of the light-receiving element according to Embodiment 11.

Furthermore, as illustrated in FIG. 34E, each of plural p-type semiconductor sections 37i1 and guard ring 37i2 is in a circular ring shape, and plural p-type semiconductor sections 37i1, and guard ring 37i2 may be disposed concentrically. When the p-type semiconductor is formed in this way, first electrode 33 is formed into a circular shape, for example.

Figure 34F:
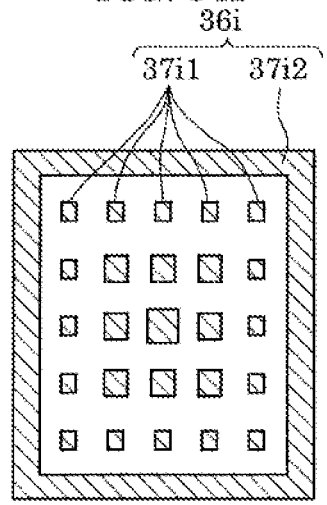
FIG. 34F is a sixth view of another variation of the shape and disposition of the p-type semiconductor formed on the semiconductor layer of the light-receiving element according to Embodiment 11.

Furthermore, as illustrated in FIG. 34F, each of plural p-type semiconductor sections 37i1 may be in a square (or a rectangular), and may be different in size. In an example of FIG. 34F, plural p-type semiconductor sections 37i1 are disposed in a matrix shape, but sizes of plural p-type semiconductor sections 37i1 are non-uniform, and the longer the distance of p-type semiconductor section 37i1 from a center of first electrode 33 is, the smaller the shape in plan view is. In other words, the closer p-type semiconductor section 37i1 to the end portion of first electrode 33 is, the smaller the volume (sizes) is.

At this time, when an interval (pitch) between one p-type semiconductor section 37i1 and another p-type semiconductor section 37i1 is the same, a density of first p-type semiconductor layer 36i (ratio of first p-type semiconductor layer 36i per unit volume of a first electrode section) in the first electrode section configured by first electrode 33 and first p-type semiconductor layer 36i (p-type semiconductor section 37i1) covered with first electrode is lower for a part closer to the end portion of first electrode 33.

When the density of first p-type semiconductor layer 36i is low in the region close to the end portion of first electrode 33 in this way, an electric field easily concentrates on the part close to the end portion of first electrode 33 when a high voltage is applied to second electrode 34. Since a depletion layer easily extends in the part on which the electric field concentrates, the portions which are in contact with semiconductor layer 32 of first electrode 33 can be covered with the depletion layer that is generated by pn junction even if the interval between one p-type semiconductor section 37i1 and another-type semiconductor section 37i1 is large. Accordingly, the leak current is suppressed.

Note that FIGS. 34A to 34F described above are examples. The shape and disposition of the p-type semiconductor that is formed on semiconductor layer 32 is not specially limited. The shapes and dispositions of the p-type semiconductors in FIGS. 34A to 34F may be partially combined. Floating guard ring 38i may be arbitrarily added.

[Another Structure for Suppressing Leak Current]

Figure 35:
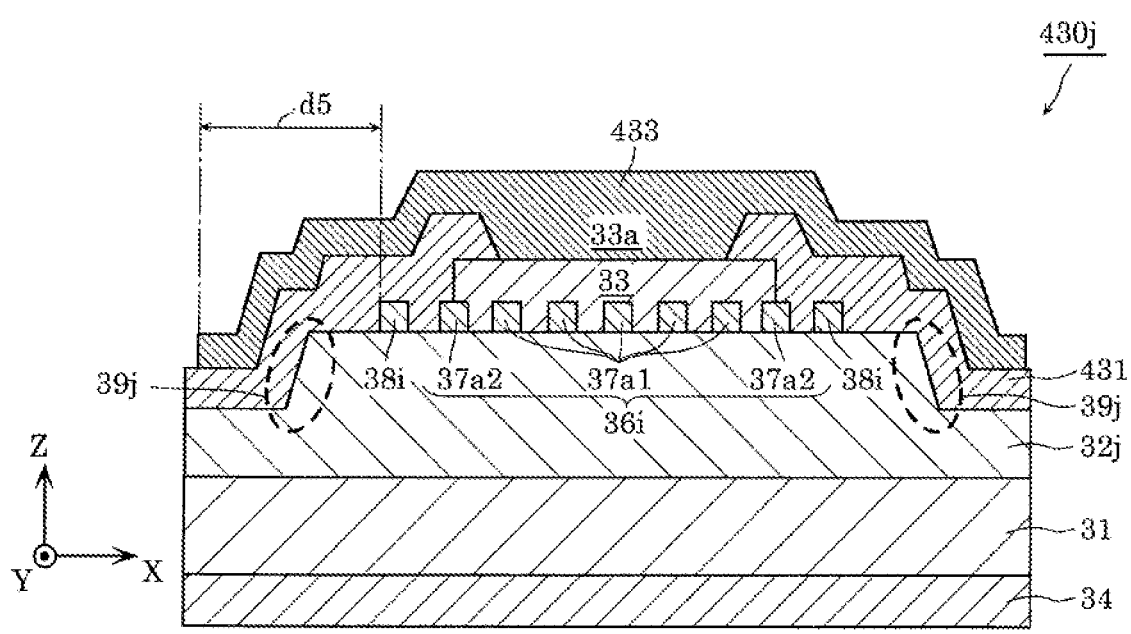
FIG. 35 is a schematic sectional view of a light-receiving element that is configured as a vertical device, and has another structure for suppressing a leak current.

A structure for suppressing a leak current other than the p-type semiconductor may be applied to the light-receiving element that is configured as the vertical device like light-receiving element 430i. FIG. 35 is a schematic sectional view of a light-receiving element that is configured as a vertical device having another structure for suppressing a leak current.

Semiconductor layer 32j of light-receiving element 430j illustrated in FIG. 35 has mesa structure 39j that encloses first electrode 33 in plan view. Specifically, semiconductor layer 32g has mesa structure 39j in which a region separated by approximately 5 μm or more outward from floating guard ring 38i is lower than a region where floating guard ring 38i is formed. Mesa structure 39j like this is formed by digging down the region separated outward from floating guard ring 38*i* by approximately 5 μm or more by dry etching or the like.

A surface of a portion at an outer side of semiconductor layer 32*j* is removed, and thereby a leak current is suppressed.

Furthermore, light-receiving element 430*j* has insulating layer 431 formed above first electrode 33 and second electrode 34, first wiring layer 433 formed on insulating layer 431, and first via hole 33*a* that penetrates through insulating layer 431, and electrically connects first electrode 33 and first wiring layer 433.

Insulating layer 431 comprises a material such as $SiO_2$ or SiN, for example. First wiring layer 433 comprises a metal material. First wiring layer 433 is formed to be thick, of a material such as Au having a large conductivity, for example.

First wiring layer 433 is formed to cover first electrode 33. In other words, in plan view, a region where first electrode 33 is formed is included in a region where first wiring layer 433 is formed. Accordingly, in plan view, an end portion of first wiring layer 433 is located outside from the end portion of first electrode 33. Of first wiring layer 433, a portion that is formed outside of the end portion of first electrode 33 is referred to as a field plate.

Furthermore, in plan view, an end portion of the field plate of first wiring layer 433 is located outside of mesa structure 39. The end portion of the field plate of first wiring layer 433 is separated by distance d5 from floating guard ring 38*i*. Specifically, distance d5 is approximately 20 μm.

According to the field plate as described above, a leak current is suppressed.

[Specific Example of Component Layout]

Figure 36:
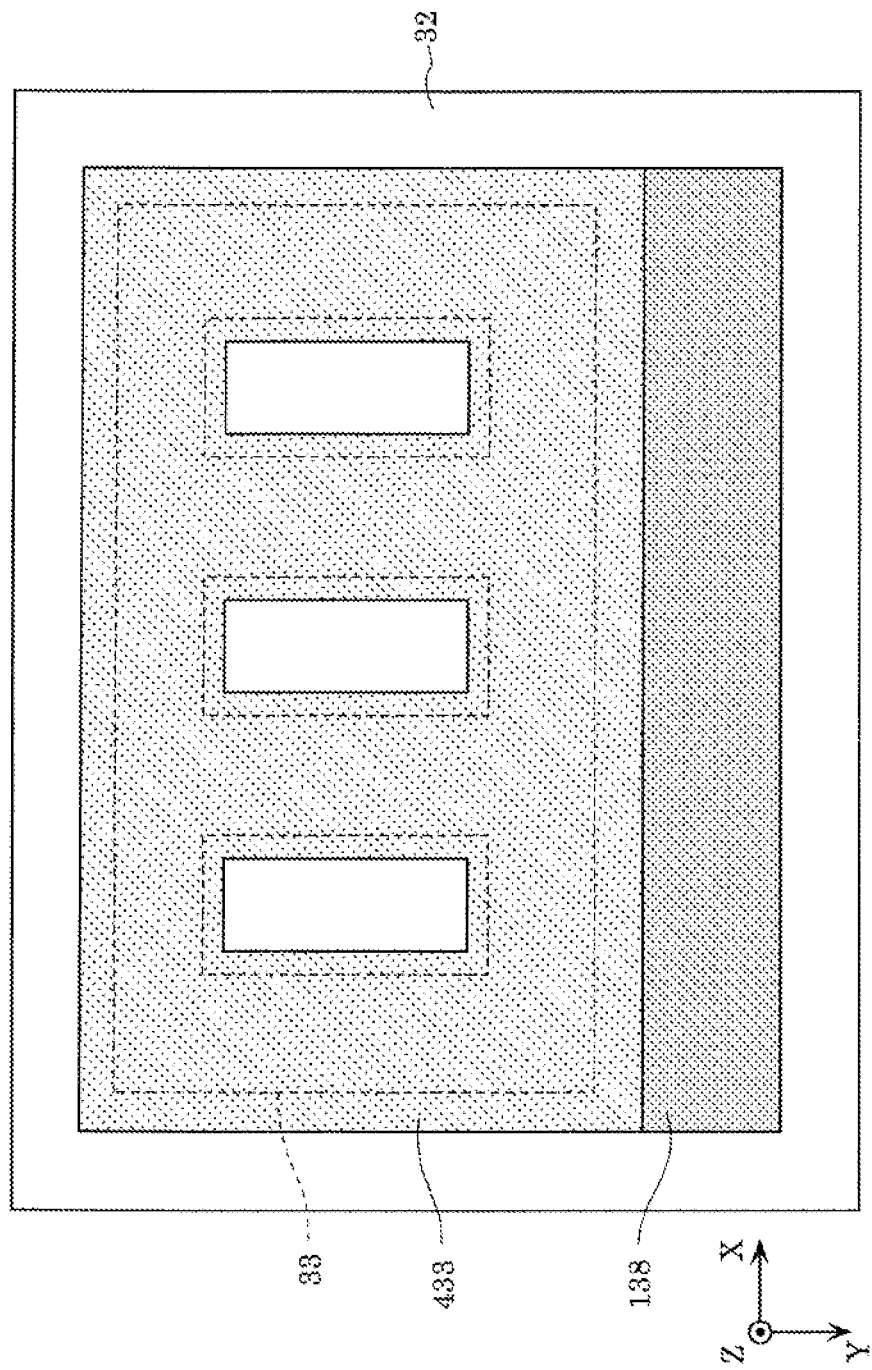
FIG. 36 is a top view illustrating a specific example of a component layout of the semiconductor relay according to Embodiment 11.

A specific component layout of the semiconductor relay according to Embodiment 11 described above will be described. FIG. 36 is a top view illustrating a specific example of the component layout of the semiconductor relay according to Embodiment 11. Note that in FIG. 36, semiconductor layer 32, first electrode 33, first wiring layer 433, and output pad 138 are illustrated, and illustrations of substrate 31, second electrode 34, first p-type semiconductor layer, and the like are omitted.

As illustrated in FIG. 36, a shape in plan view of first electrode 33 that is formed on semiconductor layer 32 is a shape in which parts of a rectangular shape are opened. Openings that are formed in first electrode 33 are openings for irradiating semiconductor layer 32 with the light from light-emitting element 20, and are formed in three spots. Above first electrode 33, first wiring layer 433 is formed via an insulating layer (not illustrated). First wiring layer 433 has a shape in which parts of a rectangular shape are opened in response to first electrode 33, and covers first electrode 33. First electrode 33 is electrically connected to first wiring layer 433 by a via hole (not illustrated) that penetrates through the above described insulating layer.

First wiring layer 433 is longer than first electrode 33 to a plus side of the Y axis. In other words, first wiring layer 433 is drawn to the plus side of the Y axis. First wiring layer 433 is integrated at an end portion at the plus side of the Y axis, and forms output pad 138. Output pad 138 has a shape that is long in the X-axis direction.

Note that though not illustrated in FIG. 36, on semiconductor layer 32, first p-type semiconductor layer 36*i* (including guard ring 37*i*2) is formed, and first electrode 33 covers plural p-type semiconductor sections 37*i*1 of first p-type semiconductor layer 36*i*. Guard ring 37*i*2 is formed to frame first electrode 33, and first electrode 33 covers a part of guard ring 37*i*2.

Summary of Embodiments 9 to 11

A semiconductor relay according to one aspect of the present disclosure includes a light-emitting element, and a light-receiving element that is disposed facing the light-emitting element, wherein the light-receiving element has a substrate, a direct transition type semiconductor layer that is formed on the substrate, and has a semi-insulating property, a first p-type semiconductor layer that is formed on the semiconductor layer, a first electrode that is electrically connected to the semiconductor layer, and is formed in contact with the semiconductor layer and the first p-type semiconductor layer, and a second electrode that is electrically connected to the semiconductor layer, and has at least a part of the second electrode formed in a position separated from the first electrode to be in contact with either one of the semiconductor layer and the substrate, and the semiconductor layer is reduced in resistance by absorbing light from the light-emitting element.

Thereby, when the light-emitting element lights out, a reverse voltage is applied to pn junction of the first p-type semiconductor layer and the semiconductor layer, and a depletion layer spreads from the first p-type semiconductor layer. By the depletion layer, a leak current is reduced.

For example, the first p-type semiconductor layer includes plural p-type semiconductor sections, and the plural p-type semiconductor sections include a p-type semiconductor section covered with the first electrode, and a p-type semiconductor section a part of which is exposed from an end portion of the first electrode.

Thereby, electric field distribution occurs to the end portion of the first electrode, so that the leak current is further reduced.

For example, the light-receiving element further has a guard ring that encloses the first electrode in a state separated from the first electrode, and comprises a p-type semiconductor, on the semiconductor layer.

Thereby, the leak current is reduced by a so-called floating guard ring.

For example, the first electrode and the second electrode are disposed on the semiconductor layer, at least a part of the first p-type semiconductor layer is covered with the first electrode, and a density of the first p-type semiconductor layer in a first electrode section configured by the first electrode and the first p-type semiconductor layer covered with the first electrode is lower toward a part closer to the second electrode.

Thereby, an electric field easily concentrates on a portion of the first electrode, which is close to the second electrode to which a high voltage is applied, and a depletion layer easily extends in the portion, so that the leak current is reduced by the depletion layer.

For example, the light-receiving element includes a second p-type semiconductor layer disposed on the semiconductor layer, and the second electrode is in contact with the semiconductor layer and the second p-type semiconductor layer.

Thereby, even when the semiconductor relay performs a bidirectional operation, the leak current is suppressed.

For example, the second p-type semiconductor layer includes plural p-type semiconductor sections, and the plural p-type semiconductor sections include a p-type semiconductor section covered with the second electrode, and a p-type semiconductor section a part of which is exposed from an end portion of the second electrode.

Thereby, electric field distribution occurs to the end portion of the second electrode, so that even when the semiconductor relay performs a bidirectional operation, the leak current is reduced.

For example, the first electrode and the second electrode are disposed on the semiconductor layer, and the semiconductor layer has a mesa structure Thereby, the leak current of the semiconductor relay which is configured as a lateral device can be reduced by the mesa structure.

For example, the first electrode and the second electrode are disposed on the semiconductor layer, the light-receiving element has an insulating layer that is located above the first electrode and the second electrode, a first wiring layer and a second wiring layer that are disposed on the insulating layer, a first via hole that penetrates through the insulating layer, and electrically connects the first electrode and the first wiring layer, and a second via hole that penetrates through the insulating layer, and electrically connects the second electrode and the second wiring layer, and in plan view, an end portion of the first wiring layer is located outside from an end portion of the first electrode, and an end portion of the second wiring layer is located outside from an end portion of the second electrode.

Thereby, the leak current of the semiconductor relay which is configured as a lateral device can be reduced by a so-called field plate.

For example, the first electrode has one end portion close to the second electrode, and another end portion different from the one end portion, the second electrode has one end portion close to the first electrode and another end portion different from the one end portion, the first wiring layer has one end portion close to the second electrode and another end portion different from the one end portion, the second wiring layer has one end portion close to the first electrode and another end portion different from the one end portion, in plan view, a distance from the one end portion of the first electrode to the one end portion of the first wiring layer is shorter than a distance from the other end portion of the first electrode to the other end portion of the first wiring layer, and in plan view, a distance from the one end portion of the second electrode to the one end portion of the second wiring layer is shorter than a distance from the other end portion of the second electrode to the other end portion of the second wiring layer.

Thereby, the leak current of the semiconductor relay which is configured as a lateral device can be reduced by a so-called field plate.

For example, the semiconductor layer has a mesa structure that encloses the first electrode and the second electrode in plan view, the first wiring layer has one end portion close to the second electrode and another end portion different from the one end portion, the second wiring layer has one end portion close to the first electrode and another end portion different from the one end portion, and in plan view, the other end portion of the first wiring layer, and the other end portion of the second wiring layer are located outside from the mesa structure.

Thereby, the leak current of the semiconductor relay which is configured as a lateral device can be reduced by the mesa structure and the field plate.

For example, the second electrode is disposed on an undersurface of the substrate, at least a part of the first p-type semiconductor layer is covered with the first electrode, and a density of the first p-type semiconductor layer in a first electrode section configured by the first electrode and the first p-type semiconductor layer covered with the first electrode is lower toward an end portion of the first electrode.

Thereby, when a high voltage is applied to the second electrode, an electric field easily concentrates on the end portion of the first electrode, and a depletion layer easily extends in the end portion, so that the leak current is reduced by the depletion layer.

For example, the second electrode is disposed on an undersurface of the substrate, and the semiconductor layer has a mesa structure enclosing the first electrode in plan view.

Thereby, a leak current of the semiconductor relay which is configured as the vertical device can be reduced by the mesa structure.

For example, the second electrode is disposed on an undersurface of the substrate, the light-receiving element has an insulating layer above the first electrode, wiring on the insulating layer, and a via hole that penetrates through the insulating layer and electrically connects the first electrode and the wiring, and in plan view, an end portion of the wiring is located outside from an end portion of the first electrode.

Thereby, the leak current of the semiconductor relay which is configured as the vertical device can be reduced by a so-called field plate.

For example, the second electrode is disposed on an undersurface of the substrate, and the semiconductor layer has a mesa structure that encloses the first electrode in plan view, the semiconductor relay comprising: an insulating layer above the first electrode, a wiring layer on the insulating layer, and a via hole that penetrates through the insulating layer and electrically connects the first electrode and the wiring layer, wherein in plan view, an end portion of the wiring layer is located outside from the mesa structure.

Thereby, the leak current of the semiconductor relay configured as the vertical device can be reduced by the mesa structure and the field plate.

For example, the first electrode and the second electrode are transparent electrodes.

Thereby, in the semiconductor layer, light easily hits a portion that is in contact with the electrode, so that reduction in resistance of the portion is promoted. In other words, contact resistance of the semiconductor layer and the electrode can be reduced.

For example, the light-emitting element and the semiconductor layer each include a nitride semiconductor.

The semiconductor relay like this is capable of a high voltage operation, because the nitride semiconductor having a larger bandgap as compared with Si that is used in a common semiconductor relay is used in the semiconductor layer.

For example, the light-emitting element and the semiconductor layer each comprises InAlGaN that is the nitride semiconductor.

The semiconductor relay like this is capable of a high voltage operation since InAlGaN that has a larger bandgap as compared with Si that is used in a common semiconductor relay is used in the semiconductor layer.

For example, the semiconductor layer includes a first impurity having an acceptor type, and a second impurity having a donor type, the second impurity having ionization energy smaller than ionization energy of the first impurity, and having a concentration lower than a concentration of the first impurity, and the semiconductor layer has a trap level having activation energy that is larger than a sum of ionization energy of the first impurity and the ionization energy of the second impurity.

The trap level is formed in the semiconductor layer in this way, and thereby the semiconductor layer can be reduced in resistance when receiving the light from the light-emitting element.

For example, a concentration obtained by subtracting the concentration of the second impurity from the concentration of the first impurity is $1E16$ cm$^{-3}$ to $1E18$ cm$^{-3}$ inclusive.

According to the impurity concentration within the range like this, the semiconductor relay can perform an effective and efficient relay operation.

Embodiment 12

Figure 37:
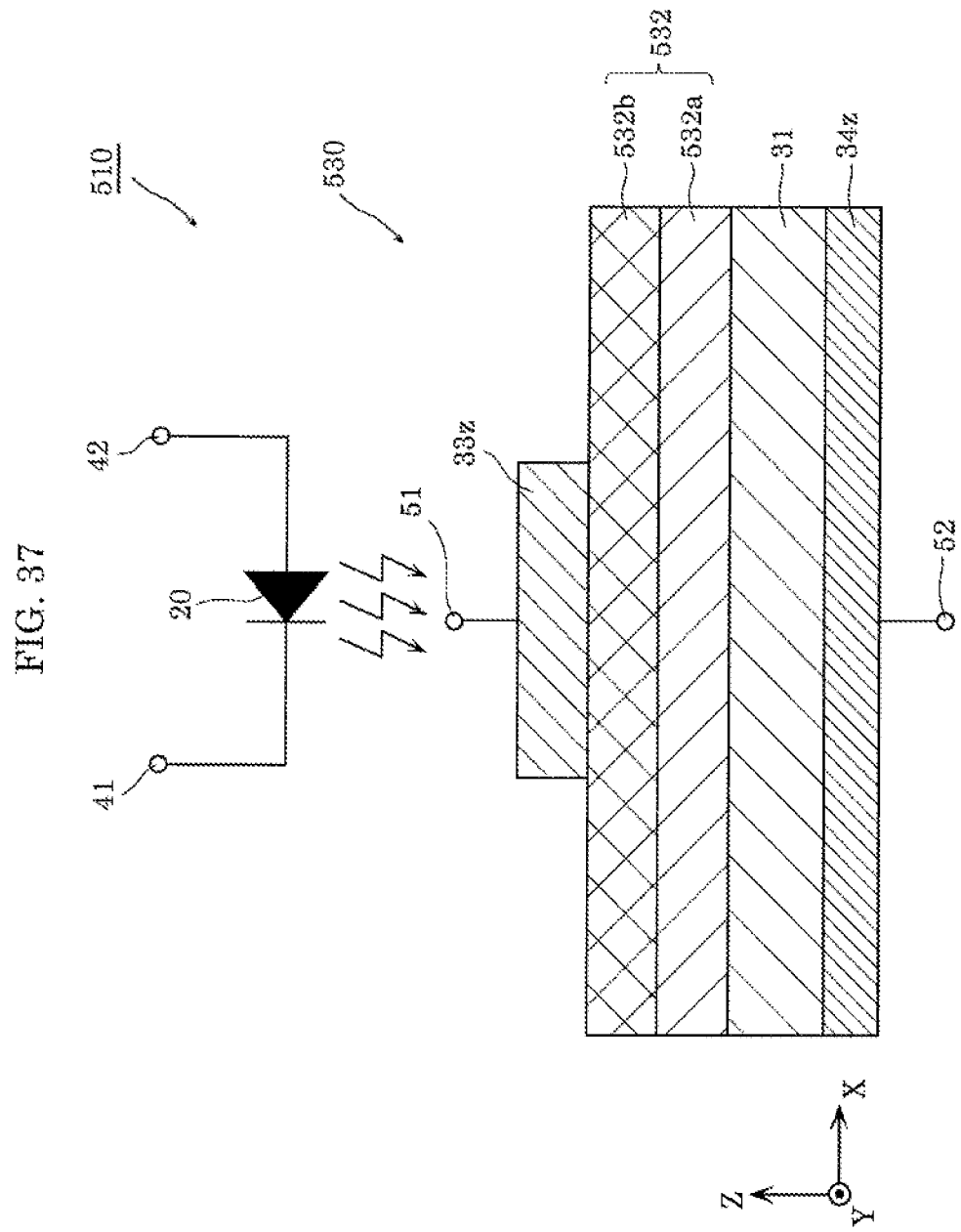
FIG. 37 is a schematic sectional view illustrating a first configuration of a semiconductor relay according to Embodiment 12.

When a semiconductor relay is a vertical device, a leak current can be also suppressed by biasing an impurity concentration in the semiconductor layer in the vertical direction (in other words, the stacking direction). In Embodiment 12, a semiconductor relay including the semiconductor layer like this will be described. FIG. 37 is a schematic sectional view illustrating a first configuration of the semiconductor relay according to Embodiment 12. Note that in Embodiment 12 as follows, a difference from semiconductor relay 10c according to embodiment 2 will be mainly described, and explanation of the matters already described will be arbitrarily omitted.

Semiconductor relay 510 illustrated in FIG. 37 includes light-emitting element 20, and light-receiving element 530 that is disposed facing light-emitting element 20. Semiconductor relay 510 includes four terminals that are input terminal 41, input terminal 42, output terminal 51, and output terminal 52. In other words, semiconductor relay 410i is an element with the four terminals.

Light-receiving element 530 includes substrate 31, semiconductor layer 532, first electrode 33z, and second electrode 34z. Light-receiving element 530 is a vertical device similarly to light-receiving element 30c and the like, first electrode 33z is formed on semiconductor layer 532, and second electrode 34z is formed in contact with substrate 31, on an undersurface of substrate 31.

Semiconductor layer 532 included by light-receiving element 530 includes first semiconductor layer 532a and second semiconductor layer 532b. First semiconductor layer 532a is formed on substrate 31, and second semiconductor layer 532b is formed on first semiconductor layer 532a. Here, an impurity concentration in second semiconductor layer 532b is higher than an impurity concentration in first semiconductor layer 532a. In other words, the impurity concentration is higher toward an upper surface side (first electrode 33z side) of semiconductor layer 532.

Thereby, when light-receiving element 530 is not irradiated with light, and a reverse voltage is applied between first electrode 33z and second electrode 34z, a depletion layer easily spreads in semiconductor layer 532 and an insulation withstand voltage can be kept high. Accordingly, a leak current can be suppressed.

Furthermore, when light-receiving element 530 is irradiated with light, first semiconductor layer 532a is sufficiently reduced in resistance, and a current easily flows. As a result, light-receiving element 530 with a high on/off ratio obtained can be realized.

Note that semiconductor layer 532 is of a two-layer structure, but may be a stacked structure of three layers or more. If the impurity concentration is also higher toward the upper surface side in this case, an effect of suppressing a leak current can be obtained.

Figure 38:
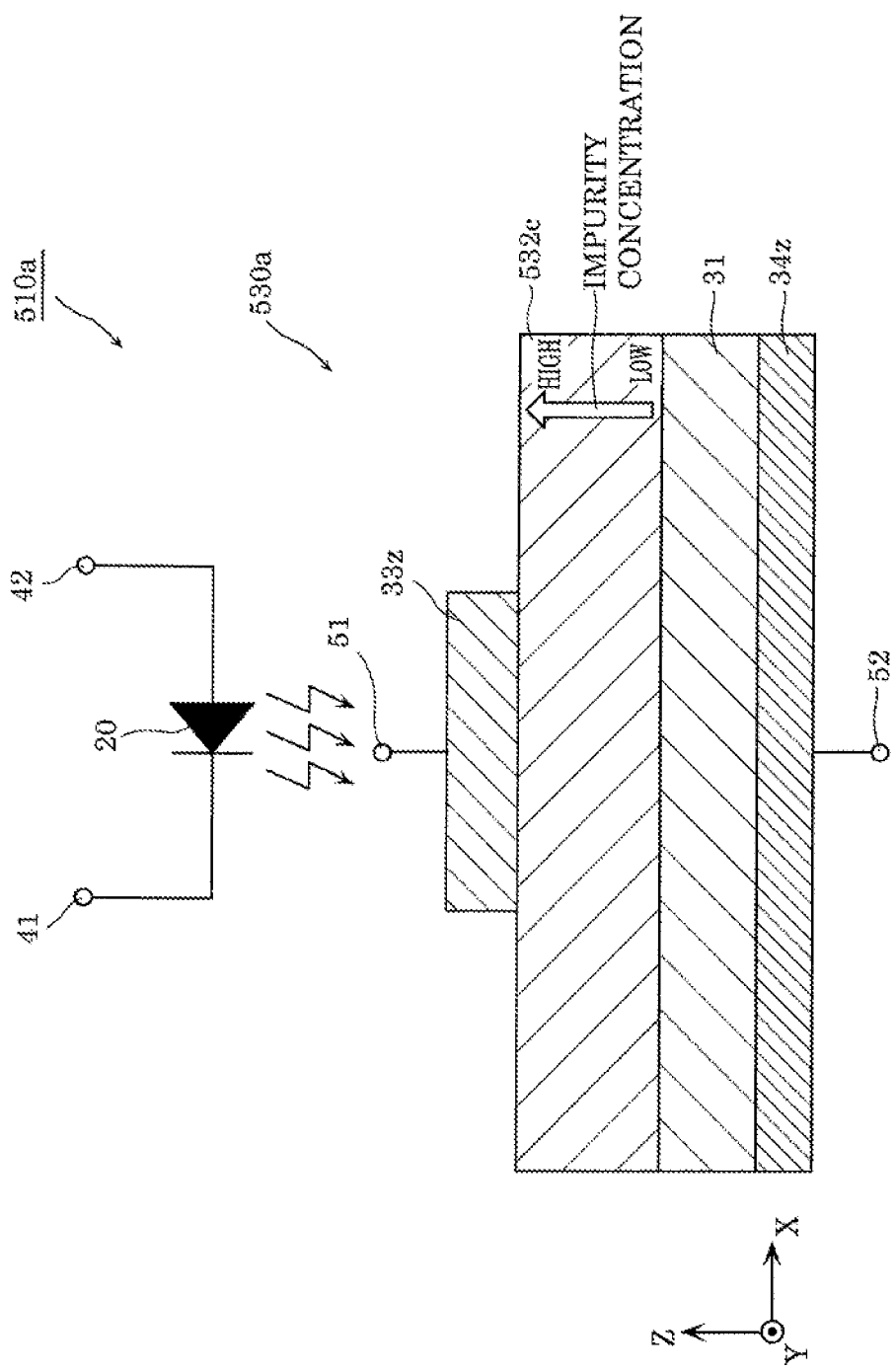
FIG. 38 is a schematic sectional view illustrating a second configuration of the semiconductor relay according to Embodiment 12.

Furthermore, in semiconductor layer 532 of a single layer, the impurity concentration may be higher toward an upper surface side. FIG. 38 is a schematic sectional view illustrating a second configuration of the semiconductor relay according to Embodiment 12 like this.

Semiconductor relay 510a illustrated in FIG. 38 has a similar stacking structure to that of semiconductor relay 10c according to embodiment 2. However, in light-receiving element 530a included by semiconductor relay 510a, the impurity concentration is biased in semiconductor layer 532c while semiconductor layer 532c is a single layer. Specifically, in semiconductor layer 532c, the impurity concentration is higher toward an upper surface side. Note that being a single layer means that no interface perpendicular to the stacking direction is formed in semiconductor layer 532c, for example. In semiconductor layer 532c, an impurity concentration in a portion which is in contact with first electrode 33z can be relatively high. In other words, semiconductor layer 532c can include a region lower in impurity concentration than the portion which is in contact with first electrode 33z, below the portion which is in contact with first electrode 33z.

Thereby, when light-receiving element 530a is not irradiated with light and a reverse voltage is applied between first electrode 33z and second electrode 34z, a depletion layer easily spreads in semiconductor layer 532c, and an insulation withstand voltage can be kept high. Accordingly, the leak current can be suppressed.

Furthermore, when light-receiving element 530a is irradiated with light, a portion at an upper surface side of semiconductor layer 532c is sufficiently reduced in resistance, and a current easily flows. As a result, light-receiving element 530a that can obtain a high on/off ratio can be realized.

Note that a bias in the impurity concentration in semiconductor layer 532c is realized by changing a temperature of substrate 31 during crystal growth of semiconductor layer 532c, for example. Furthermore, a bias in the impurity concentration in semiconductor layer 532c may be realized by a process of impurity injection, diffusion, or the like.

Other Embodiments

Although the semiconductor relay according to one or more aspects of the present disclosure has been described based on the above embodiments, the present disclosure is not limited to the embodiments.

The stacking structures illustrated in the schematic sectional views according to the embodiments are examples of the present disclosure. The present disclosure is therefore not limited to the stacking structures. In other words, the present disclosure also includes other stacking structure having the same characteristic functions of the present disclosure as those of the above-described stacking structures. For example, it is also possible that another layer is provided between the layers in any of the stacking structures if the same functions as those of the above-described stacking structures can be achieved.

Furthermore, although main material of each of the layers in the stacking structure is described in the above-described embodiments, each of the layers may include other material if the same functions as those of the stacking structures can be achieved.

Furthermore, various modifications of the embodiments and the variations which those skilled in the art can conceive or desirable combinations of the structural elements and functions in the embodiments and the variations without materially departing from the present disclosure are also included in the present disclosure. For example, the present disclosure may be implemented as an integrated circuit including the above-described semiconductor relay.

Additionally, the present technology may also be configured as below.

(1) A semiconductor relay, comprising:
a light-emitting element; and
a light-receiving element facing the light-emitting element, wherein
the light-receiving element includes
a substrate,
a semiconductor layer having a direct transition type, the semiconductor layer being disposed on the substrate and having a semi-insulating property,
a first electrode electrically connected to the semiconductor layer, the first electrode having at least a part in contact with the semiconductor layer, and
a second electrode electrically connected to the semiconductor layer, the second electrode having at least a part in contact with either one of the semiconductor layer and the substrate, in a position separated from the first electrode, and
the semiconductor layer is reduced in resistance by absorbing light from the light-emitting element.

(2) The semiconductor relay according to (1), wherein
the light-emitting element and the semiconductor layer each include a nitride semiconductor.

(3) The semiconductor relay according to (2), wherein
the light-emitting element and the semiconductor layer each comprise InAlGaN that is the nitride semiconductor.

(4) The semiconductor relay according to (2) or (3), wherein
the semiconductor layer includes
a first impurity having an acceptor type, and
a second impurity having a donor type, the second impurity having ionization energy smaller than ionization energy of the first impurity, and having a concentration lower than a concentration of the first impurity, and
the semiconductor layer has a trap level having activation energy that is larger than a sum of ionization energy of the first impurity and the ionization energy of the second impurity.

(5) The semiconductor relay according to (4), wherein
a concentration obtained by subtracting the concentration of the second impurity from the concentration of the first impurity is 1E16 $cm^{-3}$ to 1E18 $cm^{-3}$ inclusive.

(6) The semiconductor relay according to any one of (1) to (5), wherein
the semiconductor layer has a light-receiving region that receives light from the light-emitting element, and
the light-receiving region has a rugged structure.

(7) The semiconductor relay according to any one of (1) to (6), wherein
the first electrode is located over the semiconductor layer with at least a part of the first electrode being in contact with the semiconductor layer, and
the second electrode is located in a position separated from the first electrode, over the semiconductor layer, with at least a part of the second electrode being in contact with the semiconductor layer.

(8) The semiconductor relay according to any one of (1) to (6), wherein
the first electrode is located over the semiconductor layer with at least a part of the first electrode being in contact with the semiconductor layer, and
the second electrode is located under an undersurface of the substrate with at least a part of the second electrode being in contact with the substrate.

(9) The semiconductor relay according to any one of (1) to (5), wherein
the light-receiving element is stacked on the light-emitting element.

(10) The semiconductor relay according to (9), further comprising:
an insulating layer that is located between the light-emitting element and the light-receiving element and has a light transmissivity.

(11) The semiconductor relay according to (10), wherein
the insulating layer comprises a nitride semiconductor having carbon (C) with a concentration of 1E17 $cm^{-3}$ or more.

(12) The semiconductor relay according to (10) or (11), wherein
the insulating layer has a structure in which a p-type semiconductor layer and an n-type semiconductor layer are alternately stacked in at least three layers.

(13) The semiconductor relay according to any one of (9) to (12), wherein
the first electrode and the second electrode are disposed on the semiconductor layer, and
the light-emitting element is disposed above the semiconductor layer.

(14) The semiconductor relay according to any one of (10) to (12), wherein
the first electrode and the second electrode are disposed on the semiconductor layer,
the light-emitting element is located below the semiconductor layer, and
the insulating layer is located between an undersurface of the substrate and the light-emitting element.

(15) The semiconductor relay according to (14), wherein
the substrate has a light transmissivity and an insulating property.

(16) The semiconductor relay according to any one of any one of (9) to (15), wherein
the first electrode and the second electrode are disposed on the semiconductor layer, and
in a region between the first electrode and the second electrode in plan view, of the semiconductor layer, a recessed portion is located.

(17) The semiconductor relay according to (13), wherein
a recessed portion is located in a region between the first electrode and the second electrode in plan view, of the semiconductor layer, and
the light-emitting element is located in the recessed portion, and has a shape along the recessed portion.

(18) The semiconductor relay according to any one of (10) to (12), wherein
the first electrode is disposed on the semiconductor layer,
the second electrode is disposed on an undersurface of the substrate, and
the light-emitting element is disposed on the insulating layer.

(19) The semiconductor relay according to (18), wherein
a top surface of the semiconductor layer includes a first surface, a second surface that is located upward from the first surface, and an inclined surface between the first surface and the second surface, the first electrode is disposed on the second surface, and the light-emitting element and the insulating layer are arranged along the inclined surface.

(20) The semiconductor relay according to any one of (9) to (12), wherein the semiconductor layer, and the first electrode are disposed on the substrate, and the second electrode is disposed on the semiconductor layer.

(21) The semiconductor relay according to any one of (9) to (20), wherein the semiconductor layer comprises a nitride semiconductor.

(22) The semiconductor relay according to (21), wherein the semiconductor layer comprises AlGaN that is the nitride semiconductor.

(23) The semiconductor relay according to any one of (9) to (22), wherein at least one electrode of the first electrode and the second electrode is disposed on the semiconductor layer, and in the semiconductor layer, a region under the at least one electrode is doped with a carrier of a higher concentration than other regions.

(24) The semiconductor relay according to any one of (9) to (23), wherein at least one electrode of the first electrode and the second electrode is a transparent electrode.

(25) The semiconductor relay according to any one of (9) to (24), wherein the light-emitting element includes junction of a p-type nitride semiconductor and an n-type nitride semiconductor, and the semiconductor relay further comprising:

a third electrode that is electrically connected to the p-type nitride semiconductor; and a fourth electrode that is electrically connected to the n-type nitride semiconductor.

(26) The semiconductor relay according to any one of (9) to (25), wherein the substrate comprises a nitride semiconductor.

(27) The semiconductor relay according to (9), wherein the light-emitting element has an active layer.

(28) The semiconductor relay according to (27), wherein bandgap energy of the active layer is larger than bandgap energy of the semiconductor layer.

(29) The semiconductor relay according to (27) or (28), wherein the active layer comprises InGaN.

(30) The semiconductor relay according to any one of (27) to (29), wherein the semiconductor layer comprises InGaN.

(31) The semiconductor relay according to any one of (27) to (30), further comprising:

an insulating layer that is located between the light-emitting element and the light-receiving element, and has a light transmissivity.

(32) The semiconductor relay according to (31), wherein the first electrode and the insulating layer are disposed on the semiconductor layer, the second electrode is disposed on an undersurface of the substrate, and the light-emitting element is disposed on the insulating layer.

(33) The semiconductor relay according to (31) or (32), wherein the insulating layer comprises a nitride semiconductor including at least aluminum (Al).

(34) The semiconductor relay according to any one of (1) to (5), comprising a first p-type semiconductor layer that is disposed on the semiconductor layer, wherein the first electrode is in contact with the semiconductor layer and the first p-type semiconductor layer.

(35) The semiconductor relay according to (34), wherein the first p-type semiconductor layer includes plural p-type semiconductor sections, and the plural p-type semiconductor sections include a p-type semiconductor section covered with the first electrode, and a p-type semiconductor section a part of which is exposed from an end portion of the first electrode.

(36) The semiconductor relay according to (34) or (35), wherein the light-receiving element further has a guard ring that encloses the first electrode in a state separated from the first electrode, and comprises a p-type semiconductor, on the semiconductor layer.

(37) The semiconductor relay according to any one of (34) to (36), wherein the first electrode and the second electrode are disposed on the semiconductor layer, at least a part of the first p-type semiconductor layer is covered with the first electrode, and a density of the first p-type semiconductor layer in a first electrode section configured by the first electrode and the first p-type semiconductor layer covered with the first electrode is lower toward a part closer to the second electrode.

(38) The semiconductor relay according to any one of (34) to (37), wherein the light-receiving element includes a second p-type semiconductor layer disposed on the semiconductor layer, and the second electrode is in contact with the semiconductor layer and the second p-type semiconductor layer.

(39) The semiconductor relay according to (38), wherein the second p-type semiconductor layer includes plural p-type semiconductor sections, and the plural p-type semiconductor sections include a p-type semiconductor section covered with the second electrode, and a p-type semiconductor section a part of which is exposed from an end portion of the second electrode.

(40) The semiconductor relay according to any one of (34) to (39), wherein the first electrode and the second electrode are disposed on the semiconductor layer, and the semiconductor layer has a mesa structure that encloses the first electrode and the second electrode in plan view.

(41) The semiconductor relay according to any one of (34) to (40), wherein the first electrode and the second electrode are disposed on the semiconductor layer, the light-receiving element has an insulating layer that is located above the first electrode and the second electrode, a first wiring layer and a second wiring layer that are disposed on the insulating layer, a first via hole that penetrates through the insulating layer, and electrically connects the first electrode and the first wiring layer, and a second via hole that penetrates through the insulating layer, and electrically connects the second electrode and the second wiring layer, and in plan view, an end portion of the first wiring layer is located outside from an end portion of the first electrode, and an end portion of the second wiring layer is located outside from an end portion of the second electrode.

(42) The semiconductor relay according to (41), wherein
the first electrode has one end portion close to the second electrode, and another end portion different from the one end portion,
the second electrode has one end portion close to the first electrode and another end portion different from the one end portion,
the first wiring layer has one end portion close to the second electrode and another end portion different from the one end portion,
the second wiring layer has one end portion close to the first electrode and another end portion different from the one end portion,
in plan view, a distance from the one end portion of the first electrode to the one end portion of the first wiring layer is shorter than a distance from the other end portion of the first electrode to the other end portion of the first wiring layer, and
in plan view, a distance from the one end portion of the second electrode to the one end portion of the second wiring layer is shorter than a distance from the other end portion of the second electrode to the other end portion of the second wiring layer.

(43) The semiconductor relay according to (41), wherein
the semiconductor layer has a mesa structure that encloses the first electrode and the second electrode in plan view,
the first wiring layer has one end portion close to the second electrode and another end portion different from the one end portion,
the second wiring layer has one end portion close to the first electrode and another end portion different from the one end portion, and
in plan view, the other end portion of the first wiring layer, and the other end portion of the second wiring layer are located outside from the mesa structure.

(44) The semiconductor relay according to any one of (34) to (36), wherein
the second electrode is disposed on an undersurface of the substrate,
at least a part of the first p-type semiconductor layer is covered with the first electrode, and
a density of the first p-type semiconductor layer in a first electrode section configured by the first electrode and the first p-type semiconductor layer covered with the first electrode is lower toward an end portion of the first electrode.

(45) The semiconductor relay according to any one of (34) to (36), wherein
the second electrode is disposed on an undersurface of the substrate, and
the semiconductor layer has a mesa structure enclosing the first electrode in plan view.

(46) The semiconductor relay according to any one of (34) to (36), wherein
the second electrode is disposed on an undersurface of the substrate,
the light-receiving element has
an insulating layer above the first electrode,
wiring on the insulating layer, and
a via hole that penetrates through the insulating layer and electrically connects the first electrode and the wiring, and
in plan view, an end portion of the wiring is located outside from an end portion of the first electrode.

(47) The semiconductor relay according to any one of (34) to (36), wherein
the second electrode is disposed on an undersurface of the substrate, and
the semiconductor layer has a mesa structure that encloses the first electrode in plan view,
the semiconductor relay comprising:
an insulating layer above the first electrode,
a wiring layer on the insulating layer, and
a via hole that penetrates through the insulating layer and electrically connects the first electrode and the wiring layer, wherein
in plan view, an end portion of the wiring layer is located outside from the mesa structure.

(48) The semiconductor relay according to any one of (34) to (46), wherein
the first electrode and the second electrode are transparent electrodes.

INDUSTRIAL APPLICABILITY

The semiconductor relay of the present disclosure is useful as a power device for use in a power supply circuit and the like of consumer equipment.

What is claimed is:
1. A semiconductor relay, comprising:
a light-emitting element; and
a light-receiving element facing the light-emitting element, wherein
the light-receiving element includes
a substrate,
a nitride semiconductor layer that includes a first impurity having an acceptor type, a second impurity having a donor type, a concentration of the second impurity being lower than a concentration of the first impurity, and a direct transition type, the nitride semiconductor layer being disposed on the substrate and having a semi-insulating property,
a first electrode electrically connected to the nitride semiconductor layer, the first electrode having at least a part in contact with the nitride semiconductor layer, and
a second electrode electrically connected to the nitride semiconductor layer, the second electrode having at least a part in contact with either one of the nitride semiconductor layer and the substrate, in a position separated from the first electrode, and
the nitride semiconductor layer is reduced in resistance by absorbing light from the light-emitting element.

2. The semiconductor relay according to claim 1, wherein the light-emitting element includes a nitride semiconductor.

3. The semiconductor relay according to claim 1, wherein the nitride semiconductor layer comprises InAlGaN.

4. The semiconductor relay according to claim 1, wherein the second impurity has ionization energy smaller than ionization energy of the first impurity, and
the nitride semiconductor layer has a trap level having activation energy that is larger than a sum of ionization energy of the first impurity and the ionization energy of the second impurity.

5. The semiconductor relay according to claim 4, wherein a concentration obtained by subtracting the concentration of the second impurity from the concentration of the first impurity is $1E16$ $cm^{-3}$ to $1E18$ $cm^{-3}$ inclusive.

6. The semiconductor relay according to claim 1, wherein the nitride semiconductor layer has a light-receiving region that receives light from the light-emitting element, and
the light-receiving region has a rugged structure.

7. The semiconductor relay according to claim 1, wherein the light-receiving element is stacked on the light-emitting element.

8. The semiconductor relay according to claim 7, wherein the substrate comprises a nitride semiconductor.

9. The semiconductor relay according to claim 7, wherein the light-emitting element has an active layer.

10. The semiconductor relay according to claim 9, wherein bandgap energy of the active layer is larger than bandgap energy of the nitride semiconductor layer.

11. The semiconductor relay according to claim 9, wherein the active layer comprises InGaN.

12. The semiconductor relay according to claim 1, wherein the nitride semiconductor layer comprises AlGaN.

13. The semiconductor relay according to claim 1, wherein the nitride semiconductor layer comprises InGaN.

14. A semiconductor relay, comprising:
a light-emitting element
a light-receiving element facing the light-emitting element, wherein the light-receiving element includes
a substrate,
a nitride semiconductor layer having a direct transition type, the nitride semiconductor layer being disposed on the substrate and having a semi-insulating property,
a first electrode electrically connected to the nitride semiconductor layer, the first electrode having at least a part in contact with the nitride semiconductor layer, and
a second electrode electrically connected to the nitride semiconductor layer, the second electrode having at least a part in contact with either one of the nitride semiconductor layer and the substrate, in a position separated from the first electrode, and
the nitride semiconductor layer is reduced in resistance by absorbing light from the light-emitting element and
a first p-type semiconductor layer that is disposed on the nitride semiconductor layer, wherein
the first electrode is in contact with the nitride semiconductor layer and the first p-type semiconductor layer.

15. The semiconductor relay according to claim 14, wherein
the first p-type semiconductor layer includes plural p-type semiconductor sections, and
the plural p-type semiconductor sections include a p-type semiconductor section covered with the first electrode, and a p-type semiconductor section a part of which is exposed from an end portion of the first electrode.

* * * * *